(12) United States Patent
Miyake

(10) Patent No.: US 9,666,655 B2
(45) Date of Patent: May 30, 2017

(54) DISPLAY DEVICE

(71) Applicant: Semiconductor Energy Laboratory Co., Ltd., Atsugi-shi, Kanagawa-ken (JP)

(72) Inventor: Hiroyuki Miyake, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/140,544

(22) Filed: Apr. 28, 2016

(65) Prior Publication Data

US 2016/0329392 A1 Nov. 10, 2016

(30) Foreign Application Priority Data

May 5, 2015 (JP) ................................ 2015-094518

(51) Int. Cl.
*H01L 29/786* (2006.01)
*H01L 27/32* (2006.01)
(Continued)

(52) U.S. Cl.
CPC ....... *H01L 27/3262* (2013.01); *G09G 3/3233* (2013.01); *G09G 3/3258* (2013.01); *H01L 29/7869* (2013.01); *H01L 29/78648* (2013.01); *G09G 2300/0426* (2013.01); *G09G 2300/0819* (2013.01); *G09G 2300/0852* (2013.01); *G09G 2300/0861* (2013.01);
(Continued)

(58) Field of Classification Search
CPC ............ H01L 27/3262; H01L 27/3265; H01L 29/7869; H01L 29/78648; H01L 27/3258; G09G 3/3258; G09G 3/3233; G09G 2300/0426; G09G 2300/0819; G09G 2320/0233; G09G 2330/021
See application file for complete search history.

(56) References Cited

U.S. PATENT DOCUMENTS 7,199,768 B2   4/2007  Ono et al.
7,317,429 B2   1/2008  Shirasaki et al.
(Continued)

FOREIGN PATENT DOCUMENTS

JP   2003-195810 A   7/2003
JP   2013-137498 A   7/2013

*Primary Examiner* — Roy Potter
(74) *Attorney, Agent, or Firm* — Robinson Intellectual Property Law Office; Eric J. Robinson

(57) ABSTRACT

A display device includes a transistor including first and second gates. A first terminal of the transistor is electrically connected to a third wiring. A first switch controls electrical connection between a first wiring and the first gate. A second switch controls electrical connection between a second wiring and the second gate. A third switch controls electrical connection between the first gate and a second terminal of the transistor. A fourth switch controls electrical connection between a fifth wiring and the second terminal of the transistor. A first capacitor retains a potential difference between the first gate and the second terminal of the transistor. A second capacitor retains a potential difference between the first gate and the second gate. A first terminal of the light-emitting element is electrically connected to the second terminal of the transistor. A second terminal of the light-emitting element is electrically connected to a fourth wiring.

17 Claims, 50 Drawing Sheets

(51) Int. Cl.
*G09G 3/3258* (2016.01)
*G09G 3/3233* (2016.01)

(52) U.S. Cl.
CPC .............. *G09G 2310/0262* (2013.01); *G09G 2320/0233* (2013.01); *G09G 2320/043* (2013.01); *G09G 2330/021* (2013.01)

(56) References Cited

U.S. PATENT DOCUMENTS

| | | |
|---|---|---|
| 7,674,650 B2 | 3/2010 | Akimoto et al. |
| 8,067,775 B2 | 11/2011 | Miyairi et al. |
| 8,106,400 B2 | 1/2012 | Miyairi et al. |
| 9,536,904 B2 * | 1/2017 | Miyake ............... H01L 27/1225 |
| 2005/0030265 A1 | 2/2005 | Miyagawa |
| 2008/0225061 A1 | 9/2008 | Kimura et al. |
| 2010/0032679 A1 | 2/2010 | Kawae et al. |
| 2010/0096654 A1 | 4/2010 | Godo |
| 2011/0031496 A1 | 2/2011 | Yamazaki et al. |
| 2011/0031499 A1 | 2/2011 | Kimura et al. |
| 2011/0057187 A1 | 3/2011 | Sakakura et al. |
| 2011/0062434 A1 | 3/2011 | Eguchi et al. |
| 2011/0108837 A1 | 5/2011 | Yamazaki et al. |
| 2011/0133181 A1 | 6/2011 | Yamazaki |
| 2011/0210324 A1 | 9/2011 | Sakakura et al. |
| 2011/0210355 A1 | 9/2011 | Yamazaki et al. |
| 2013/0021316 A1 | 1/2013 | Inoue |
| 2013/0063413 A1 | 3/2013 | Miyake |
| 2013/0069068 A1 | 3/2013 | Miyake |
| 2015/0171156 A1 | 6/2015 | Miyake |
| 2016/0300900 A1 | 10/2016 | Miyake |

* cited by examiner

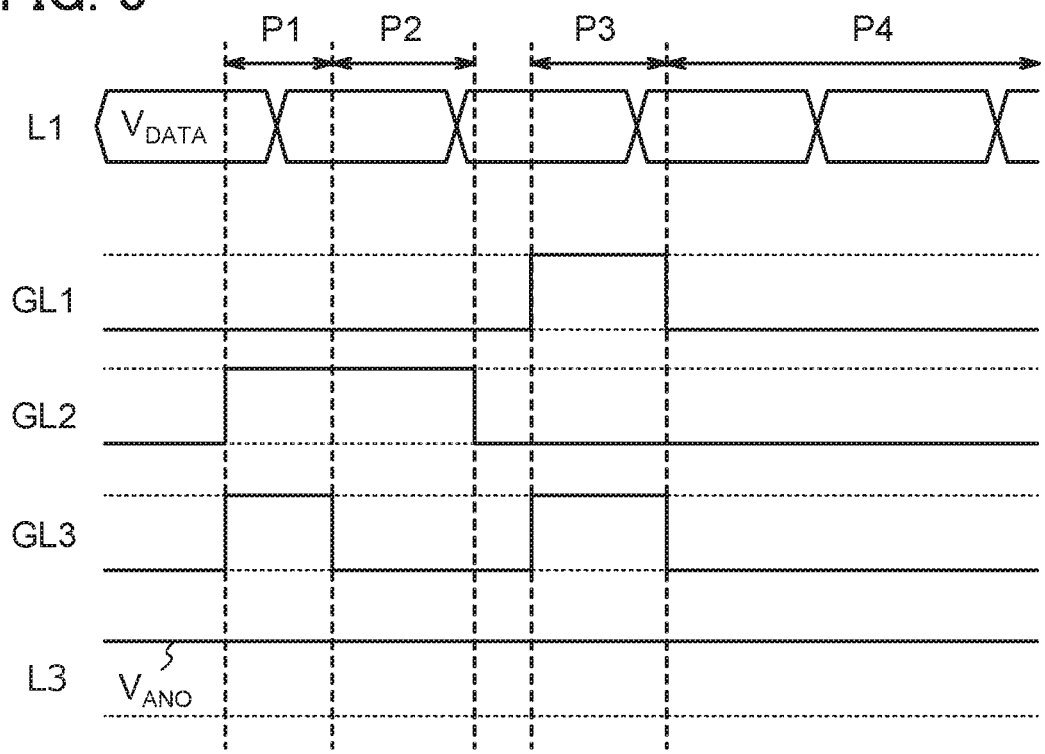

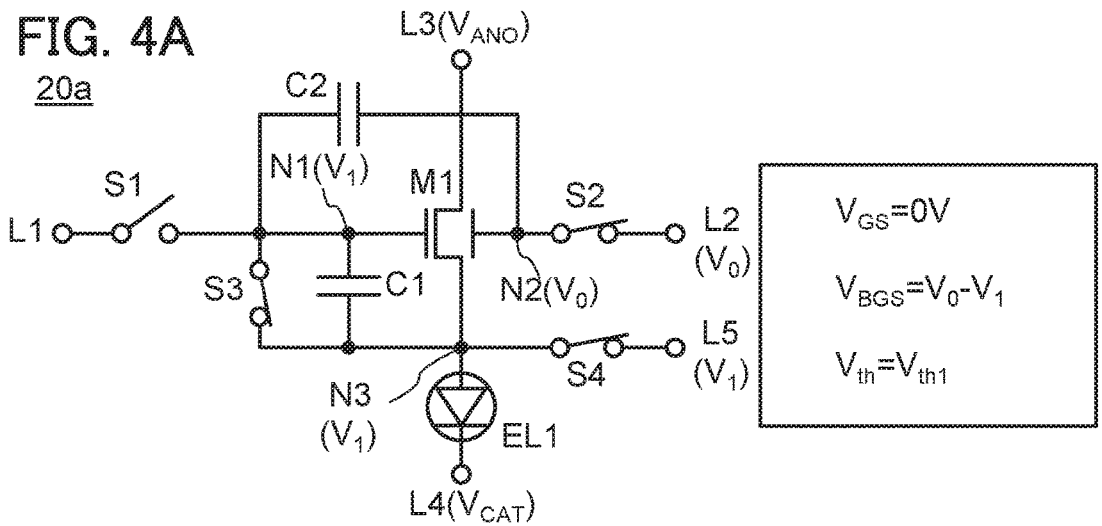
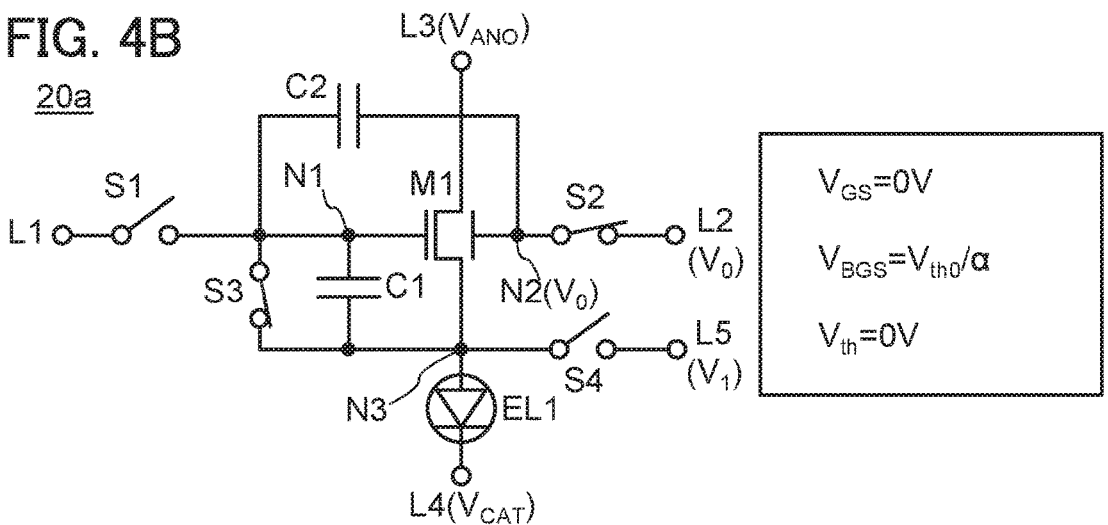
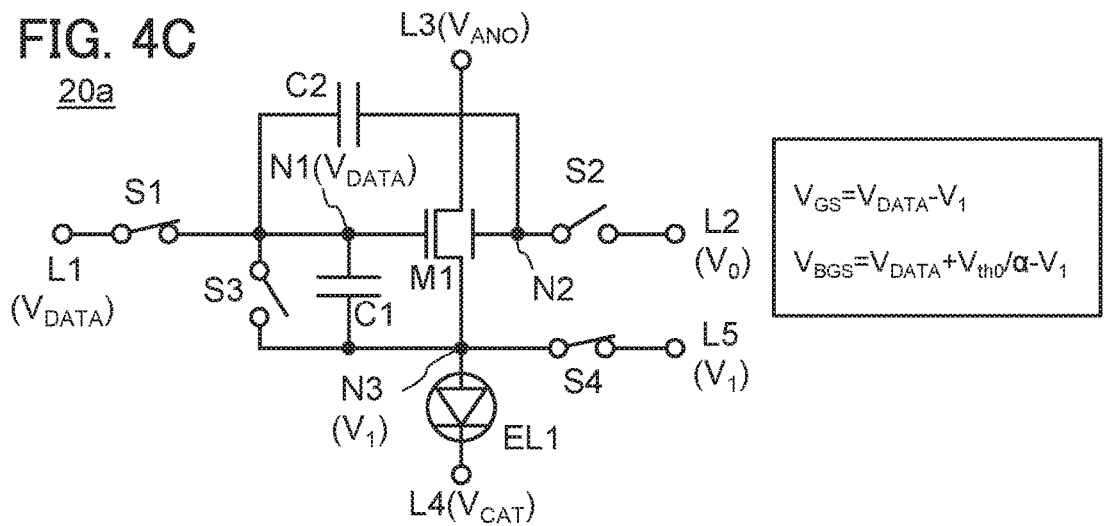

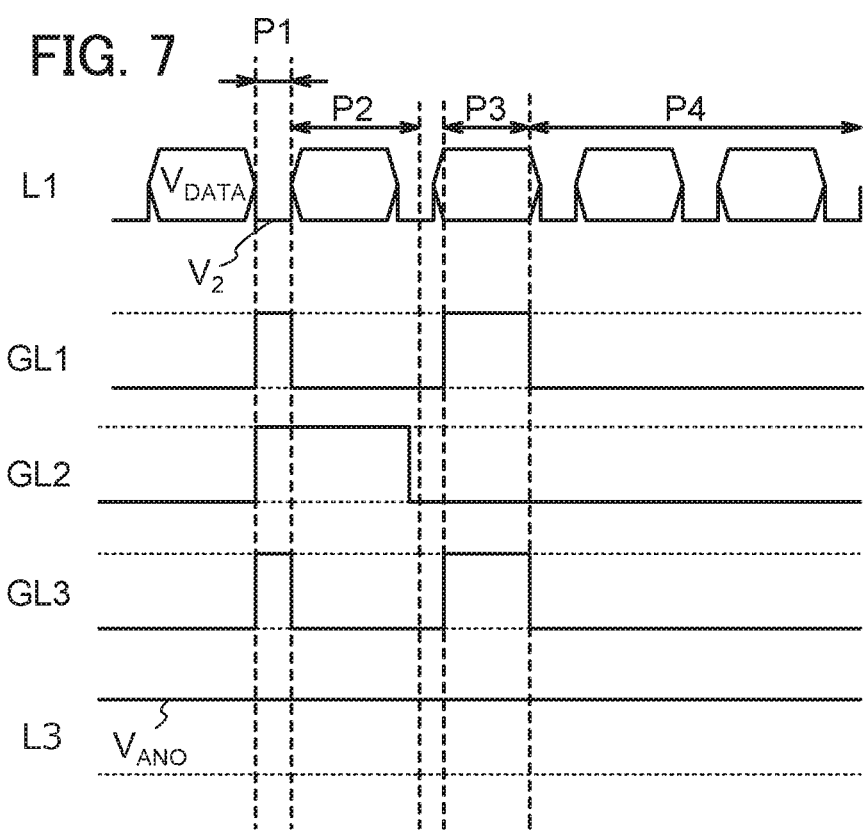

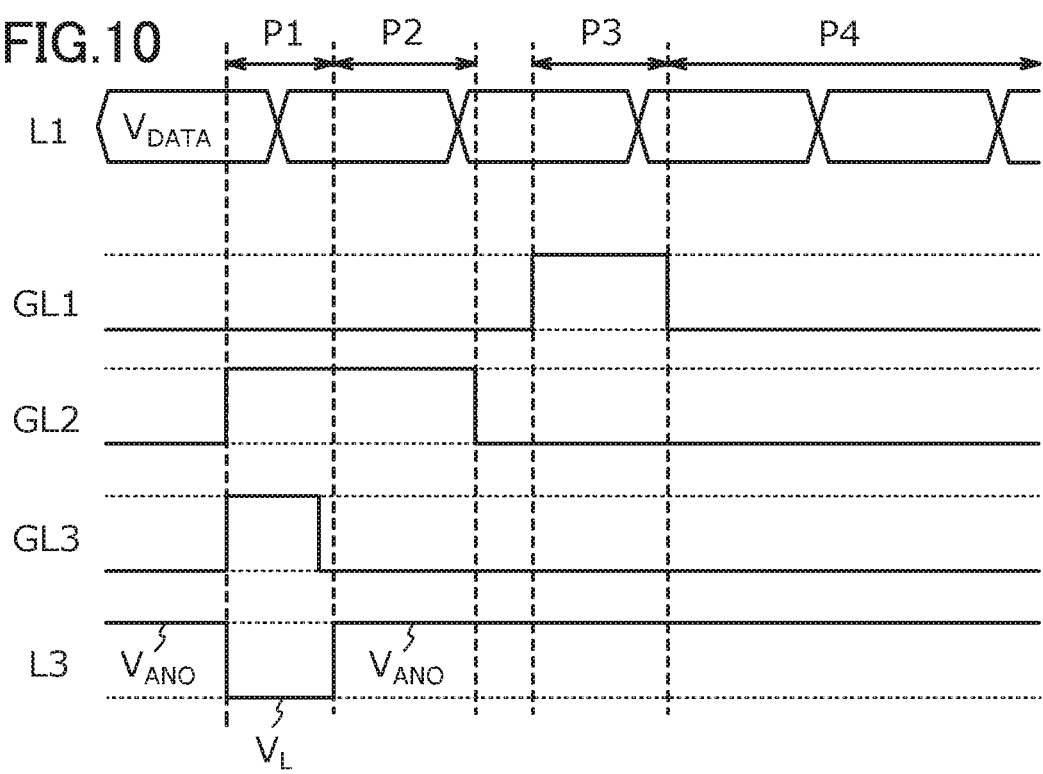

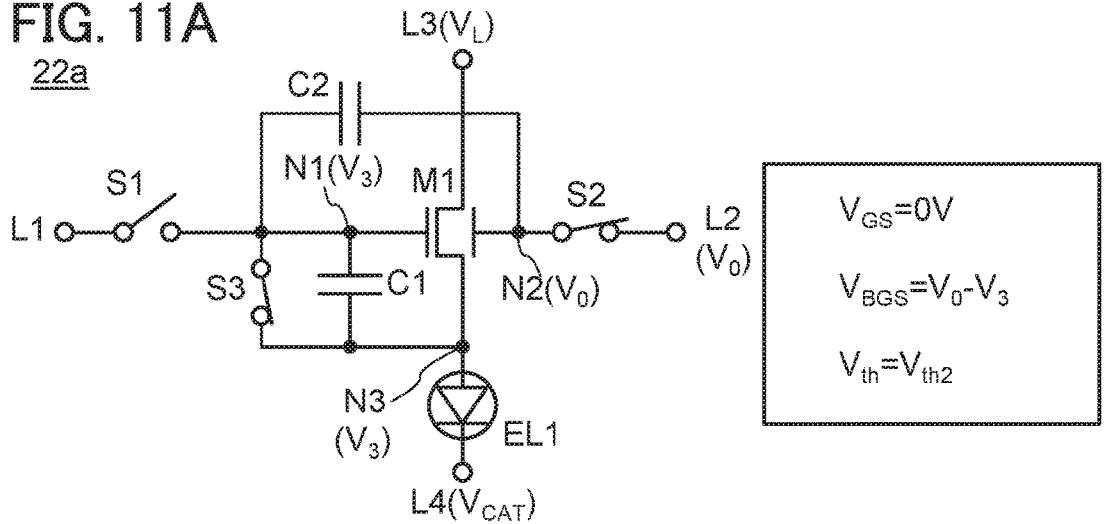
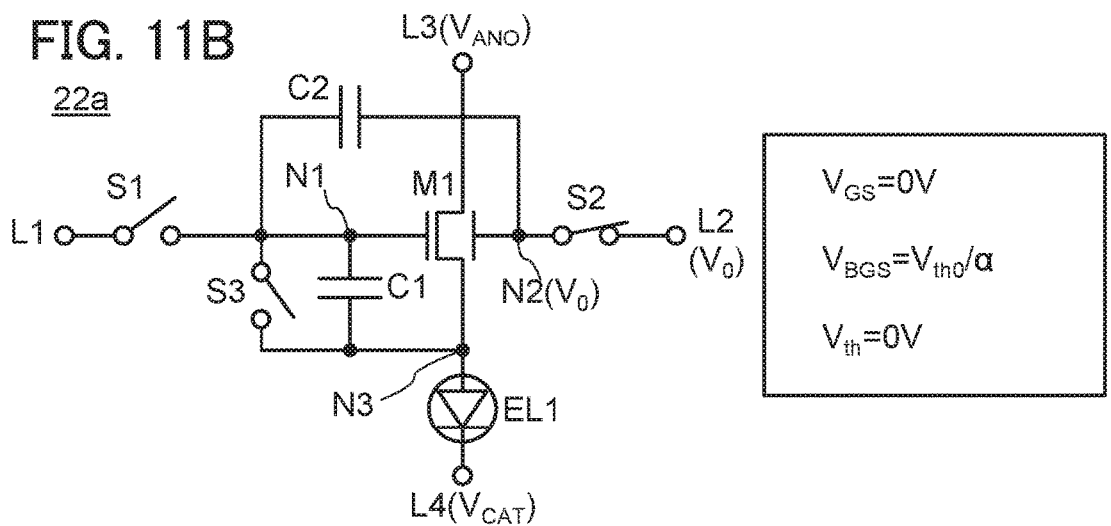
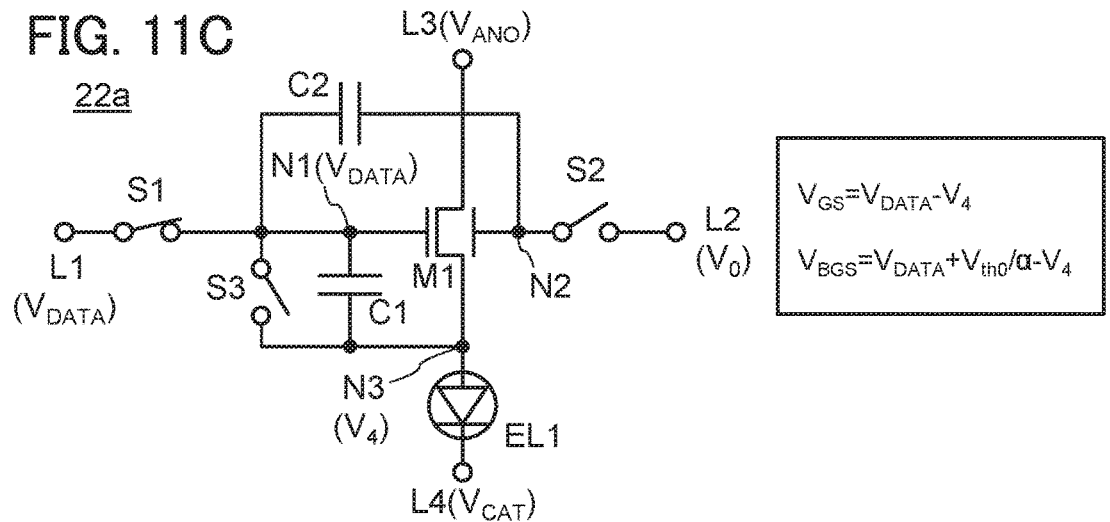

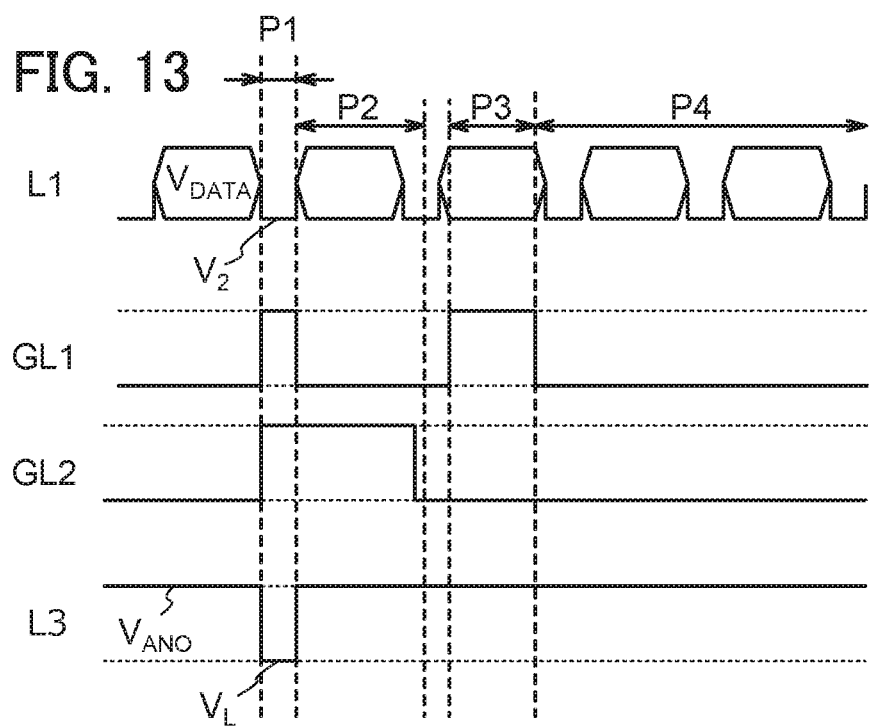

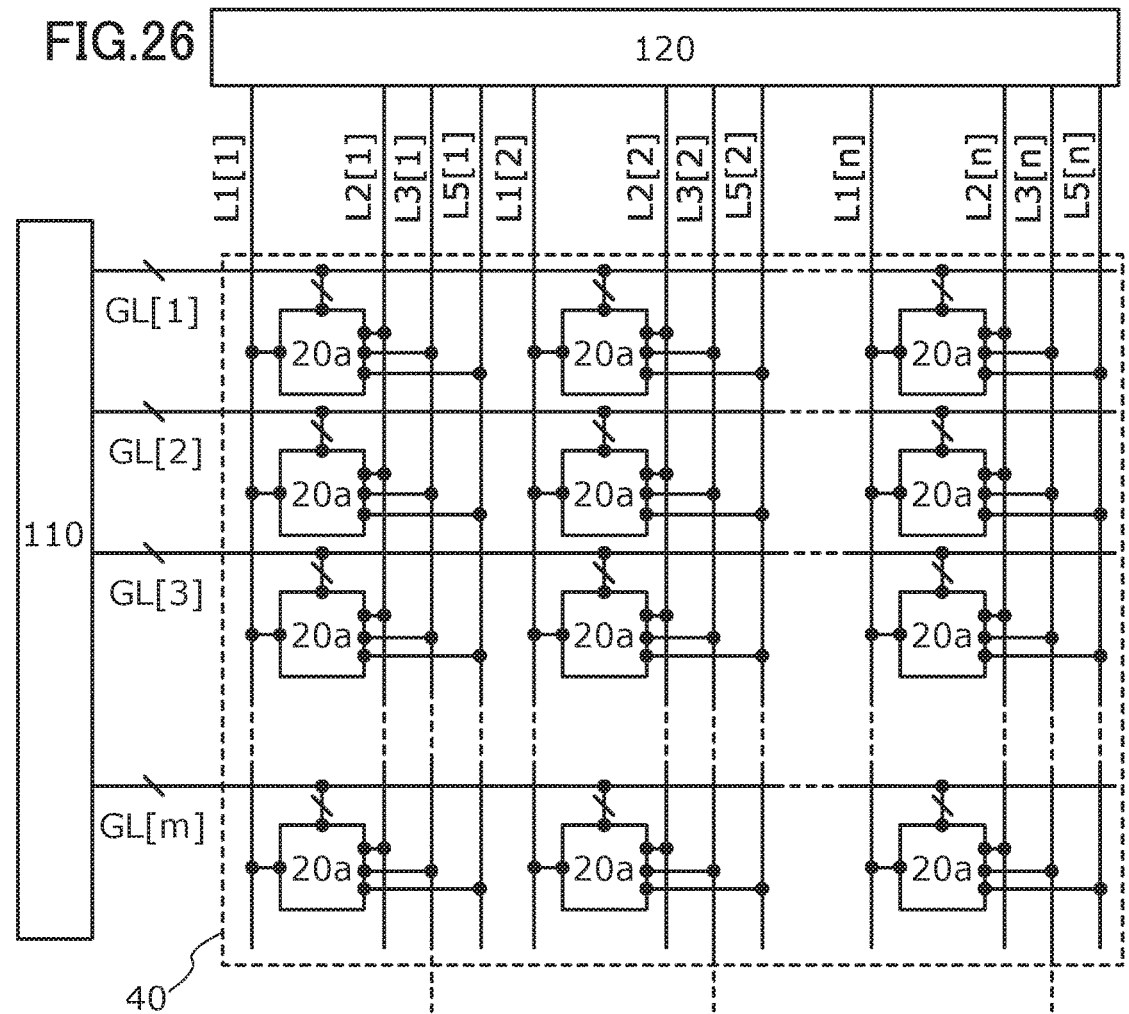

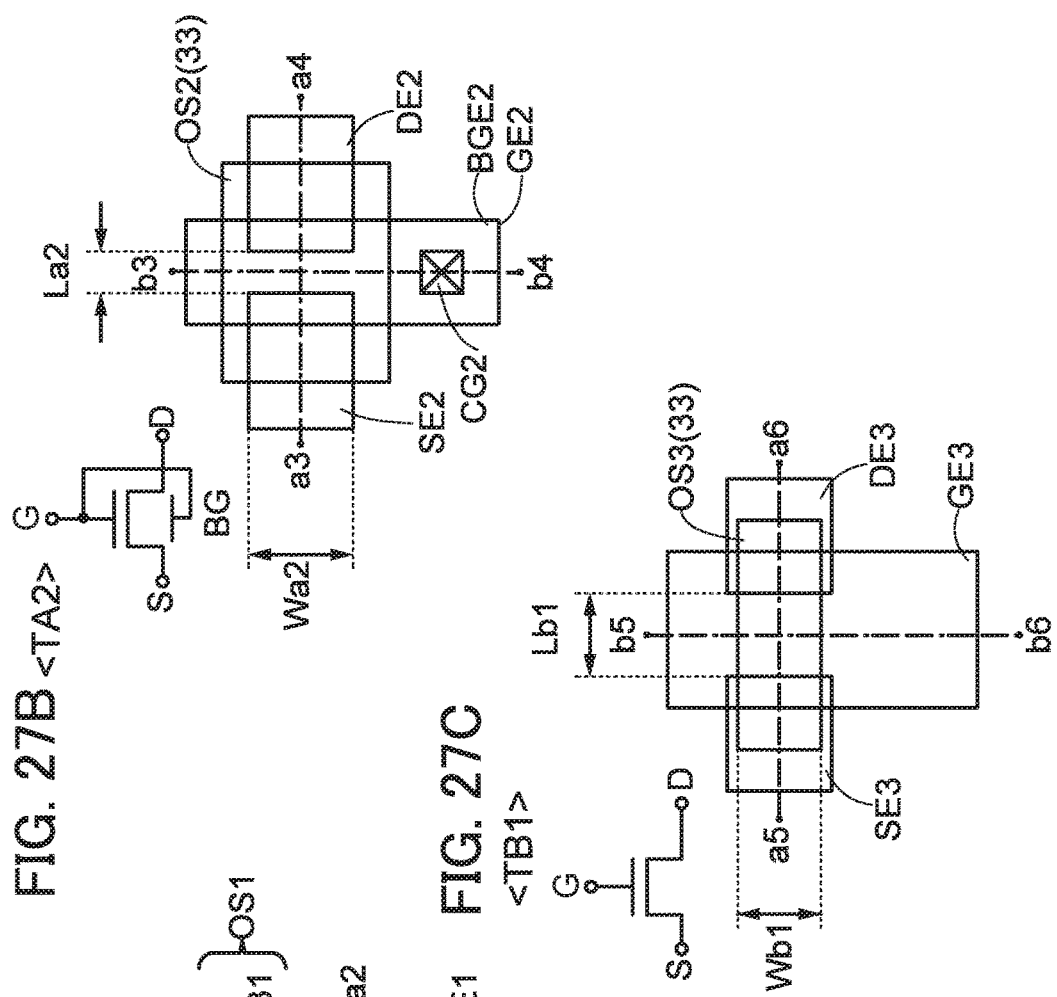

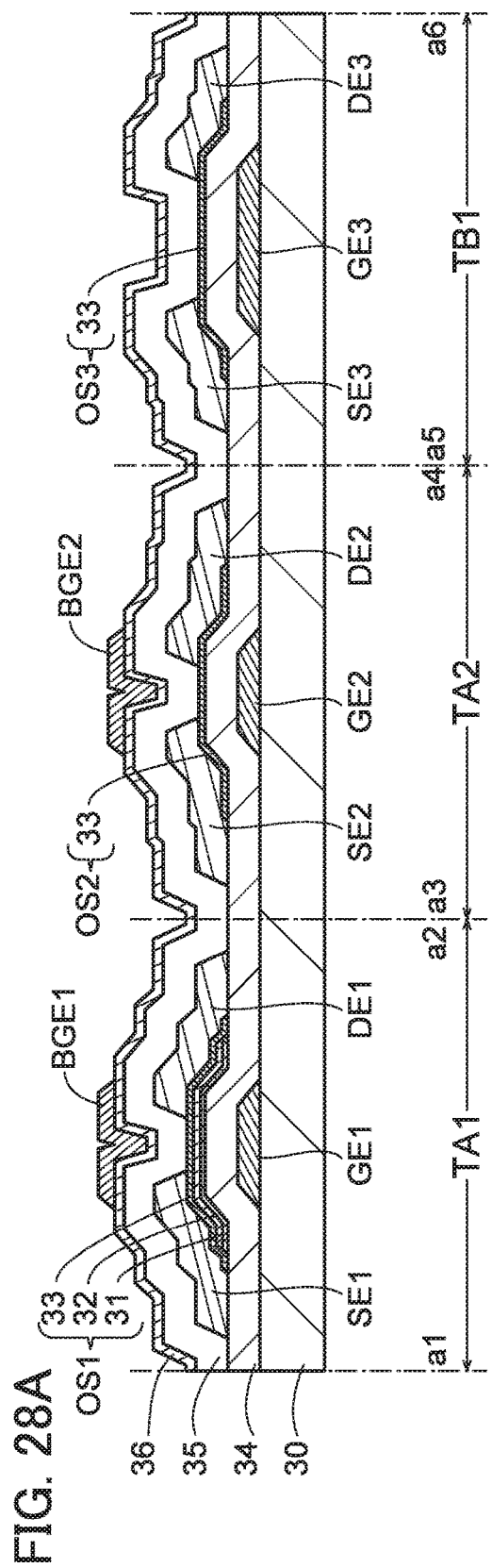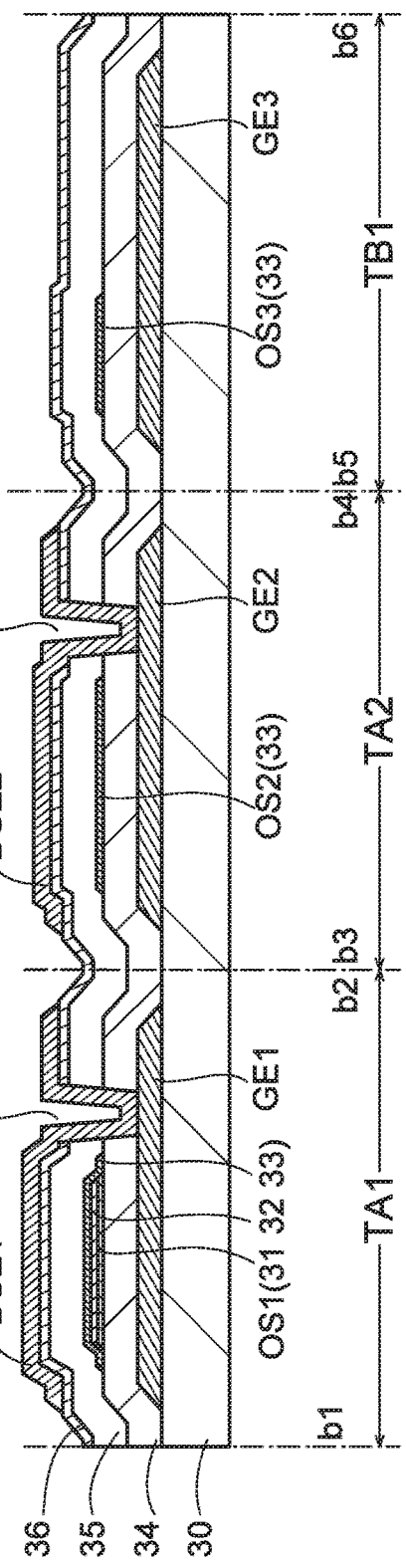

<TA4>

<TA3>

FIG. 31A <TC1>
FIG. 31B <TB2>
FIG. 31C <TD1>
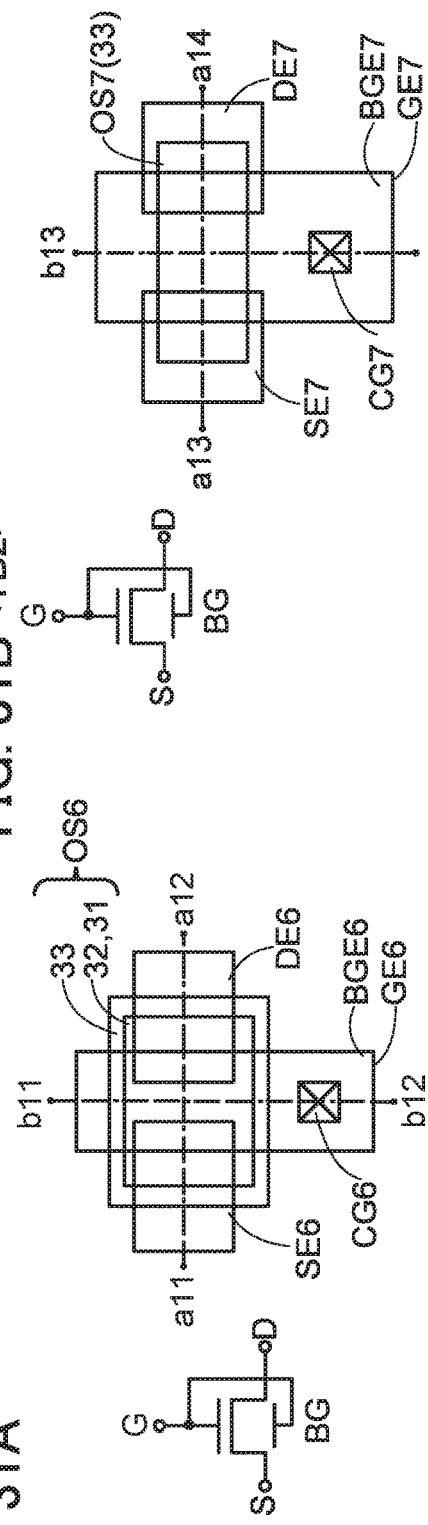
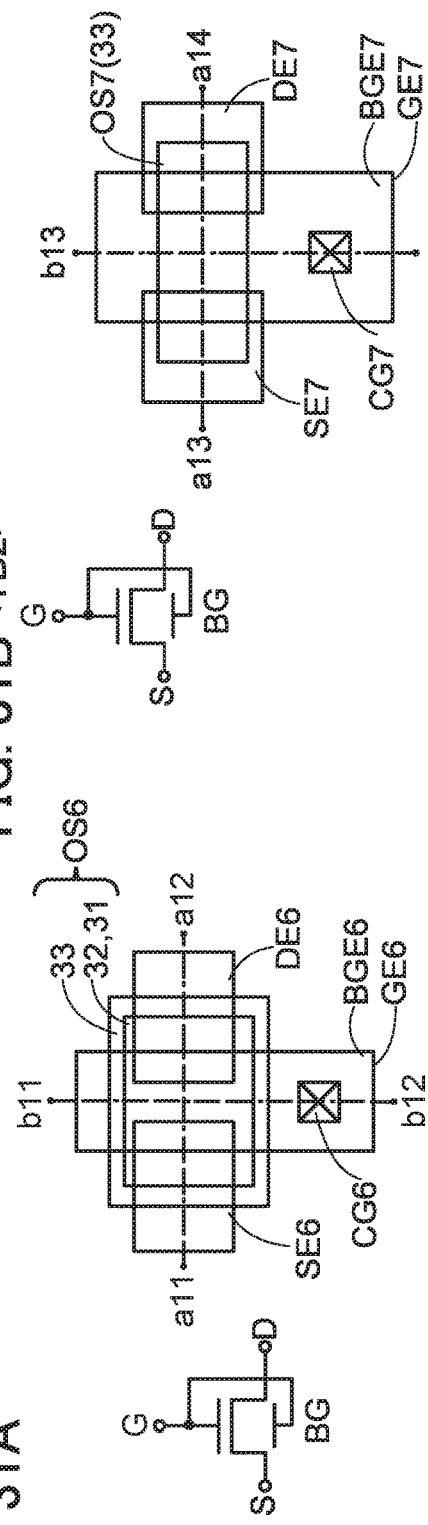
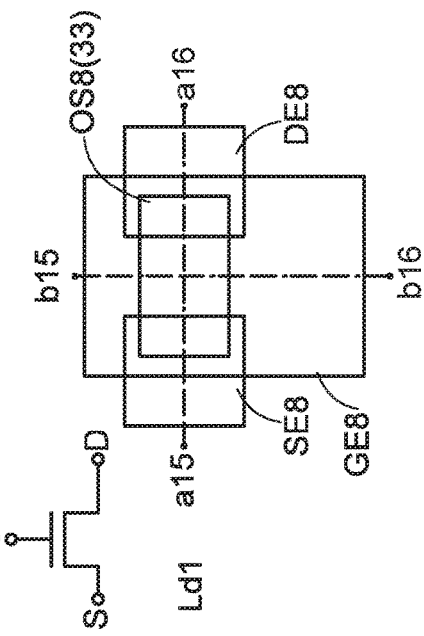

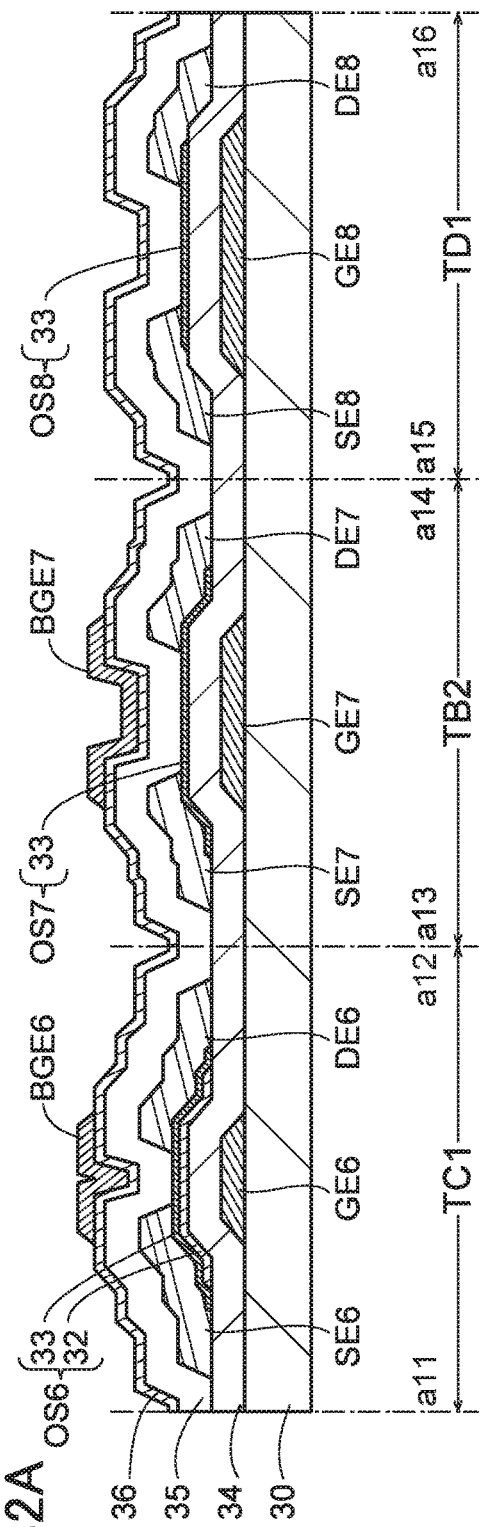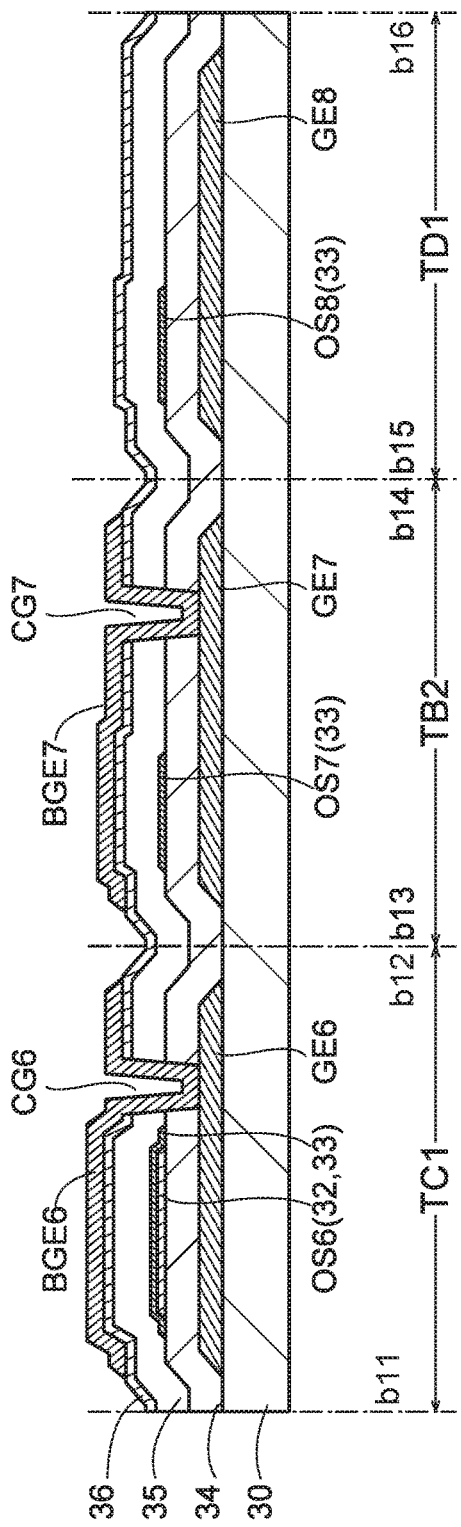

L1-L2 Cross-sectional structure

W1-W2 Cross-sectional structure

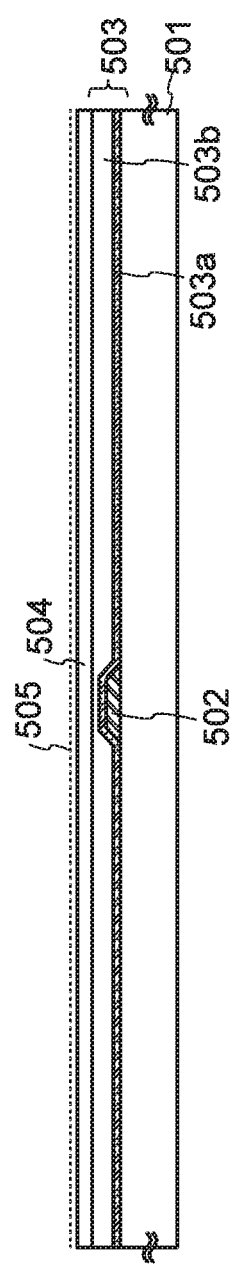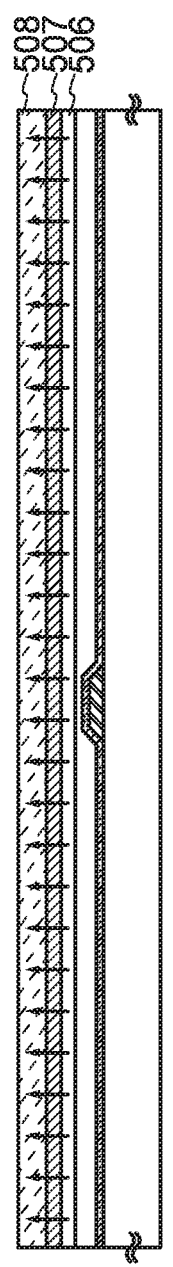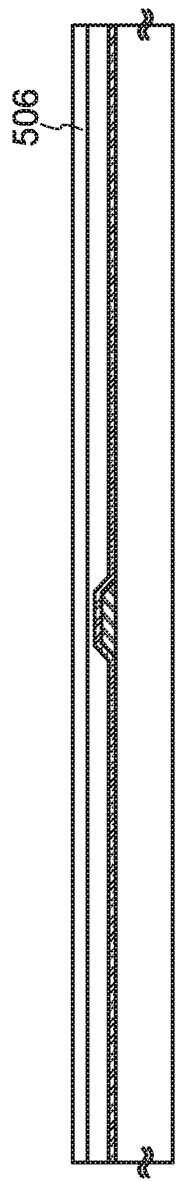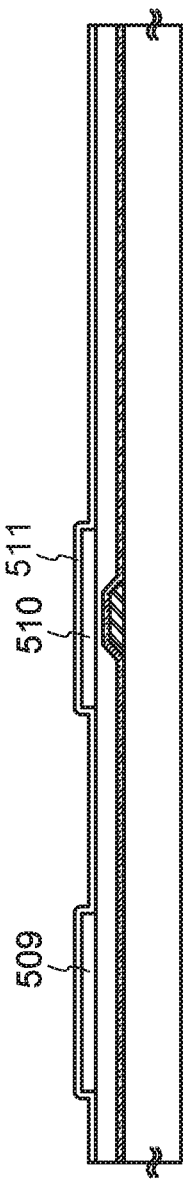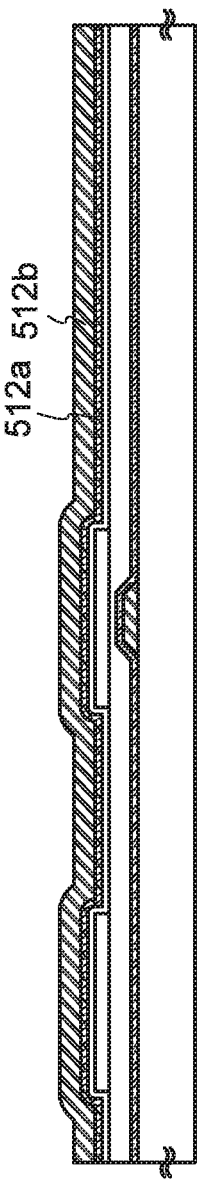

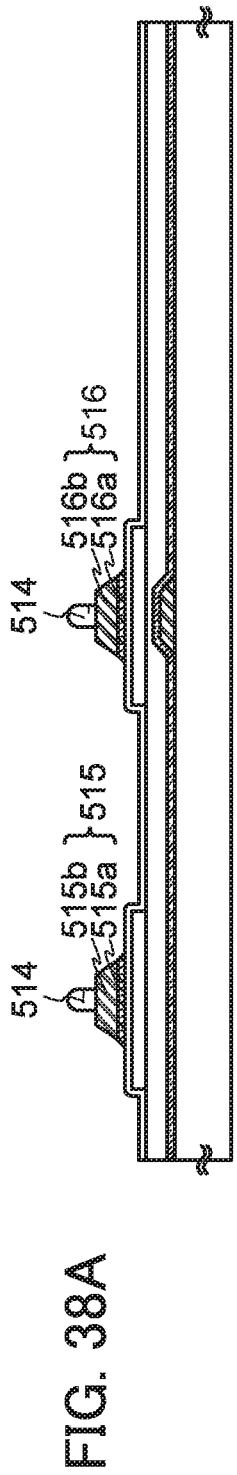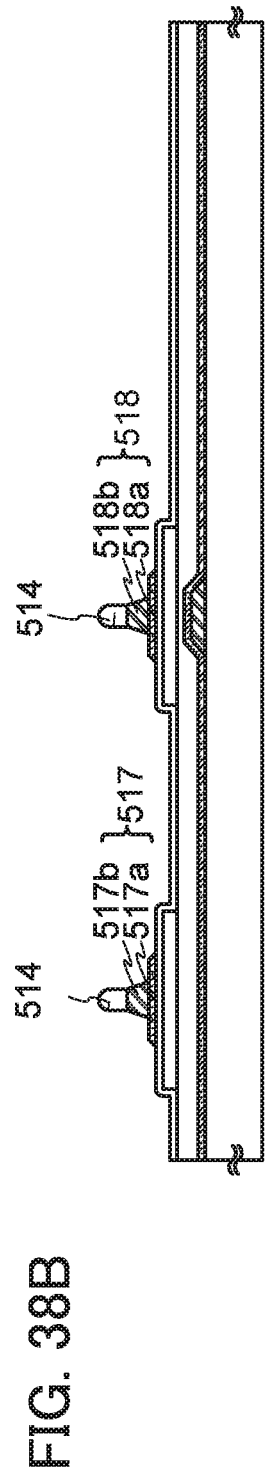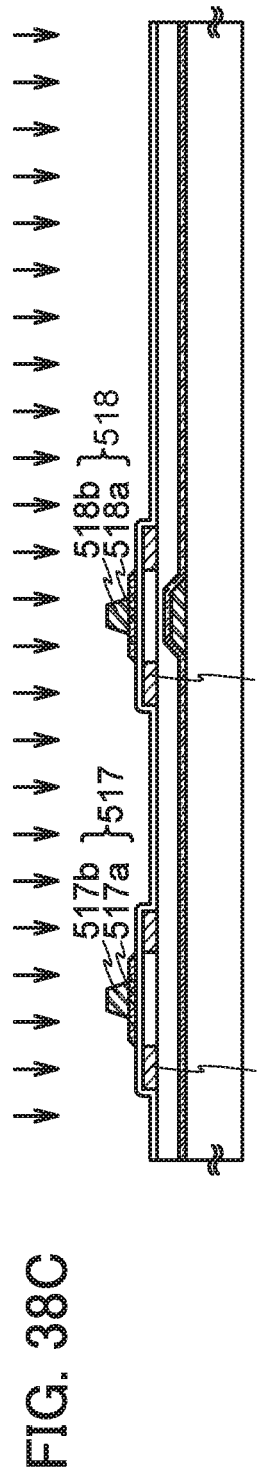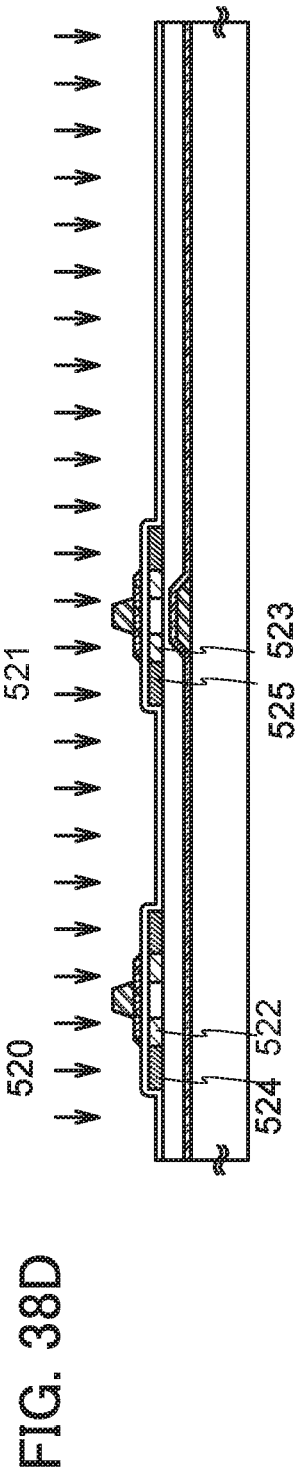
FIG. 38A
FIG. 38B
FIG. 38C
FIG. 38D

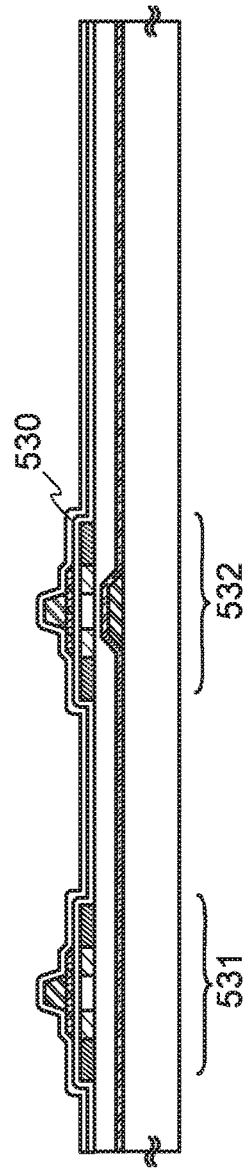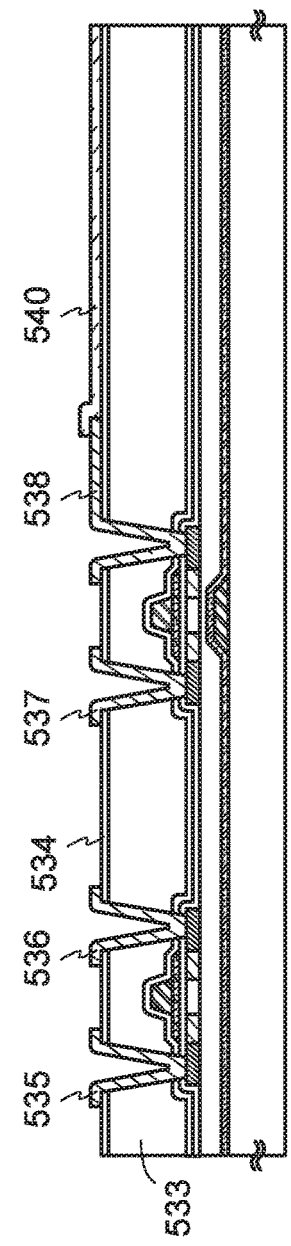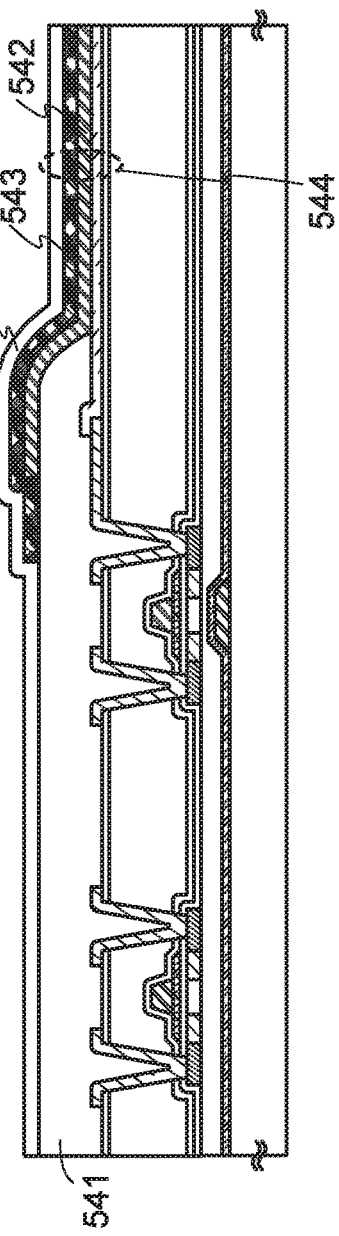

DISPLAY DEVICE

BACKGROUND OF THE INVENTION

1. Field of the Invention

One embodiment of the present invention relates to a display device.

The present invention relates to an object, a method, or a manufacturing method. In addition, the present invention relates to a process, a machine, manufacture, or a composition of matter. One embodiment of the present invention relates to a semiconductor device, a light-emitting device, a power storage device, a memory device, a driving method thereof, or a manufacturing method thereof. In particular, one embodiment of the present invention relates to a semiconductor device, a display device, or a light-emitting device each including an oxide semiconductor.

In this specification and the like, a semiconductor device generally means a device that can function by utilizing semiconductor characteristics. In some cases, a display device, an electro-optical device, a semiconductor circuit, or an electronic device includes a semiconductor device.

2. Description of the Related Art

Specific structures of active-matrix display devices using light-emitting elements differ depending on manufacturers. In general, at least a light-emitting element, a transistor (switching transistor) which controls input of a video signal to a pixel, and a transistor (driving transistor) which controls the amount of current supplied to the light-emitting element are provided in each pixel.

When all the transistors in the pixels have the same polarity, it is possible to omit some of steps for manufacturing the transistors, e.g., a step of adding an impurity element imparting one conductivity type to a semiconductor film. Patent Document 1 discloses a light-emitting element type display in which transistors included in pixels are all n-channel transistors.

In an active-matrix display device including light-emitting elements, variation in threshold voltage among transistors for controlling the amount of current supplied to the light-emitting elements in accordance with image signals (such transistors are also referred to as driving transistors) is likely to influence the luminances of the light-emitting elements. Patent Document 2 discloses a circuit configuration for preventing the above-described variation in threshold voltage from influencing the luminances of the light-emitting elements.

REFERENCES

[Patent Document 1] Japanese Published Patent Application No. 2003-195810
[Patent Document 2] Japanese Published Patent Application No. 2013-137498

SUMMARY OF THE INVENTION

A pixel where the threshold voltage of the driving transistor can be corrected includes a large number of transistors. Thus, it is difficult to achieve high resolution with such a pixel, and in the case of a bottom-emission structure (a structure in which light is extracted through a substrate provided with transistors), the transistors block light emitted from light-emitting elements, resulting in a low aperture ratio.

In view of the above-described technical background, an object of one embodiment of the present invention is to provide a display device in which variation in luminance among pixels due to variation in threshold voltage among driving transistors can be suppressed. An object of one embodiment of the present invention is to provide a high-resolution display device. An object of one embodiment of the present invention is to provide a display device with a high aperture ratio.

An object of one embodiment of the present invention is to provide a novel display device or a novel semiconductor device.

Note that the descriptions of a plurality of objects do not preclude the existence of each object. One embodiment of the present invention does not necessarily achieve all the objects listed above. Objects other than those listed above are apparent from the description of the specification, drawings, claims, and the like, and such objects could be objects of one embodiment of the present invention.

One embodiment of the present invention is a display device which includes a transistor, first and second capacitors, and a light-emitting element. The transistor includes a first gate and a second gate. A region of the first gate and a region of the second gate preferably overlap with each other with a channel formation region of the transistor therebetween. A first terminal of the transistor is supplied with a first potential. A first terminal of the first capacitor is electrically connected to the first gate. A second terminal of the first capacitor is electrically connected to a second terminal of the transistor. A first terminal of the second capacitor is electrically connected to the first gate. A second terminal of the second capacitor is electrically connected to the second gate. A first terminal of the light-emitting element is electrically connected to the second terminal of the transistor. A second terminal of the light-emitting element is supplied with a second potential.

In the above embodiment, the transistor is preferably an n-channel transistor.

In the above embodiment, the first potential is preferably higher than the second potential.

In the above embodiment, the channel formation region preferably includes an oxide semiconductor.

One embodiment of the present invention is a display device which includes a transistor, first to fourth switches, first and second capacitors, a light-emitting element, and first to fifth wirings. The transistor includes a first gate and a second gate. A region of the first gate and a region of the second gate preferably overlap with each other with a channel formation region of the transistor therebetween. A first terminal of the transistor is electrically connected to the third wiring. The first switch has a function of controlling electrical connection between the first wiring and the first gate. The second switch has a function of controlling electrical connection between the second wiring and the second gate. The third switch has a function of controlling electrical connection between the first gate and a second terminal of the transistor. The fourth switch has a function of controlling electrical connection between the fifth wiring and the second terminal of the transistor. A first terminal of the first capacitor is electrically connected to the first gate. A second terminal of the first capacitor is electrically connected to the second terminal of the transistor. A first terminal of the second capacitor is electrically connected to the first gate. A second terminal of the second capacitor is electrically connected to the second gate. A first terminal of the light-emitting element is electrically connected to the second terminal of the transistor. A second terminal of the light-emitting element is electrically connected to the fourth wiring.

In the above embodiment, the transistor is preferably an n-channel transistor.

In the above embodiment, the channel formation region preferably includes an oxide semiconductor.

In the above embodiment, each of the first to fourth switches is preferably a transistor including an oxide semiconductor in the channel formation region.

One embodiment of the present invention is a display device which includes a transistor, first to third switches, first and second capacitors, a light-emitting element, and first to fifth wirings. The transistor includes a first gate and a second gate. A region of the first gate and a region of the second gate preferably overlap with each other with a channel formation region of the transistor therebetween. A first terminal of the transistor is electrically connected to the third wiring. The first switch has a function of controlling electrical connection between the first wiring and the first gate. The second switch has a function of controlling electrical connection between the second wiring and the second gate. The third switch has a function of controlling electrical connection between the fifth wiring and a second terminal of the transistor. A first terminal of the first capacitor is electrically connected to the first gate. A second terminal of the first capacitor is electrically connected to the second terminal of the transistor. A first terminal of the second capacitor is electrically connected to the first gate. A second terminal of the second capacitor is electrically connected to the second gate. A first terminal of the light-emitting element is electrically connected to the second terminal of the transistor. A second terminal of the light-emitting element is electrically connected to the fourth wiring.

In the above embodiment, the transistor is preferably an n-channel transistor.

In the above embodiment, the channel formation region preferably includes an oxide semiconductor.

In the above embodiment, each of the first to third switches is preferably a transistor including an oxide semiconductor in a channel formation region.

One embodiment of the present invention is a display device which includes a transistor, first to third switches, first and second capacitors, a light-emitting element, and first to fourth wirings. The transistor includes a first gate and a second gate. A region of the first gate and a region of the second gate preferably overlap with each other with a channel formation region of the transistor therebetween. A first terminal of the transistor is electrically connected to the third wiring. The first switch has a function of controlling electrical connection between the first wiring and the first gate. The second switch has a function of controlling electrical connection between the second wiring and the second gate. The third switch has a function of controlling electrical connection between the first gate and a second terminal of the transistor. A first terminal of the first capacitor is electrically connected to the first gate. A second terminal of the first capacitor is electrically connected to the second terminal of the transistor. A first terminal of the second capacitor is electrically connected to the first gate. A second terminal of the second capacitor is electrically connected to the second gate. A first terminal of the light-emitting element is electrically connected to the second terminal of the transistor. A second terminal of the light-emitting element is electrically connected to the fourth wiring.

In the above embodiment, the transistor is preferably an n-channel transistor.

In the above embodiment, the channel formation region preferably includes an oxide semiconductor.

In the above embodiment, each of the first to third switches is preferably a transistor including an oxide semiconductor in a channel formation region.

One embodiment of the present invention is a display device which includes a transistor, first and second switches, first and second capacitors, a light-emitting element, and first to fourth wirings. The transistor includes a first gate and a second gate. A region of the first gate and a region of the second gate preferably overlap with each other with a channel formation region of the transistor therebetween. A first terminal of the transistor is electrically connected to the third wiring. The first switch has a function of controlling electrical connection between the first wiring and the first gate. The second switch has a function of controlling electrical connection between the second wiring and the second gate. A first terminal of the first capacitor is electrically connected to the first gate. A second terminal of the first capacitor is electrically connected to a second terminal of the transistor. A first terminal of the second capacitor is electrically connected to the first gate. A second terminal of the second capacitor is electrically connected to the second gate. A first terminal of the light-emitting element is electrically connected to the second terminal of the transistor. A second terminal of the light-emitting element is electrically connected to the fourth wiring.

In the above embodiment, the transistor is preferably an n-channel transistor.

In the above embodiment, the channel formation region preferably includes an oxide semiconductor.

In the above embodiment, each of the first and second switches is preferably a transistor including an oxide semiconductor in a channel formation region.

One embodiment of the present invention is an electronic device which includes the display device according to any of the above embodiments and at least one of a microphone, a speaker, and an operation key.

One embodiment of the present invention can provide a display device in which variation in luminance among pixels due to variation in threshold voltage among driving transistors can be suppressed. One embodiment of the present invention can provide a high-resolution display device. One embodiment of the present invention can provide a display device with a high aperture ratio.

One embodiment of the present invention can provide a novel display device or a novel semiconductor device.

Note that the descriptions of these effects do not disturb the existence of other effects. One embodiment of the present invention does not necessarily achieve all the effects listed above. Other effects will be apparent from and can be derived from the descriptions of the specification, the drawings, the claims, and the like.

BRIEF DESCRIPTION OF THE DRAWINGS

FIG. 3 is a timing chart illustrating an operation example of a pixel.

FIGS. 4A to 4C are circuit diagrams illustrating an operation example of a pixel.

FIG. 7 is a timing chart illustrating an operation example of a pixel.

FIG. 10 is a timing chart illustrating an operation example of a pixel.

FIGS. 11A to 11C are circuit diagrams illustrating an operation example of a pixel.

FIG. 13 is a timing chart illustrating an operation example of a pixel.

FIG. 26 is a circuit block diagram illustrating a configuration example of a pixel portion.

FIGS. 27A to 27C are top views of transistors.

FIGS. 28A and 28B are cross-sectional views of transistors.

FIGS. 31A to 31C are top views of transistors.

FIGS. 32A and 32B are cross-sectional views of transistors.

FIGS. 37A to 37E are cross-sectional views illustrating a manufacturing process of a transistor.

FIGS. 38A to 38D are cross-sectional views illustrating a manufacturing process of a transistor.

FIGS. 39A to 39C are cross-sectional views illustrating a manufacturing process of a transistor.

DETAILED DESCRIPTION OF THE INVENTION

Figure 1:
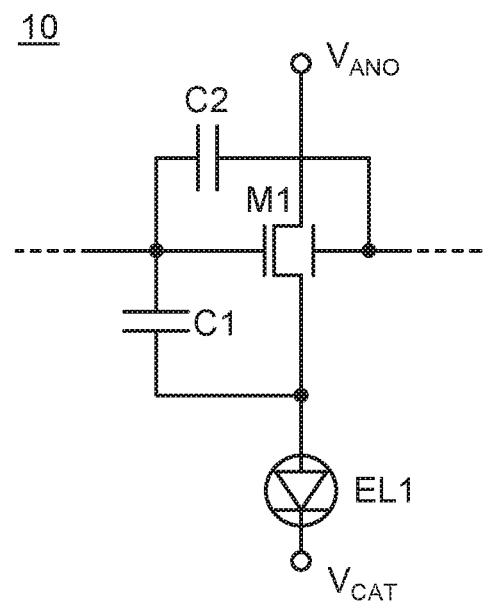
FIG. 1 is a circuit diagram illustrating a configuration example of a pixel.

Embodiments will be hereinafter described with reference to drawings. Note that the embodiments can be implemented with various modes. It will be readily appreciated by those skilled in the art that modes and details can be changed in various ways without departing from the spirit and scope of the present invention. Therefore, the present invention should not be interpreted as being limited to the description in the following embodiments.

Furthermore, in this specification, any of the embodiments and the examples below can be combined as appropriate. In the case where some structural examples are given in one embodiment or example, any of the structural examples can be combined as appropriate.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

Unless otherwise specified, an on-state current in this specification refers to a drain current of a transistor in the on state. Unless otherwise specified, the on state of an n-channel transistor means that the voltage difference between its gate and source ($V_{GS}$) is higher than or equal to the threshold voltage ($V_{th}$) of the transistor, and the on state of a p-channel transistor means that $V_{GS}$ is lower than or equal to $V_{th}$. For example, the on-state current of an n-channel transistor sometimes refers to a drain current that flows when $V_{GS}$ is higher than or equal to $V_{th}$. The on-state current of a transistor depends on voltage between its drain and source ($V_{DS}$) in some cases.

Unless otherwise specified, the off-state current in this specification refers to a drain current of a transistor in the off state. Unless otherwise specified, the off state of an n-channel transistor means that $V_{GS}$ is lower than $V_{th}$, and the off state of a p-channel transistor means that $V_{GS}$ is higher than $V_{th}$. For example, the off-state current of an n-channel transistor sometimes refers to a drain current that flows when $V_{GS}$ is lower than $V_{th}$. The off-state current of a transistor depends on $V_{GS}$ in some cases. Thus, "the off-state current of a transistor is lower than $10^{-21}$ A" may mean there is $V_{GS}$ at which the off-state current of the transistor is lower than $10^{-21}$ A.

The off-state current of a transistor depends on $V_{DS}$ in some cases. Unless otherwise specified, the off-state current in this specification may be an off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{DS}$ used in a semiconductor device or the like including the transistor.

In this specification, a high power supply voltage is referred to as an H level (or $V_{DD}$), and a low power supply voltage is referred to as an L level (or GND), in some cases.

Embodiment 1

In this embodiment, a configuration example of a display device according to one embodiment of the present invention will be described.

<Basic Configuration>

FIG. 1 illustrates a basic configuration of a pixel included in a display device according to one embodiment of the present invention. A pixel 10 in FIG. 1 includes a transistor M1, a capacitor C1, a capacitor C2, and a light-emitting element EL1

The transistor M1 includes a first gate and a second gate. A region of the first gate and a region of the second gate overlap with each other with a channel formation region of the transistor M1 therebetween. The transistor M1 includes a first terminal functioning as one of a source and a drain of the transistor M1 and a second terminal functioning as the other of the source and the drain.

The transistor M1 preferably includes, in a channel formation region, amorphous silicon, polycrystalline silicon, crystalline silicon, an oxide semiconductor (OS), an organic semiconductor, or the like. A transistor including an OS in a channel formation region (hereinafter referred to as an OS transistor) is particularly preferable, because variation among the transistors due to the manufacturing process is small.

Examples of the light-emitting element EL1 include an element whose luminance is controlled by current or voltage, such as a light-emitting diode (LED) or an organic light-emitting diode (OLED). For example, an OLED includes at least an electroluminescent (EL) layer, an anode, and a cathode. The EL layer is formed using a single layer or a plurality of layers provided between the anode and the cathode, at least one of which is a light-emitting layer containing a light-emitting substance. From the EL layer, electroluminescence is obtained by current supplied when a potential difference between the cathode and the anode is larger than or equal to the threshold voltage of the light-emitting element EL1. The threshold voltage of the light-emitting element EL1 is hereinafter denoted by $V_{EL}$. Electroluminescence includes luminescence (fluorescence) at the time of returning from a singlet-excited state to a ground state and luminescence (phosphorescence) at the time of returning from a triplet-excited state to a ground state.

One of the anode and the cathode of the light-emitting element EL1 serves as a pixel electrode and the other thereof serves as a common electrode. FIG. 1 illustrates a configuration in which the anode of the light-emitting element EL1 is used as the pixel electrode and the cathode of the light-emitting element EL1 is used as the common electrode.

The first terminal of the transistor M1 is supplied with a potential $V_{ANO}$. A first terminal of the capacitor C1 is electrically connected to the first gate, and a second terminal of the capacitor C1 is electrically connected to the second terminal of the transistor M1. A first terminal of the capacitor C2 is electrically connected to the first gate, and a second terminal of the capacitor C2 is electrically connected to the second gate. A first terminal (anode) of the light-emitting element EL1 is electrically connected to the second terminal of the transistor M1, and a second terminal (cathode) of the light-emitting element EL1 is supplied with a potential $V_{CAT}$.

The transistor M1 in FIG. 1 is an n-channel transistor. The potential $V_{ANO}$ is preferably higher than the potential $V_{CAT}$. $V_{ANO}$ is preferably higher than a voltage obtained by adding $V_{EL}$ and $V_{th}$ to $V_{CAT}$, where $V_{th}$ is the threshold voltage of the transistor M1.

When the first terminal of the transistor M1 is supplied with $V_{ANO}$ and the second terminal of the light-emitting element EL1 is supplied with $V_{CAT}$, the value of drain current of the transistor M1 is determined in accordance with an image signal supplied to the first gate. The drain current determined as described above is supplied to the light-emitting element ELL accordingly, the light-emitting element EL1 emits light.

The capacitor C1 has a function of retaining a potential difference between the first gate and the second terminal of the transistor M1. That is, the capacitor C1 has a function of retaining a potential difference between the first gate and the source of the transistor M1. The capacitor C2 has a function of retaining a potential difference between the first gate and the second gate.

In one embodiment of the present invention, before the value of drain current of the transistor M1 is determined in accordance with an image signal, the threshold voltage of the transistor M1 is corrected to suppress variation in threshold voltage among the pixels. A potential based on the image signal is also supplied to the second gate; accordingly, dual-gate driving of the transistor M1 can be performed and the on-state current thereof can be increased.

Note that the term "dual-gate driving" in this specification refers to a state where a high potential (or a low potential) is applied to the first gate and the second gate at the same time.

A more specific configuration example of a display device according to one embodiment of the present invention with a switch or the like added to the pixel 10 will be described below.

<Configuration Example of Pixel 20a>

Figure 2A:
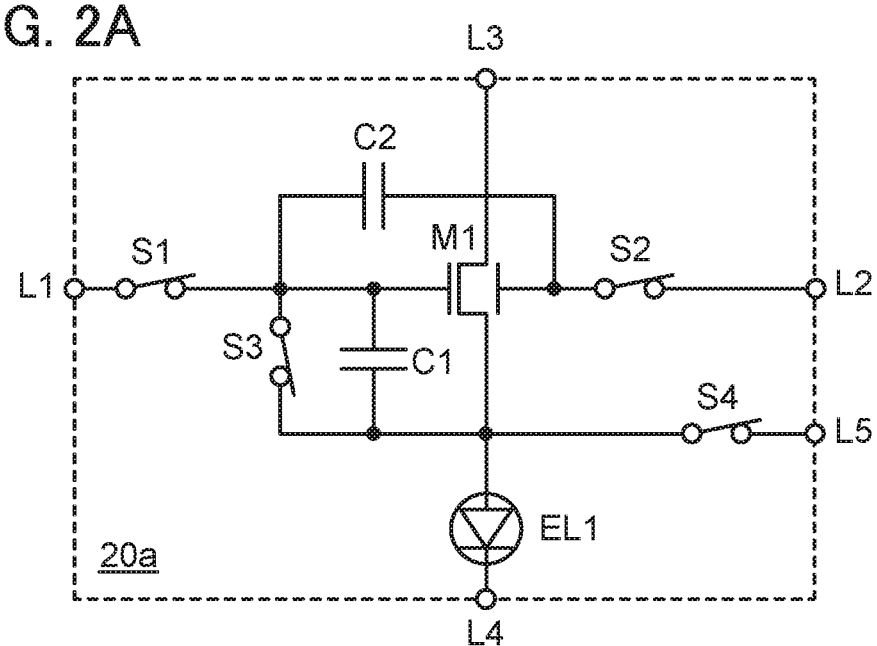
FIGS. 2A and 2B are circuit diagrams each illustrating a configuration example of a pixel.

FIG. 2A illustrates a configuration example of a pixel 20a included in a display device according to one embodiment of the present invention. The pixel 20a in FIG. 2A includes the transistor M1, a switch S1, a switch S2, a switch S3, a switch S4, the capacitor C1, the capacitor C2, and the light-emitting element EL1. The pixel 20a includes the switches S1 to S4 in addition to the components of the pixel 10. The pixel 20a is electrically connected to a wiring L1, a wiring L2, a wiring L3, a wiring L4, and a wiring L5.

The switches S1 to S4 each include one or more transistors. Alternatively, the switches S1 to S4 may each include a capacitor as well as one or more transistors.

The first terminal of the transistor M1 is electrically connected to the wiring L3.

The switch S1 has a function of controlling electrical connection between the wiring L1 and the first gate. The switch S2 has a function of controlling electrical connection between the wiring L2 and the second gate. The switch S3 has a function of controlling electrical connection between the first gate and the second terminal of the transistor M1. The switch S4 has a function of controlling electrical connection between the wiring L5 and the second terminal of the transistor M1.

The first terminal of the light-emitting element EL1 is electrically connected to the second terminal of the transistor M1. The second terminal of the light-emitting element EL1 is electrically connected to the wiring L4.

The wiring L1 has a function of supplying an image signal to the pixel 20a.

Figure 2B:
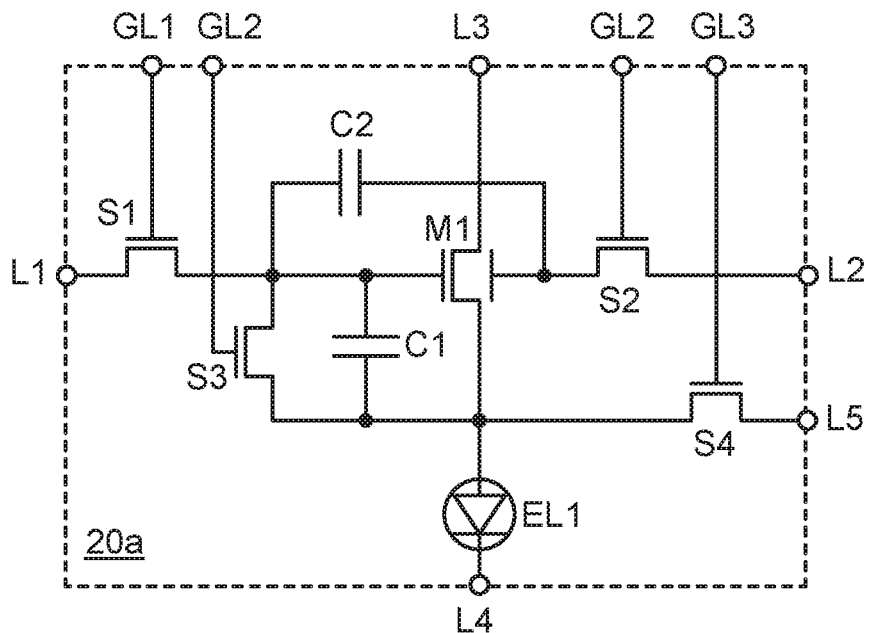

FIG. 2B illustrates a more specific configuration example of the pixel 20a. FIG. 2B is a circuit diagram in which the switches S1 to S4 in FIG. 2A are n-channel transistors. A gate of the switch S1 is electrically connected to a wiring GL1, a gate of the switch S2 is electrically connected to a wiring GL2, a gate of the switch S3 is electrically connected to the wiring GL2, and a gate of the switch S4 is electrically connected to a wiring GL3. When an H level is supplied to the wirings GL1 to GL3, the switches connected thereto are turned on, whereas when an L level is supplied to the wirings GL1 to GL3, the switches connected thereto are turned off.

For example, a transistor with a low off-state current is preferably used as each of the switches S1 to S4. Here, the term "low off-state current" means that a normalized off-state current per micrometer of channel width at room temperature with a source-drain voltage of 3 V is lower than or equal to 10×10$^{-21}$ A. With the use of a transistor with a low off-state current as each of the switches S1 to S4, input image data can continue to be held in the pixel. As long as a still image continues to be displayed, the frequency of rewriting image data can be reduced and power-saving can be achieved in the display device.

Examples of the transistor with a low off-state current include an OS transistor and a transistor including a wide band gap semiconductor (a semiconductor with a band gap of greater than or equal to 2.2 eV, such as silicon carbide, gallium nitride, or diamond) in a channel formation region.

The description of the pixel 10 can be referred to for the details of the other components in the pixel 20a.

<Operation Example of Pixel 20a>

Next, an example of the operation of the pixel 20a will be described with reference to FIG. 3, FIGS. 4A to 4C, and FIG. 5.

FIG. 3 is a timing chart showing a potential $V_{DATA}$ supplied to the wiring L1, potentials supplied to the wirings GL1 to GL3, and a potential supplied to the wiring L3. The timing chart in FIG. 3 illustrates periods P1 to P4. FIG. 4A illustrates the state of the pixel 20a in the period P1. FIG. 4B illustrates the state of the pixel 20a in the period P2. FIG. 4C illustrates the state of the pixel 20a in the period P3. To simply show the operation of the pixel 20a, each of the switches S1 to S4 is illustrated as a switch in FIGS. 4A to 4C.

The period P1 is a period for initializing the pixel 20a. The period P2 is a period for fixing the threshold voltage of the transistor M1 at 0 V. The period P3 is a period for writing data to the pixel 20a. The period P4 is a period for light emission from the pixel 20a.

In FIGS. 4A to 4C, a node of the first gate of the transistor M1 and the first terminal of the capacitor C1 is denoted by a node N1; a node of the second gate of the transistor M1 and the second terminal of the capacitor C2 is denoted by a node N2; and a node of the second terminal of the transistor M1, the second terminal of the capacitor C1, and the first terminal of the light-emitting element EL1 is denoted by a node N3.

In the description below, a potential difference between the first gate and the second terminal of the transistor M1 (a potential difference between the node N1 and the node N3) is $V_{GS}$, and a potential difference between the second gate and the second terminal of the transistor M1 (a potential difference between the node N2 and the node N3) is $V_{BGS}$.

Throughout the periods P1 to P4, the wiring L1 is supplied with $V_{DATA}$; the wiring L2 is supplied with a potential $V_0$; the wiring L3 is supplied with the potential $V_{ANO}$; the wiring L4 is supplied with the potential $V_{CAT}$; and the wiring L5 is supplied with a potential $V_1$.

First, in the period P1, the pixel 20a is initialized. The wiring GL1 is supplied with an L level, the wiring GL2 is supplied with an H level, and the wiring GL3 is supplied with an H level. The switches S2 to S4 are turned on, and the switch S1 is turned off (FIG. 4A).

Thus, the node N1 and the node N3 have the same potential, and $V_{GS}$ is 0 V. The nodes N1 and N3 are supplied with $V_1$, and the node N2 is supplied with $V_0$. In the period P1, $V_1$ is preferably low enough to prevent the light-emitting element EL1 from emitting light. In particular, $V_1-V_{CAT}$ is preferably lower than $V_{EL}$ (the threshold voltage of the light-emitting element EL1).

Figure 5:
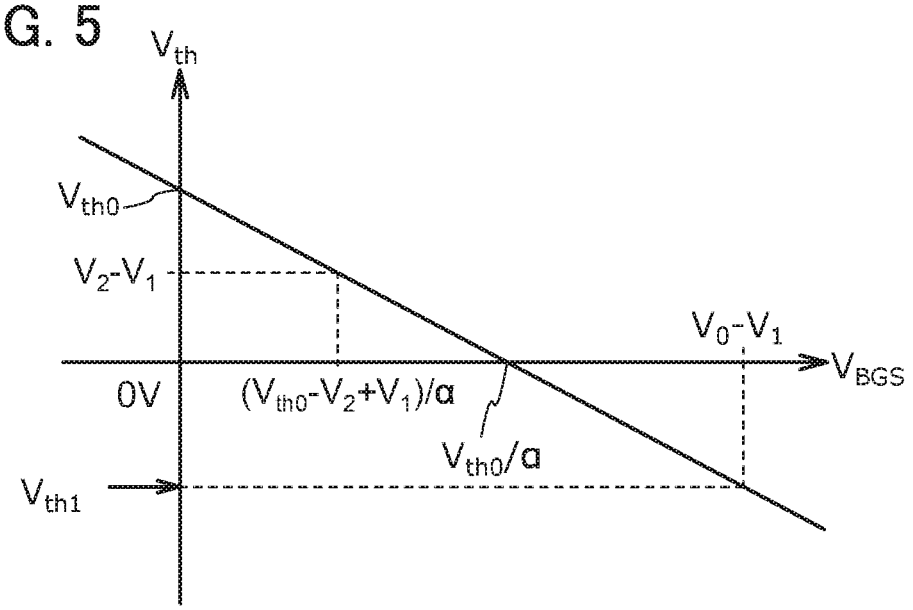
FIG. 5 shows the relationship between $V_{BGS}$ and $V_{th}$.

A relation between $V_{BGS}$ and $V_{th}$ (the threshold voltage of the transistor M1) will be described with reference to FIG. 5. FIG. 5 shows that $V_{th}$ depends on $V_{BGS}$. As $V_{BGS}$ increases, $V_{th}$ is shifted more in the negative direction. $V_{th}$ at $V_{BGS}=V_0-V_1$ in the period P1 is denoted by $V_{th1}$. $V_0-V_1$ is preferably high enough to make $V_{th1}$ have a negative value. When $V_{th1}$ has a negative value, the transistor M1 is on at $V_{GS}=0$ V.

Next, $V_{th}$ of the transistor M1 in the pixel 20a is fixed at 0 V in the period P2. The wirings GL1 and GL3 are supplied with an L level, and the wiring GL2 is supplied with the H level. The switches S1 and S4 are turned off, and the switches S2 and S3 are turned on (FIG. 4B).

Current flows through the transistor M1, and the potential of the node N3 increases. As the potential of the node N3 increases, $V_{BGS}$ decreases and $V_{th}$ of the transistor M1 is shifted from $V_{th1}$ in the positive direction as shown in FIG. 5. The capacitor C1 keeps $V_{GS}$ at 0 V; accordingly, $V_{GS}$ is equal to $V_{th1}$ n the case of $V_{th}=0$ V, so that the transistor M1 is turned off and the potential of the node N3 stops increasing.

In FIG. 5, the following relationship is satisfied when $V_{th}$ at $V_{BGS}=0$ V is denoted by $V_{th0}$.

$$V_{th}=V_{th0}-\alpha V_{BGS} \quad (1)$$

In Formula (1), α is a constant determined by the capacitance of a gate insulating film or the like. In the case where $V_{th}=0$, Formula (1) can be modified into $V_{BGS}=V_{th0}/\alpha$ (FIG. 5).

In the period P2, no current preferably flows to the light-emitting element EL1. Therefore, $V_0-V_{CAT}$ is preferably lower than $V_{th0}/\alpha+V_{EL}$.

In the period P3, data is written to the pixel 20a. The wirings GL1 and GL3 are supplied with an H level, and the wiring GL2 is supplied with an L level. The switches S1 and S4 are turned on, and the switches S2 and S3 are turned off. The node N1 is supplied with $V_{DATA}$ through the switch S1, and the node N3 is supplied with $V_1$ again through the switch S4 (FIG. 4C). $V_{GS}$ is equal to $V_{DATA}-V_1$.

At that time, the potential of the node N2 becomes $V_{DATA}-V_{th0}/a$ by bootstrapping. Thus, $V_{BGS}$ becomes equal to $V_{DATA}+V_{th0}/\alpha-V_1$. The first gate and the second gate of the transistor M1 are supplied with a $V_{DATA}$-dependent potential. In other words, the transistor M1 is brought into a dual-gate driving state (i.e., driven with the two gates). A transistor driven with two gates shows a larger on-state current than a transistor driven with a single gate.

Next, in the period P4, light is emitted from the pixel 20a in accordance with $V_{DATA}$ written in the period P3. The wirings GL1 to GL3 are supplied with the L potential, and the switches S1 to S4 are turned off.

Since $V_{th}$ of the transistor M1 is corrected to be 0 V in the period P2, in the light-emitting element EL1, light emission which does not depend on $V_{th}$ of the transistor M1 can be obtained. Since the dual-gate driving of the transistor M1 is performed, the transistor M1 allows a larger current to flow therethrough.

When the dual-gate driving of the transistor M1 is performed, the transistor M1 allows a larger current to flow therethrough with a smaller channel width, and the area occupied by the transistor M1 can be decreased. The decrease in the area occupied by the transistor M1 leads to a decrease in the area occupied by the pixel 20a and an increase in resolution of the display device.

In the case where light from the light-emitting element EL1 is blocked by the transistor M1 (in the case where the display device has a bottom emission structure), the decrease in the area occupied by the transistor M1 leads to an increase in aperture ratio of the display device and an increase in display quality of the display device.

The pixel 20a may supply a current $I_{PIX}$, which flows through the transistor M1, to an external circuit through the switch S4 and the wiring L5. The external circuit can supply a correction signal based on the current $I_{PIX}$ to the wiring L1. With the above structure, variation due to the mobility of the transistor M1 as well as variation due to $V_{th}$ of the transistor M1 can be corrected in the pixel 20a.

In the display device including the pixel 20a, variation in luminance among the pixels can be suppressed. The display device can have a high resolution, a high aperture ratio, or a high display quality.

<Configuration Example of Pixel 21a>

In the pixel 20a illustrated in FIG. 2A, the switch S3 may be omitted. A configuration example in that case is illustrated in FIG. 6A.

Figure 6A:
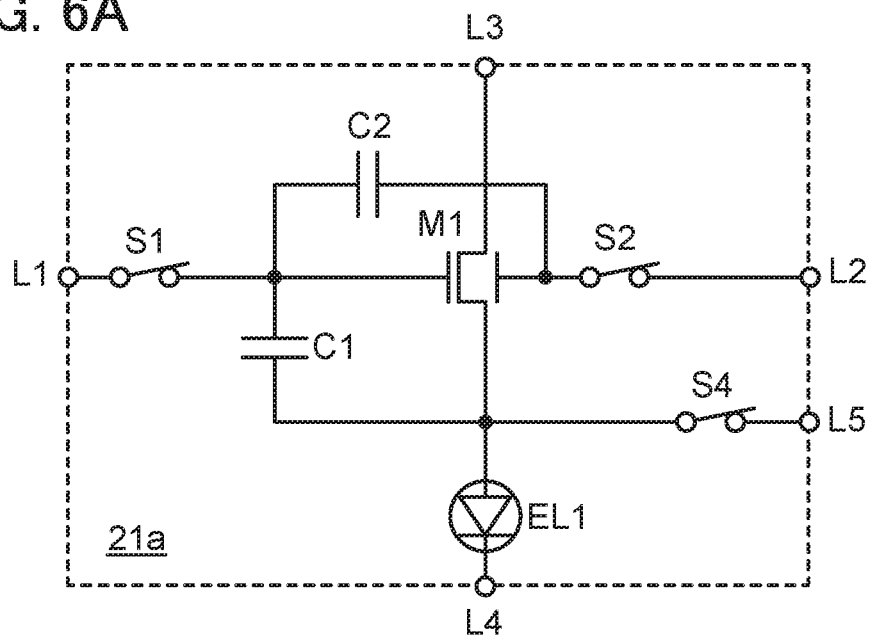
FIGS. 6A and 6B are circuit diagrams each illustrating a configuration example of a pixel.

FIG. 6A illustrates a configuration example of a pixel 21a included in a display device according to one embodiment of the present invention. The pixel 21a in FIG. 6A includes the transistor M1, the switch S1, the switch S2, the switch S4, the capacitor C1, the capacitor C2, and the light-emitting element EL1. The pixel 21a is electrically connected to the wiring L1, the wiring L2, the wiring L3, the wiring L4, and the wiring L5. The transistor M1 includes the first gate and the second gate. A region of the first gate and a region of the second gate overlap with each other with a channel formation region of the transistor M1 therebetween.

Figure 6B:
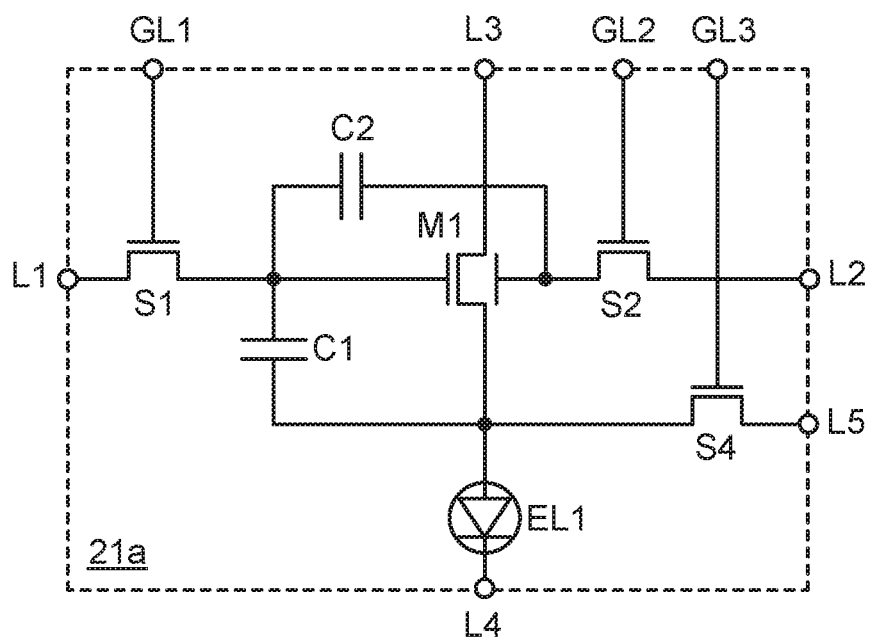

FIG. 6B illustrates a more specific configuration example of the pixel 21a. FIG. 6B is a circuit diagram in which the switches S1, S2, and S4 in FIG. 6A are n-channel transistors. A gate of the switch S1 is electrically connected to the wiring GL1, a gate of the switch S2 is electrically connected to the wiring GL2, and a gate of the switch S4 is electrically connected to the wiring GL3.

The pixel 21a differs from the pixel 20a illustrated in FIGS. 2A and 2B in not including the switch S3 and in being capable of setting $V_{th}$ of the transistor M1 to a value other than 0 V. The other components are the same as those of the pixel 20a, for which the description of the pixel 20a can be referred to.

<Operation Example of Pixel 21a>

Next, an example of the operation of the pixel 21a will be described with reference to FIG. 7 and FIGS. 8A to 8C. Note that in FIGS. 8A to 8C, the same reference signs as those in FIGS. 4A to 4C are used to denote the same potentials (or potential differences).

Figure 8A:
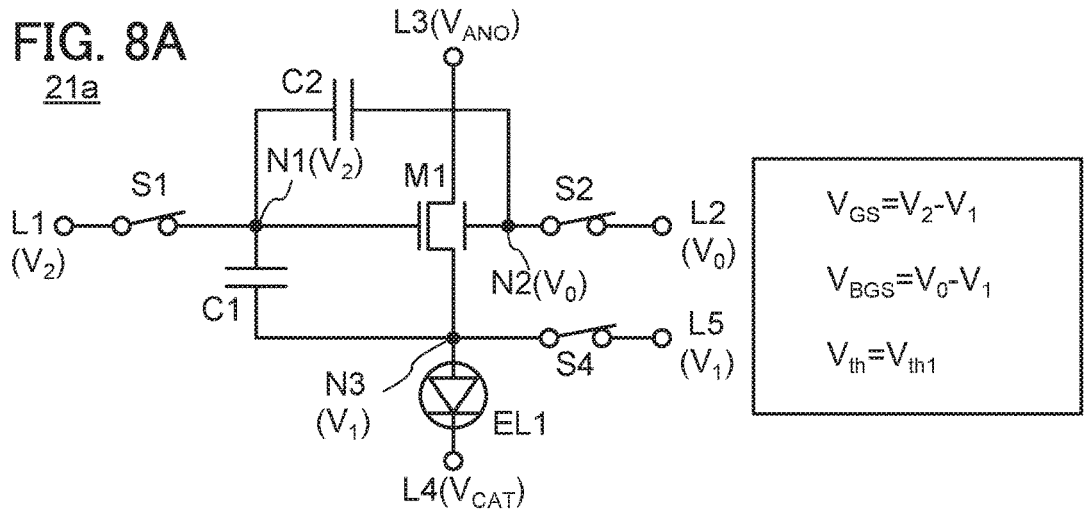
FIGS. 8A to 8C are circuit diagrams illustrating an operation example of a pixel.
Figure 8B:
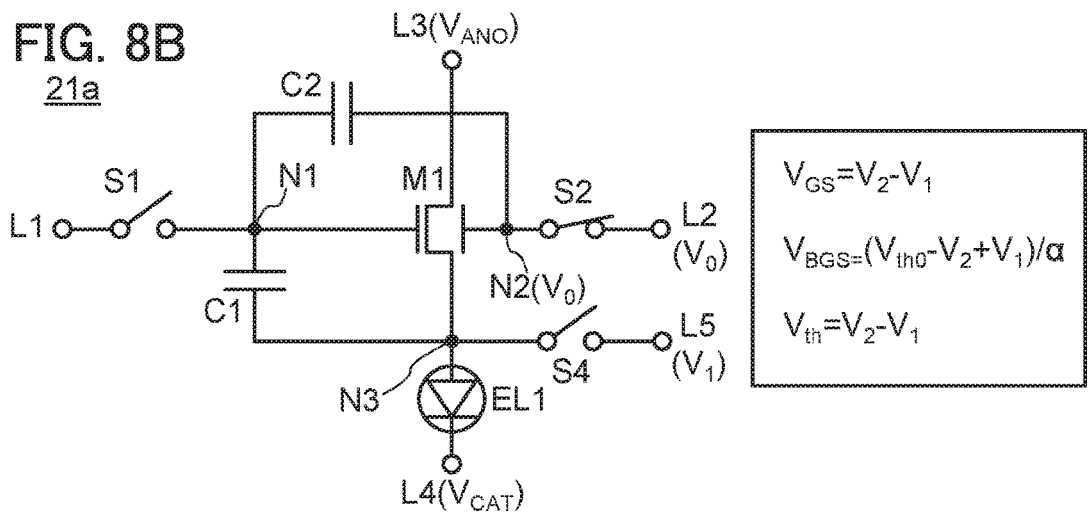
Figure 8C:
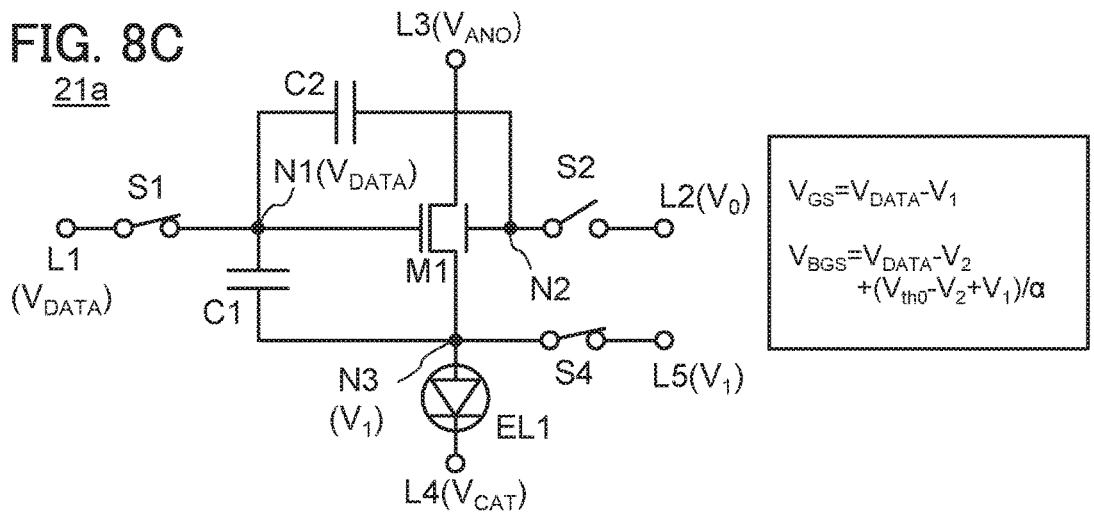

FIG. 7 is a timing chart showing a potential supplied to the wiring L1, potentials supplied to the wirings GL1 to GL3, and a potential supplied to the wiring L3. The timing chart in FIG. 7 illustrates periods P1 to P4. FIG. 8A illustrates the state of the pixel 21a in the period P1. FIG. 8B illustrates the state of the pixel 21a in the period P2. FIG. 8C illustrates the state of the pixel 21a in the period P3. To simply show the operation of the pixel 21a, each of the switches S1, S2, and S4 is illustrated as a switch in FIGS. 8A to 8C.

The period P1 is a period for initializing the pixel 21a. The period P2 is a period for fixing the threshold voltage of the transistor M1 at $V_2-V_1$. The period P3 is a period for writing data to the pixel 21a. The period P4 is a period for light emission from the pixel 21a.

In FIGS. 8A to 8C, a node of the first gate of the transistor M1, the first terminal of the capacitor C1, and the first terminal of the capacitor C2 is denoted by a node N1; a node of the second gate of the transistor M1 and the second terminal of the capacitor C2 is denoted by a node N2; and a node of the second terminal of the transistor M1, the second terminal of the capacitor C1, and the first terminal of the light-emitting element EL1 is denoted by a node N3.

Throughout the periods P1 to P4, the wiring L2 is supplied with $V_0$; the wiring L3 is supplied with $V_{ANO}$; the wiring L4 is supplied with $V_{CAT}$; and the wiring L5 is supplied with $V_1$.

First, in the period P1, the pixel 21a is initialized. The wiring GL1 is supplied with an H level, the wiring GL2 is supplied with an H level, and the wiring GL3 is supplied with an H level. The switches S1, S2, and S4 are turned on (FIG. 8A).

At this time, the wiring L1 is supplied with a given fixed potential (a potential $V_2$). The node N1 is supplied with $V_2$; the node N2 is supplied with $V_0$; and the node N3 is supplied with $V_1$. Then, $V_{GS}$ is equal to $V_2-V_1$, and $V_{BGS}$ is equal to $V_0-V_1$. The threshold voltage of the transistor M1 is $V_{th1}$.

Next, $V_{th}$ of the transistor M1 in the pixel 21a is fixed at $V_2-V_1$ in the period P2. The wirings GL1 and GL3 are supplied with an L level, and the wiring GL2 is supplied with the H level. The switches S1 and S4 are turned off, and the switch S2 is turned on. The node N2 is supplied with $V_0$ (FIG. 8B).

At this time, current flows through the transistor M1, and the potential of the node N3 increases. The capacitor C1 keeps $V_{GS}$ at $V_2-V_1$; accordingly, $V_{GS}$ is equal to $V_{th1}$ in the case of $V_{th}=V_2-V_1$, so that the transistor M1 is turned off and the potential of the node N3 stops increasing. At that time, $V_{BGS}$ is $(V_{th0}-V_2+V_1)/\alpha$ (FIG. 5 and FIG. 8B).

In the period P3, data is written to the pixel 21a. The wirings GL1 and GL3 are supplied with the H level, and the wiring GL2 is supplied with an L level. The switches S1 and S4 are turned on, and the switch S2 is turned off. The node N1 is supplied with $V_{DATA}$ through the switch S1, and the node N3 is supplied with $V_1$ again through the switch S4. Then, $V_{GS}$ is equal to $V_{DATA}$ $V_1$, and $V_{BGS}$ is equal to $V_{DATA}-V_2+(V_{th0}-V_2+V_1)/\alpha$ (FIG. 8C).

The first gate and the second gate of the transistor M1 are supplied with a $V_{DATA}$-dependent potential. In other words, the transistor M1 is brought into a dual-gate driving state.

Since $V_{th}$ of the transistor M1 is corrected to be $V_2-V_1$ in the period P2, in the light-emitting element ELL light emission which does not depend on $V_{th}$ of the transistor M1 can be obtained. Since the dual-gate driving of the transistor M1 is performed, the transistor M1 allows a larger current to flow therethrough.

When the dual-gate driving of the transistor M1 is performed, the transistor M1 allows a larger current to flow therethrough with a smaller channel width, and the area occupied by the transistor M1 can be decreased. The decrease in the area occupied by the transistor M1 leads to a decrease in the area occupied by the pixel 21a and an increase in resolution of the display device.

In the case where light from the light-emitting element EL1 is blocked by the transistor M1, the decrease in the area occupied by the transistor M1 leads to an increase in aperture ratio of the display device and an increase in display quality of the display device.

The pixel 21a may supply a current $I_{PIX}$, which flows through the transistor M1, to an external circuit through the switch S4 and the wiring L5. The external circuit can supply a correction signal based on the current $I_{PIX}$ to the wiring L1. With the above structure, variation due to the mobility of the transistor M1 as well as variation due to $V_{th}$ of the transistor M1 can be corrected in the pixel 21a.

In the display device including the pixel 21a, variation in luminance among the pixels can be suppressed. The display device can have a high resolution, a high aperture ratio, or a high display quality.

<Configuration Example of Pixel 22a>

In the pixel 20a illustrated in FIG. 2A, the switch S4 and the wiring L5 may be omitted. A configuration example in that case is illustrated in FIG. 9A.

Figure 9A:
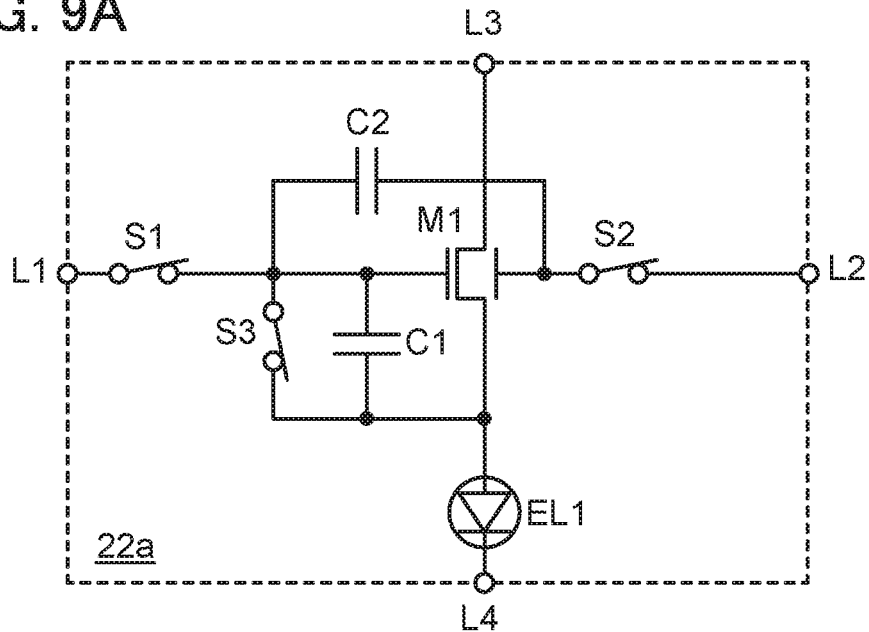
FIGS. 9A and 9B are circuit diagrams each illustrating a configuration example of a pixel.

FIG. 9A illustrates a configuration example of a pixel 22a included in a display device according to one embodiment of the present invention. The pixel 22a in FIG. 9A includes the transistor M1, the switch S1, the switch S2, the switch S3, the capacitor C1, the capacitor C2, and the light-emitting element EL1. The pixel 22a is electrically connected to the wiring L1, the wiring L2, the wiring L3, and the wiring L4. The transistor M1 includes the first gate and the second gate. A region of the first gate and a region of the second gate overlap with each other with a channel formation region of the transistor M1 therebetween.

Figure 9B:
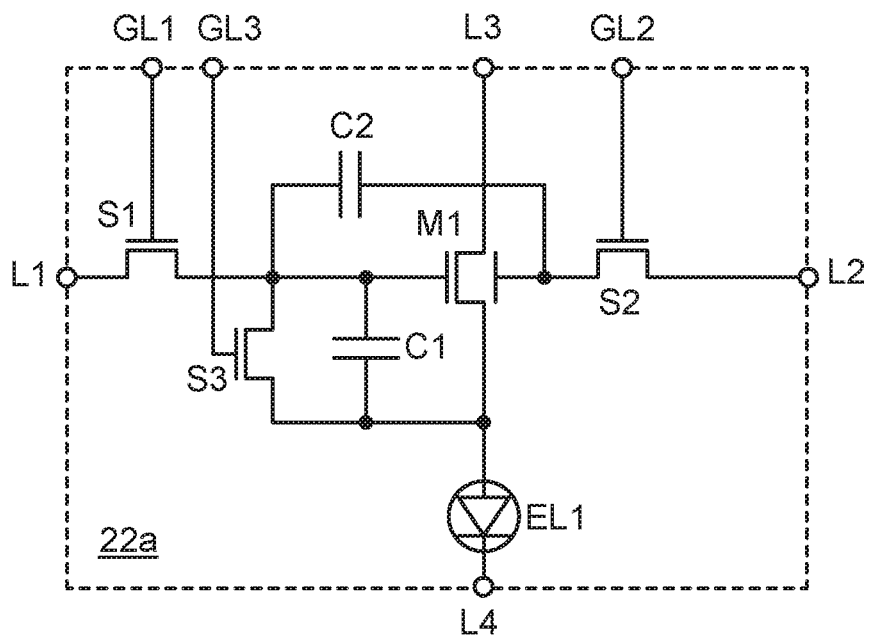

FIG. 9B illustrates a more specific configuration example of the pixel 22a. FIG. 9B is a circuit diagram in which the switches S1 to S3 in FIG. 9A are n-channel transistors. A gate of the switch S1 is electrically connected to the wiring GL1, a gate of the switch S2 is electrically connected to the wiring GL2, and a gate of the switch S3 is electrically connected to the wiring GL3.

The pixel 22a differs from the pixel 20a illustrated in FIGS. 2A and 2B in not including the switch S4 and the wiring L5. The other components are the same as those of the pixel 20a, for which the description of the pixel 20a can be referred to.

<Operation Example of Pixel 22a>

Next, an example of the operation of the pixel 22a will be described with reference to FIG. 10 and FIGS. 11A to 11C. Note that in FIGS. 11A to 11C, the same reference signs as those in FIGS. 4A to 4C or FIGS. 8A to 8C are used to denote the same potentials (or potential differences).

FIG. 10 is a timing chart showing a potential supplied to the wiring L1, potentials supplied to the wirings GL1 to GL3, and a potential supplied to the wiring L3. The timing chart in FIG. 10 illustrates periods P1 to P4. FIG. 11A illustrates the state of the pixel 22a in the period P1. FIG. 11B illustrates the state of the pixel 22a in the period P2. FIG. 11C illustrates the state of the pixel 22a in the period P3. To simply show the operation of the pixel 22a, each of the switches S1 to S3 is illustrated as a switch in FIGS. 11A to 11C.

The period P1 is a period for initializing the pixel 22a. The period P2 is a period for fixing the threshold voltage of the transistor M1 at 0 V. The period P3 is a period for writing data to the pixel 22a. The period P4 is a period for light emission from the pixel 22a.

In FIGS. 11A to 11C, a node of the first gate of the transistor M1 and the first terminal of the capacitor C1 is denoted by a node N1; a node of the second gate of the transistor M1 and the second terminal of the capacitor C2 is denoted by a node N2; and a node of the second terminal of the transistor M1, the second terminal of the capacitor C1, and the first terminal of the light-emitting element EL1 is denoted by a node N3.

Throughout the periods P1 to P4, the wiring L1 is supplied with $V_{DATA}$; the wiring L2 is supplied with $V_0$; and the wiring L4 is supplied with $V_{CAT}$.

First, in the period P1, the pixel 22a is initialized. The wiring GL1 is supplied with an L level, and the wirings GL2 and GL3 are supplied with an H level. The switch S1 is turned off, and the switches S2 and S3 are turned on (FIG. 11A).

The wiring L3 is supplied with a low potential (a potential $V_L$), and the node N2 is supplied with $V_0$. The node N1 and the node N3 have the same potential. When the potential of the nodes N1 and N3 at that time is referred to as a potential $V_3$, $V_{GS}$ is equal to 0 V and $V_{BGS}$ is equal to $V_0-V_3$. The threshold voltage of the transistor M1 is $V_{th2}$. The supply of $V_L$ to the wiring L3 in the period P1 can prevent a current from flowing to the transistor M1 and the light-emitting element EL1.

Next, $V_{th}$ of the transistor M1 in the pixel 22a is fixed at 0 V in the period P2. The wirings GL1 and GL3 are supplied with an L level, and the wiring GL2 is supplied with the H level. The switches S1 and S3 are turned off, and the switch S2 is turned on. The node N2 is supplied with $V_0$. The wiring L3 is supplied with $V_{ANO}$ (FIG. 11B).

At this time, current flows through the transistor M1, and the potential of the node N3 increases. The capacitor C1 keeps $V_{GS}$ at 0 V; accordingly, $V_{GS}$ is equal to $V_{th}$ in the case of $V_{th}=0$ V, so that the transistor M1 is turned off and the potential of the node N3 stops increasing. At that time, $V_{BGS}$ is $V_{th0}/\alpha$.

In the period P3, data is written to the pixel 22a. The wiring GL1 is supplied with an H level, and the wirings GL2 and GL3 are supplied with an L level. The switch S1 is turned on, and the switches S2 and S3 are turned off. The node N1 is supplied with $V_{DATA}$ through the switch S1. When the potential of the node N3 at that time is referred to as a potential $V_4$, $V_{GS}$ is equal to $V_{DATA}-V_4$, and $V_{BGS}$ is equal to $V_{DATA} V_{th0}/\alpha-V_4$ (FIG. 11C).

The first gate and the second gate of the transistor M1 are supplied with a $V_{DATA}$-dependent potential. In other words, the transistor M1 is brought into a dual-gate driving state.

Since $V_{th}$ of the transistor M1 is corrected to be 0 V in the period P2, in the light-emitting element ELL light emission which does not depend on $V_{th}$ of the transistor M1 can be obtained. Since the dual-gate driving of the transistor M1 is performed, the transistor M1 allows a larger current to flow therethrough.

When the dual-gate driving of the transistor M1 is performed, the transistor M1 allows a larger current to flow therethrough with a smaller channel width, and the area occupied by the transistor M1 can be decreased. The decrease in the area occupied by the transistor M1 leads to a decrease in the area occupied by the pixel 22a and an increase in resolution of the display device.

In the case where light from the light-emitting element EL1 is blocked by the transistor M1, the decrease in the area occupied by the transistor M1 leads to an increase in aperture ratio of the display device and an increase in display quality of the display device.

In the display device including the pixel 22a, variation in luminance among the pixels can be suppressed. The display device can have a high resolution, a high aperture ratio, or a high display quality.

<Configuration Example of Pixel 23a>

In the pixel 20a illustrated in FIG. 2A, the switch S3, the switch S4, and the wiring L5 may be omitted. A circuit diagram in that case is illustrated in FIG. 12A.

Figure 12A:
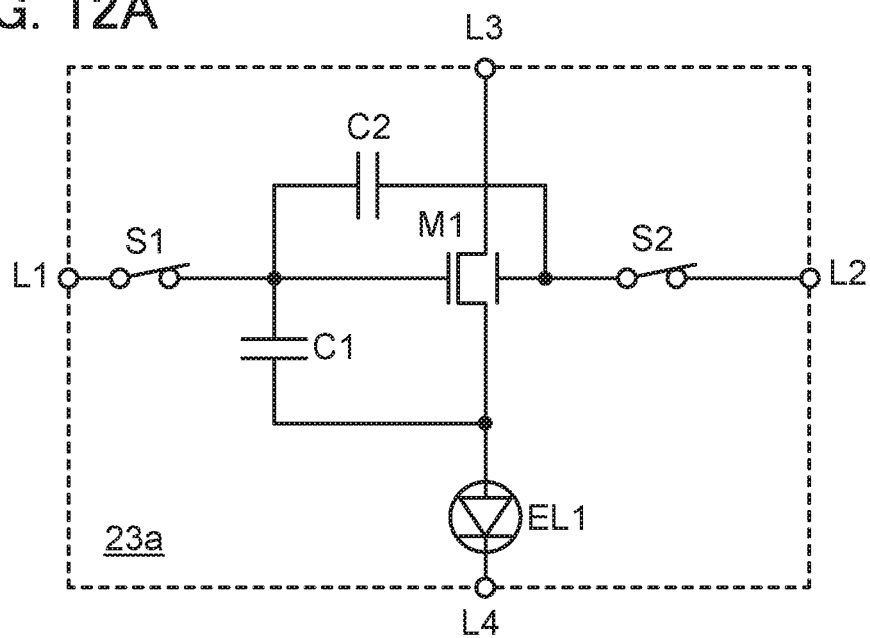
FIGS. 12A and 12B are circuit diagrams each illustrating a configuration example of a pixel.

FIG. 12A illustrates a configuration example of a pixel 23a included in a display device according to one embodiment of the present invention. The pixel 23a in FIG. 12A includes the transistor M1, the switch S1, the switch S2, the capacitor C1, the capacitor C2, and the light-emitting element EL1. The pixel 23a is electrically connected to the wiring L1, the wiring L2, the wiring L3, and the wiring L4. The transistor M1 includes the first gate and the second gate. A region of the first gate and a region of the second gate overlap with each other with a channel formation region of the transistor M1 therebetween.

Figure 12B:
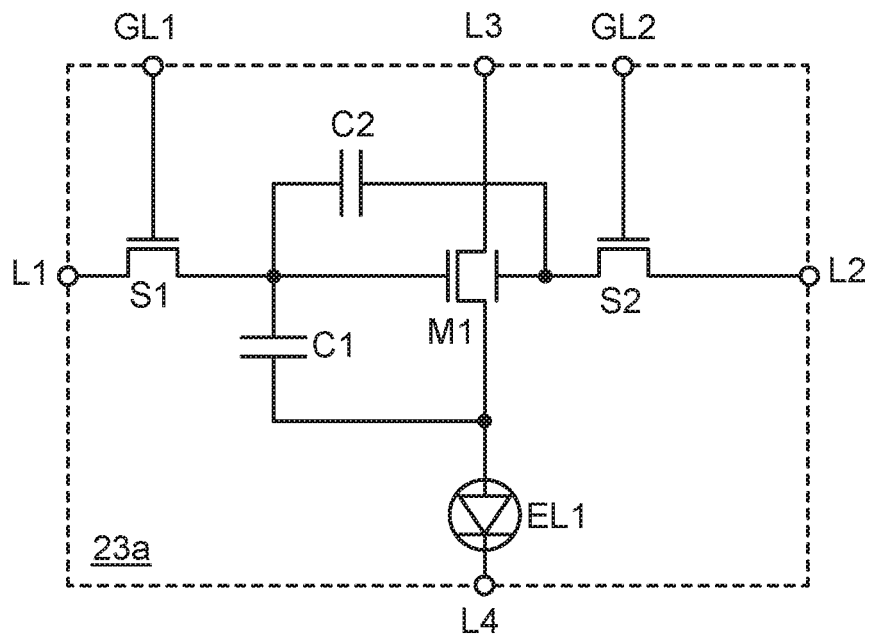

FIG. 12B illustrates a more specific configuration example of the pixel 23a. FIG. 12B is a circuit diagram in which the switches S1 and S2 in FIG. 12A are n-channel transistors. A gate of the switch S1 is electrically connected to the wiring GL1, and a gate of the switch S2 is electrically connected to the wiring GL2.

The pixel 23a differs from the pixel 20a illustrated in FIGS. 2A and 2B in not including the switch S3, the switch S4, and the wiring L5. The other components are the same as those of the pixel 20a, for which the description of the pixel 20a can be referred to.

<Operation Example of Pixel 23a>

Next, an example of the operation of the pixel 23a will be described with reference to FIG. 13 and FIGS. 14A to 14C. Note that in FIGS. 14A to 14C, the same reference signs as those in FIGS. 4A to 4C, FIGS. 8A to 8C, or FIGS. 11A to 11C are used to denote the same potentials (or potential differences).

Figure 14A:
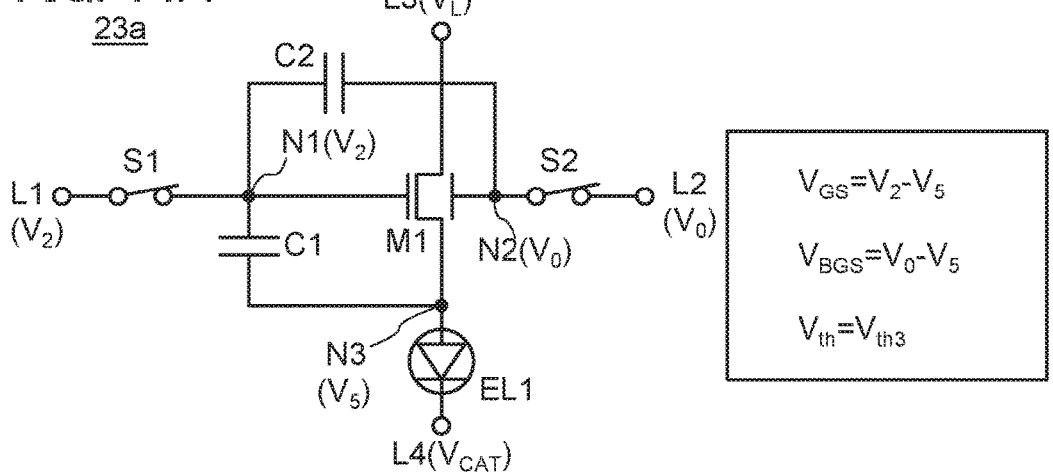
FIGS. 14A to 14C are circuit diagrams illustrating an operation example of a pixel.
Figure 14B:
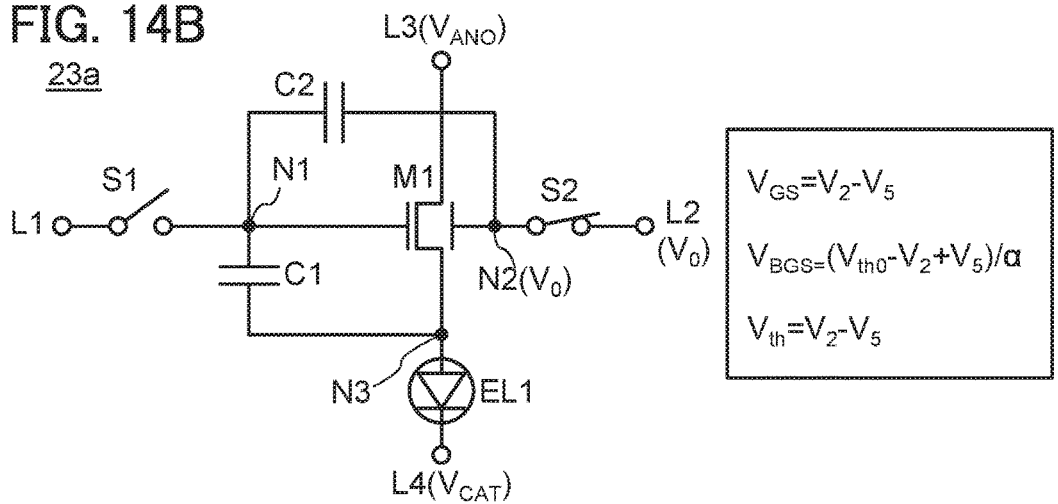
Figure 14C:
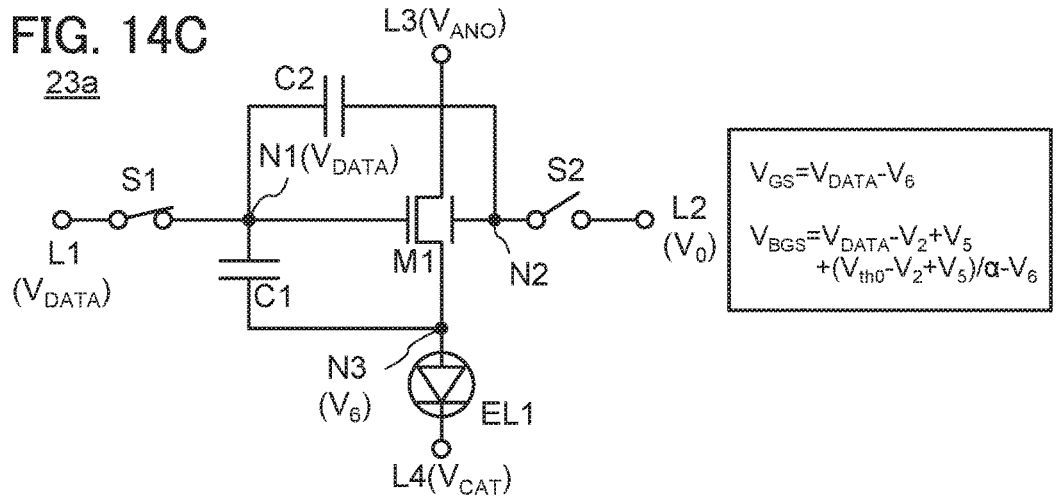
Figure 15A:
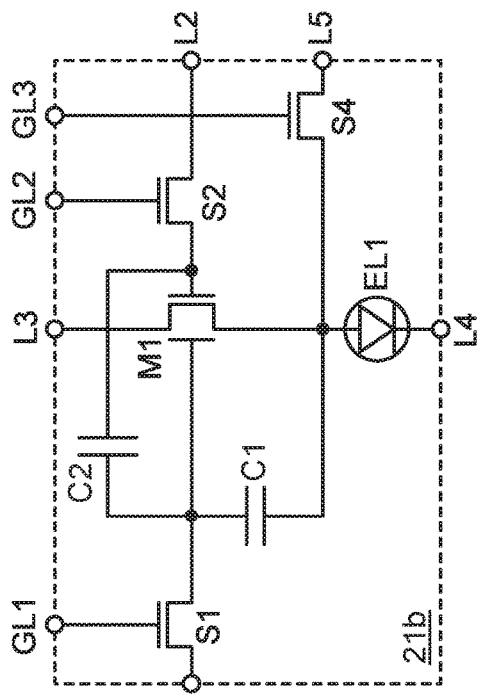
FIGS. 15A to 15D are circuit diagrams each illustrating a configuration example of a pixel.
Figure 15B:
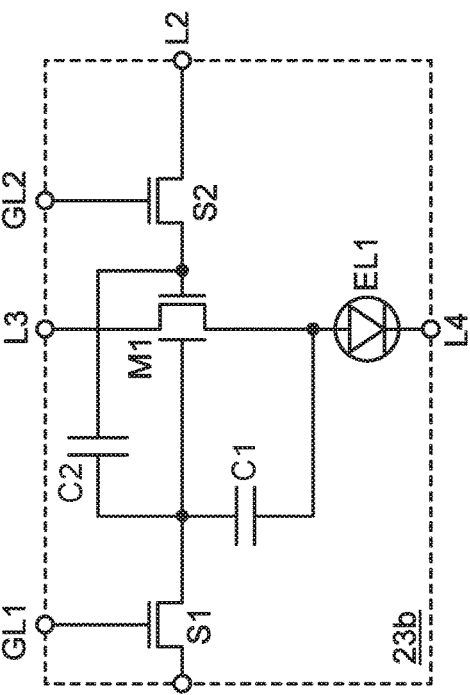
Figure 15C:
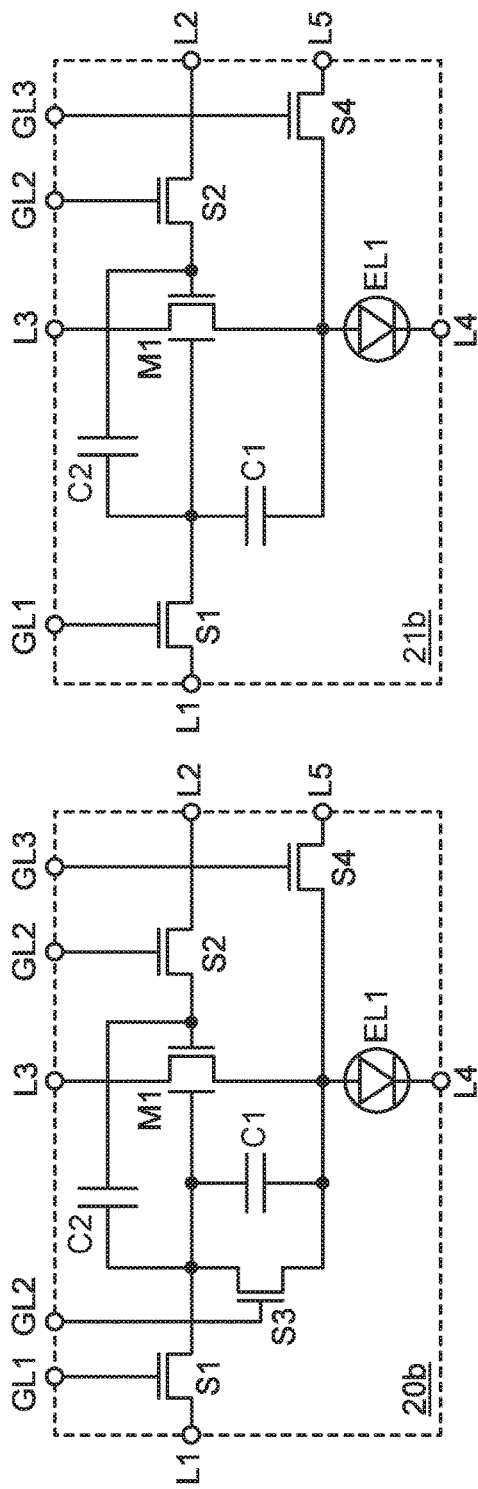
Figure 15D:
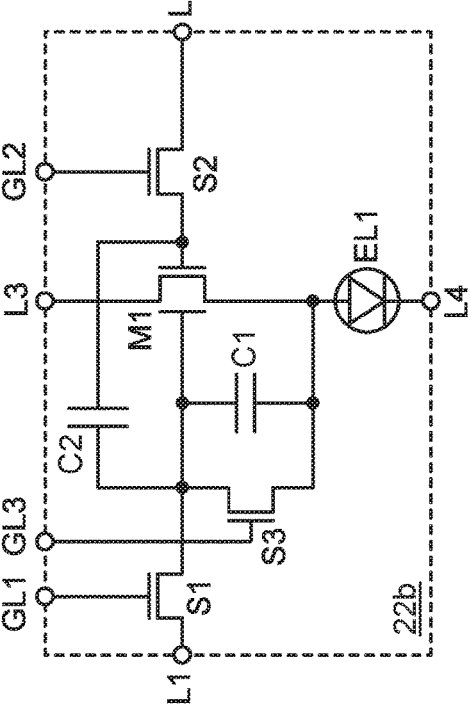
Figure 16A:
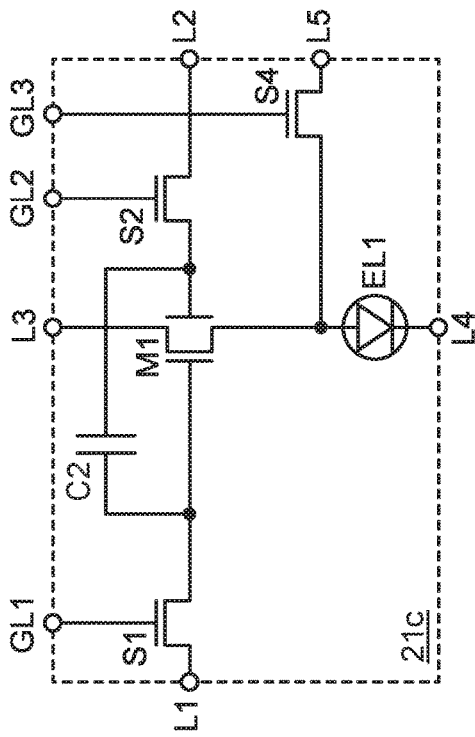
FIGS. 16A to 16D are circuit diagrams each illustrating a configuration example of a pixel.
Figure 16B:
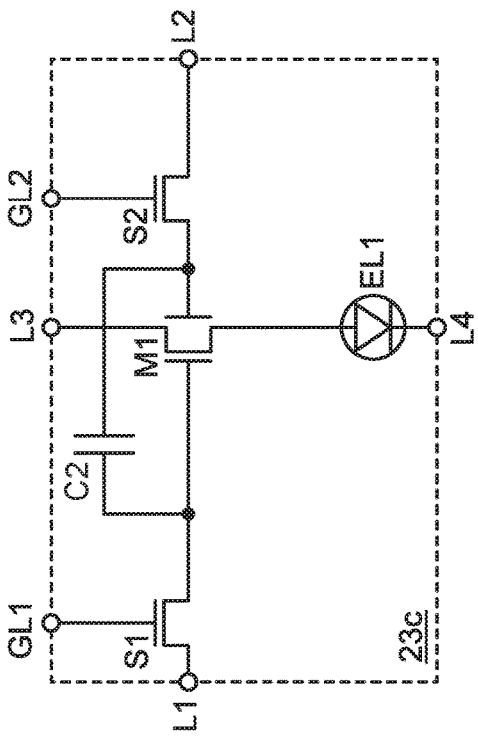
Figure 16C:
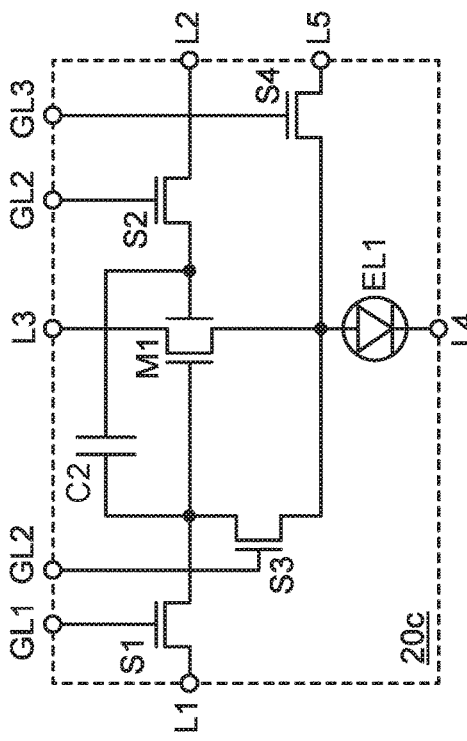
Figure 16D:
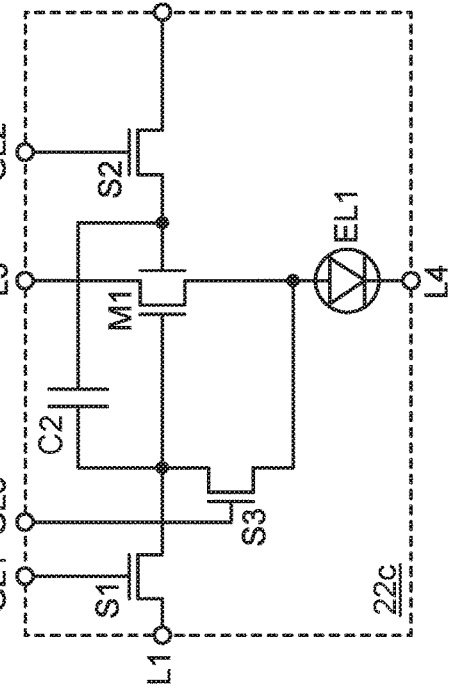
Figure 17A:
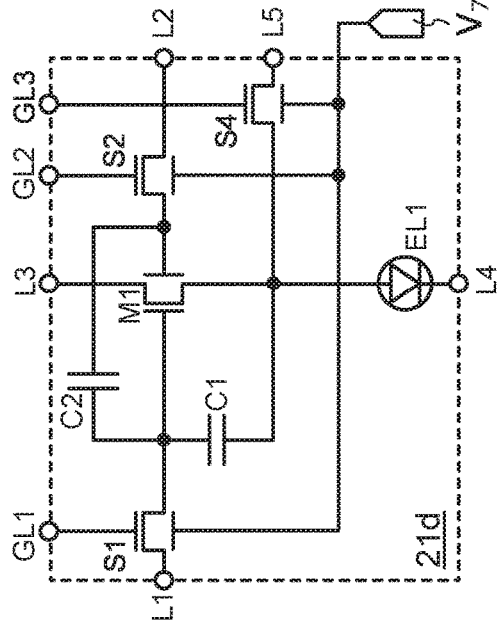
FIGS. 17A to 17D are circuit diagrams each illustrating a configuration example of a pixel.
Figure 17B:
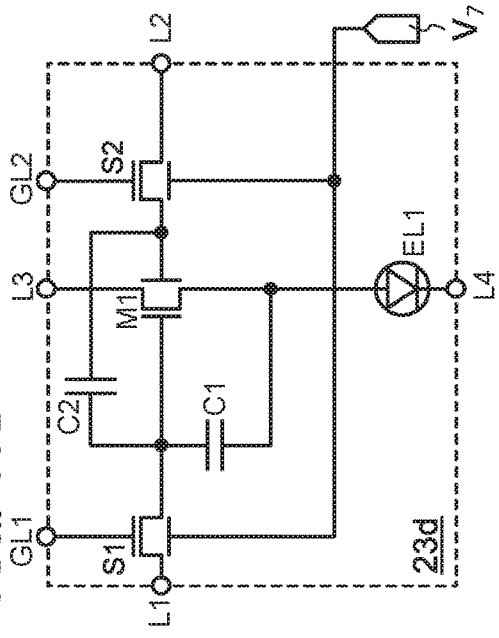
Figure 17C:
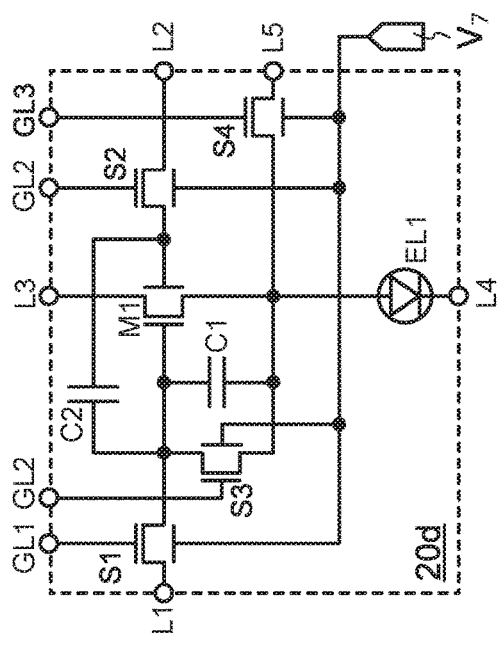
Figure 17D:
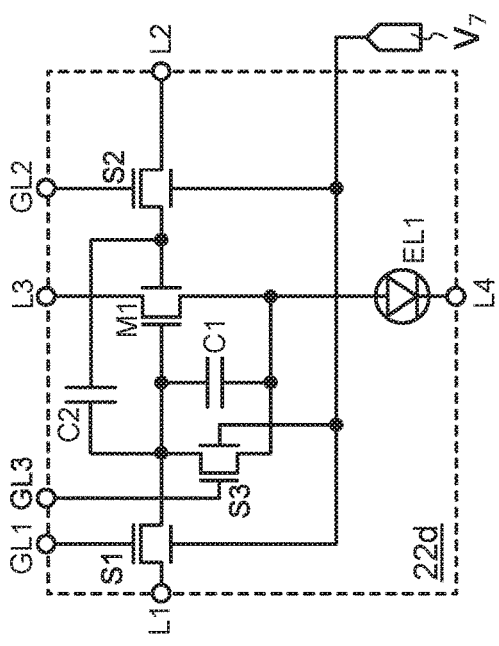
Figure 18B:
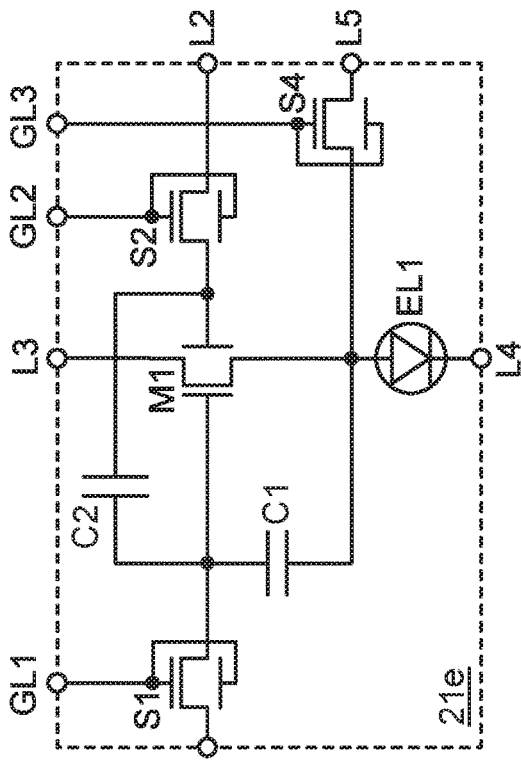
FIGS. 18A to 18D are circuit diagrams each illustrating a configuration example of a pixel.
Figure 18D:
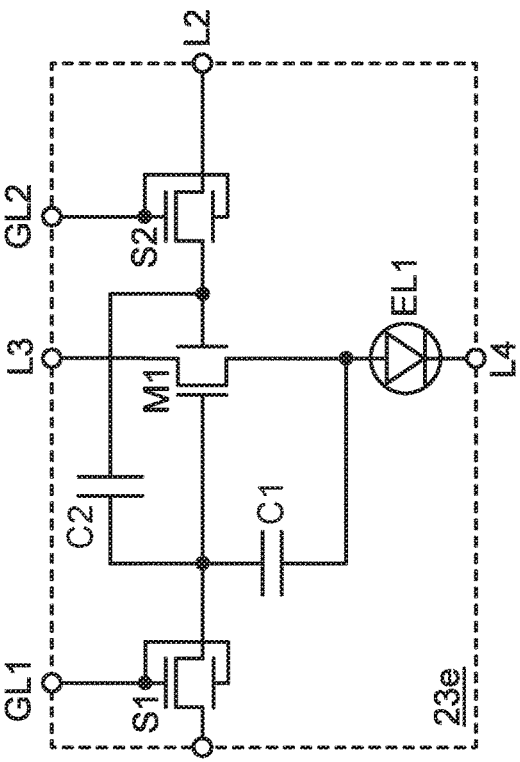
Figure 18A:
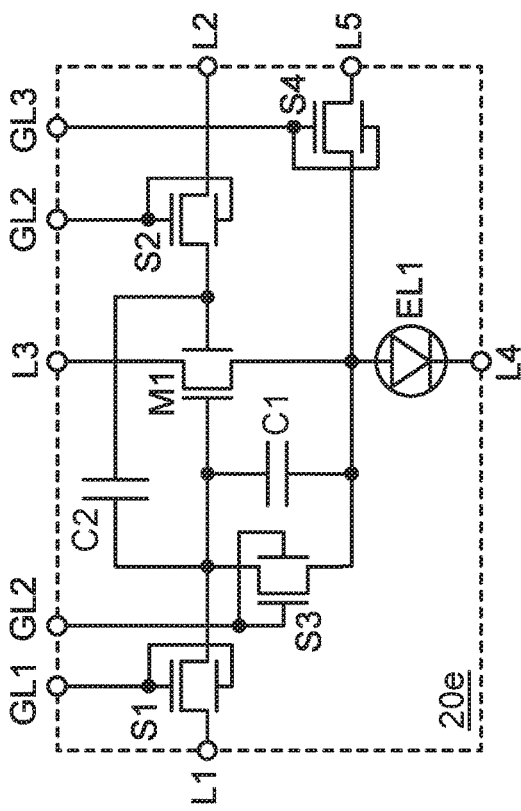
Figure 18C:
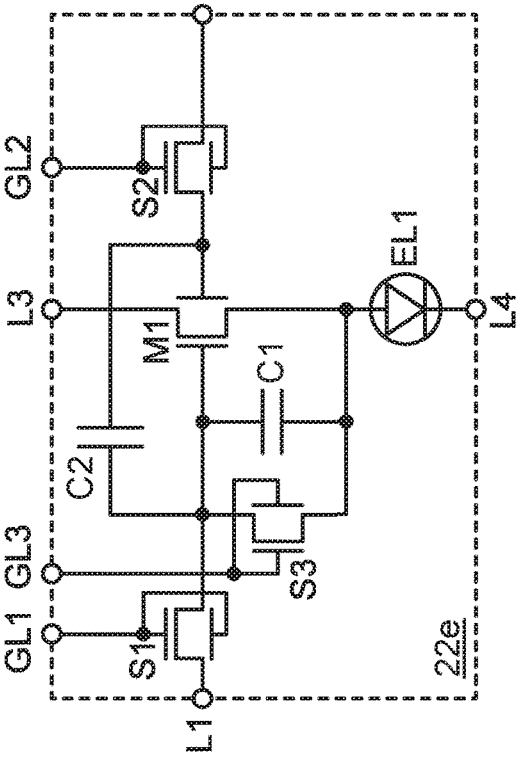
Figure 19A:
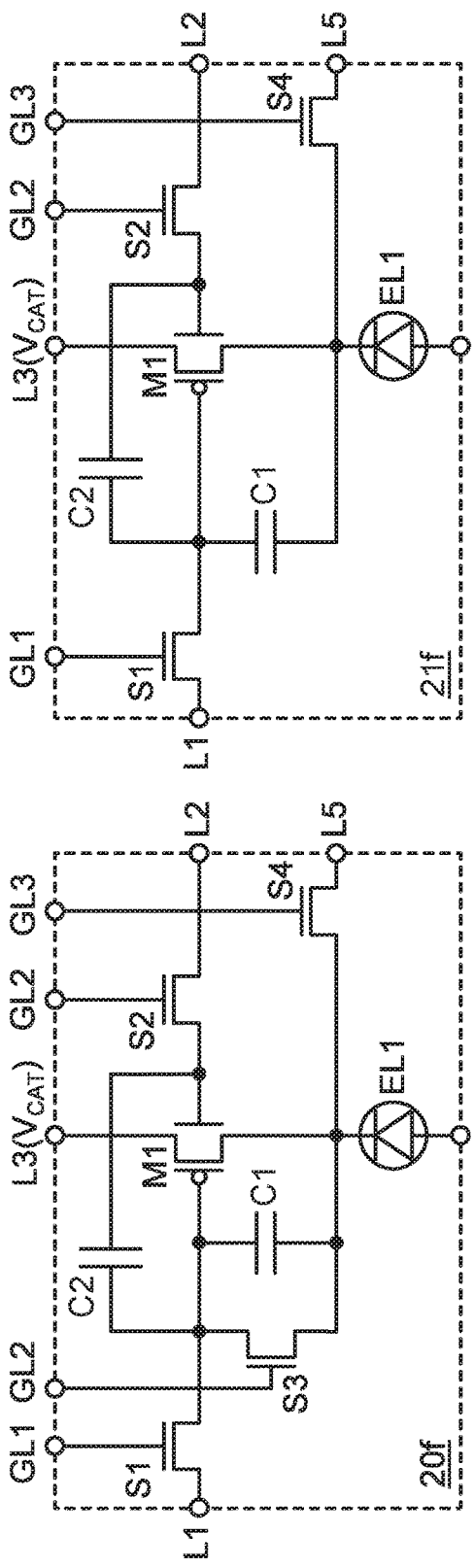
FIGS. 19A to 19D are circuit diagrams each illustrating a configuration example of a pixel.
Figure 19B:
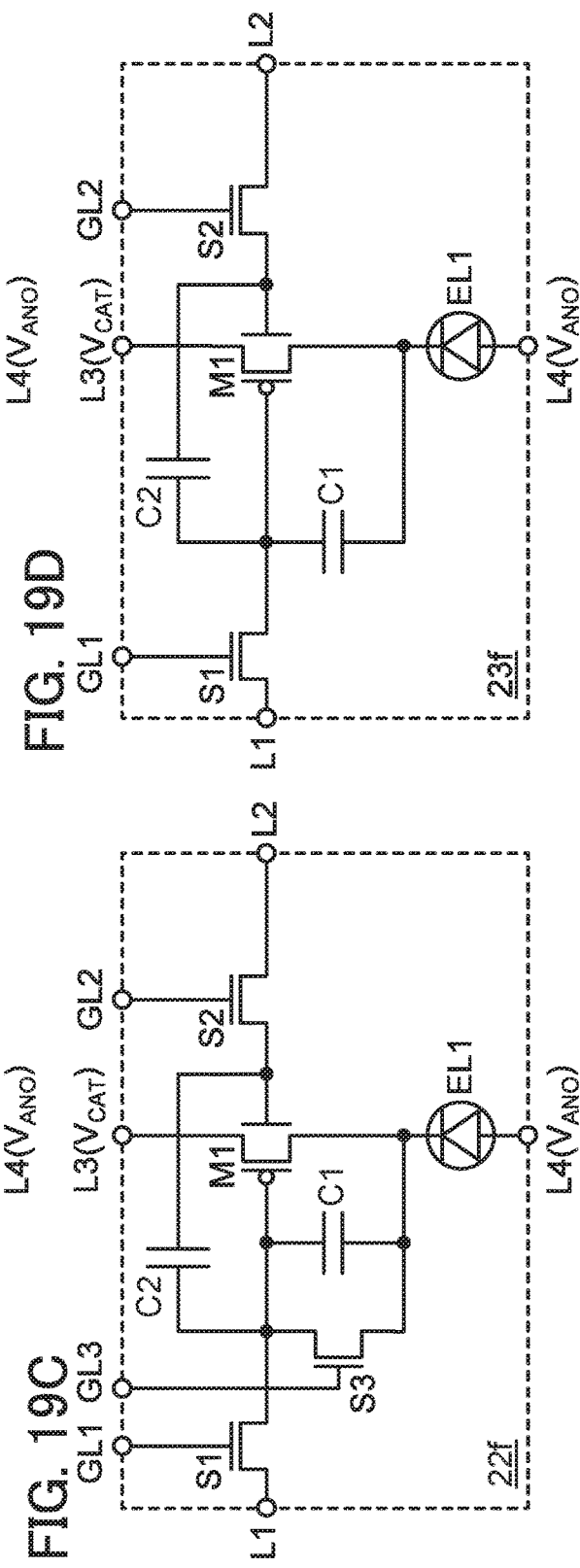
Figure 19C:
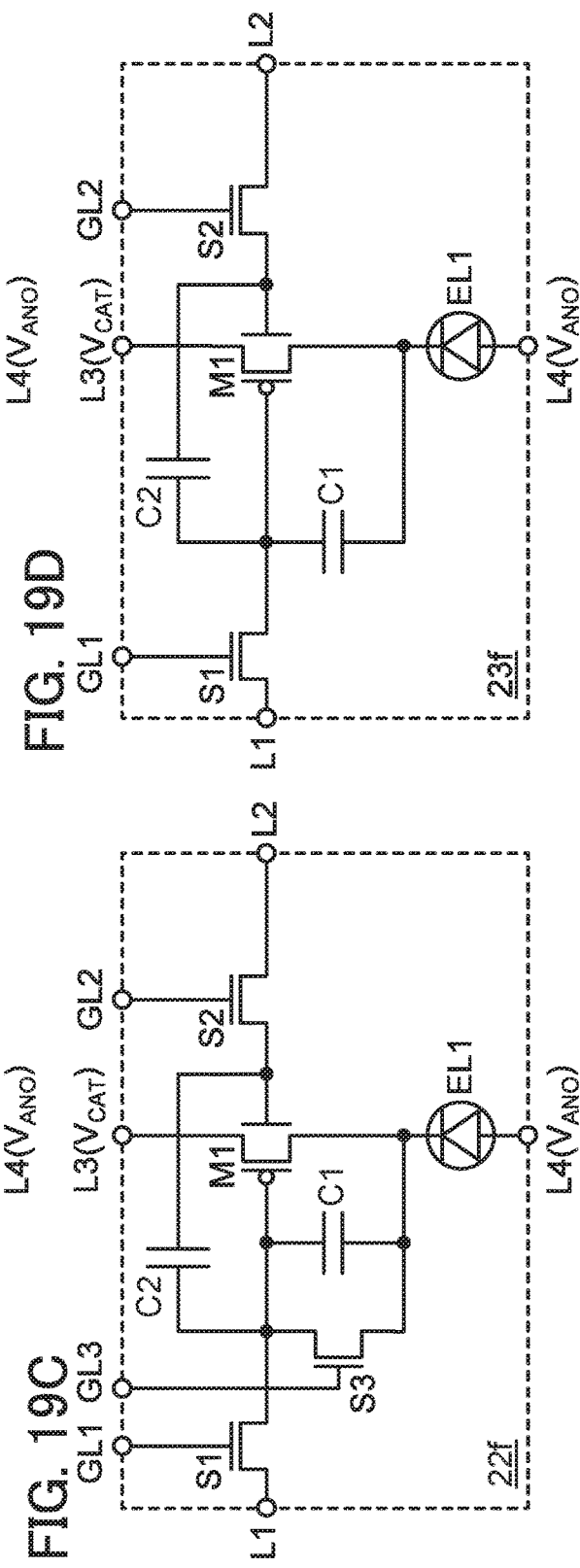
Figure 19D:
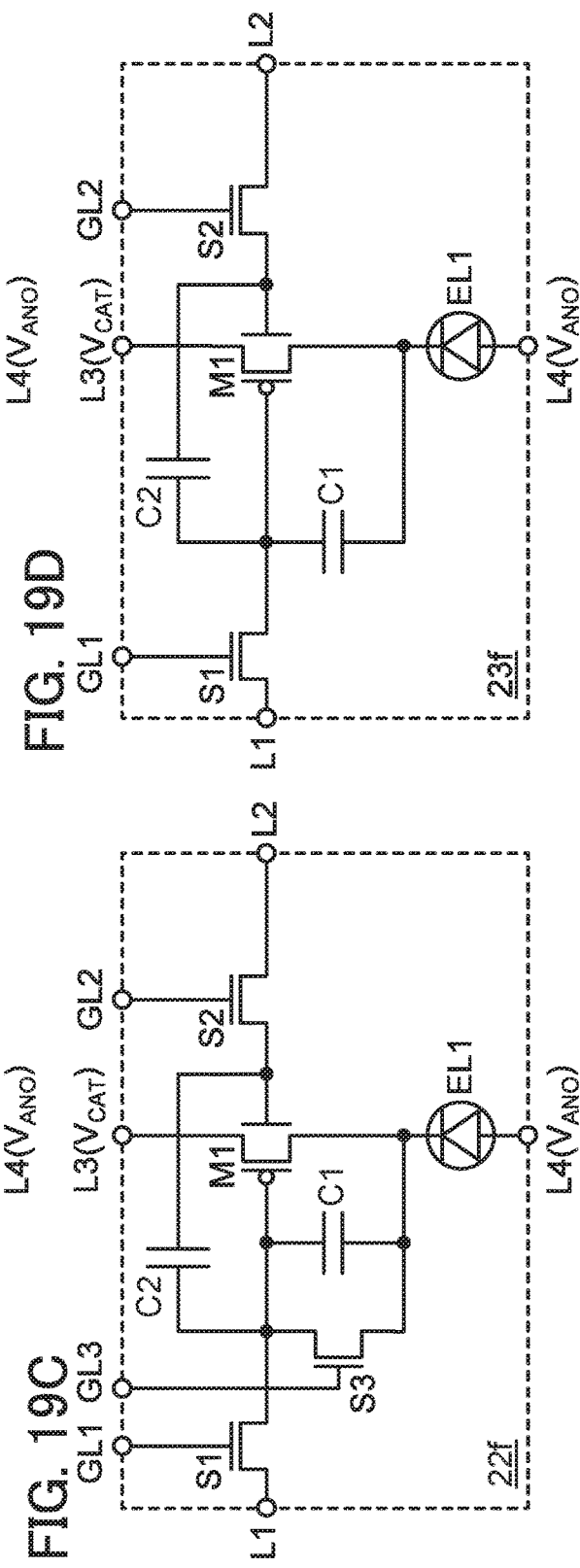
Figure 20A:
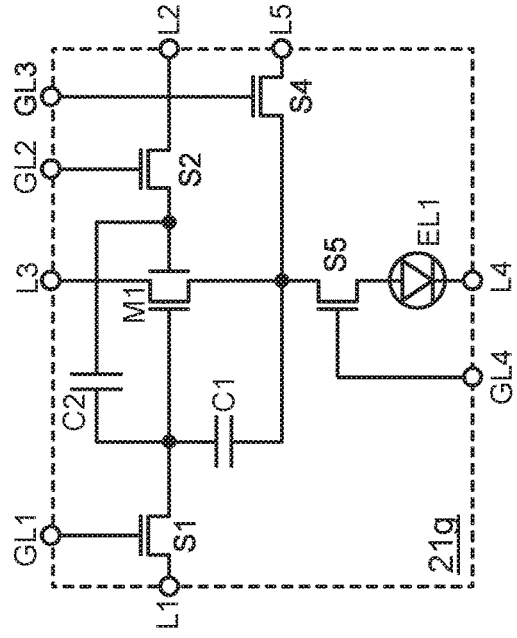
FIGS. 20A to 20D are circuit diagrams each illustrating a configuration example of a pixel.
Figure 20B:
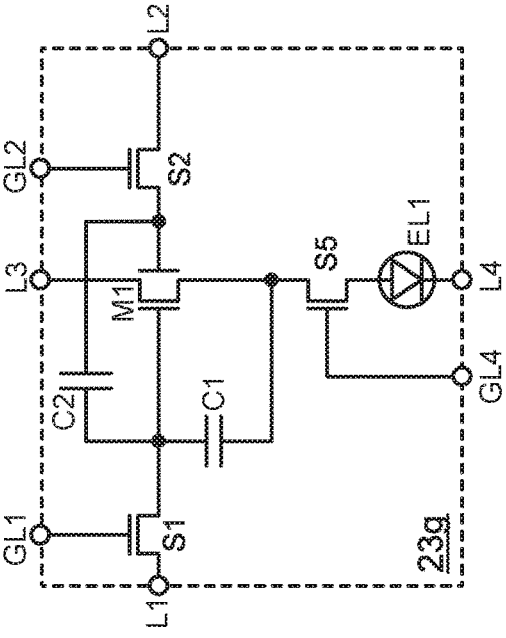
Figure 20C:
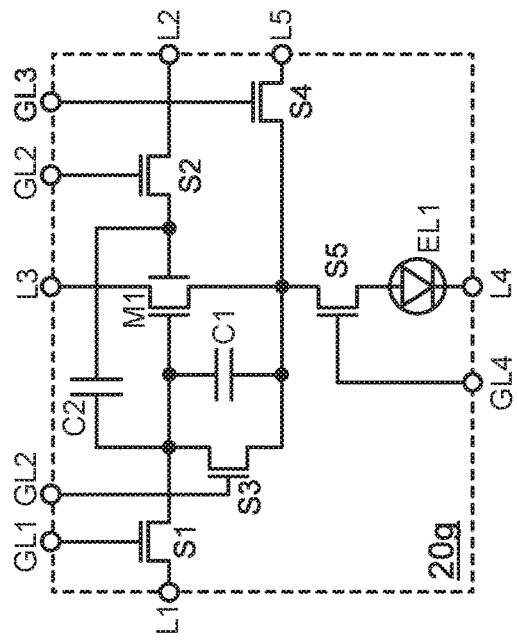
Figure 20D:
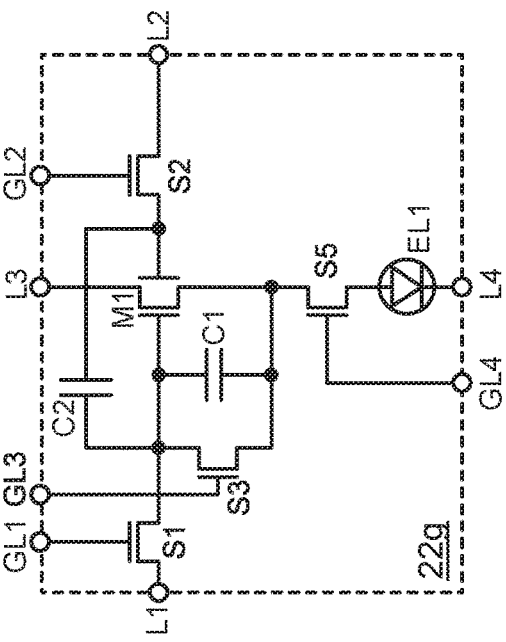
Figure 21A:
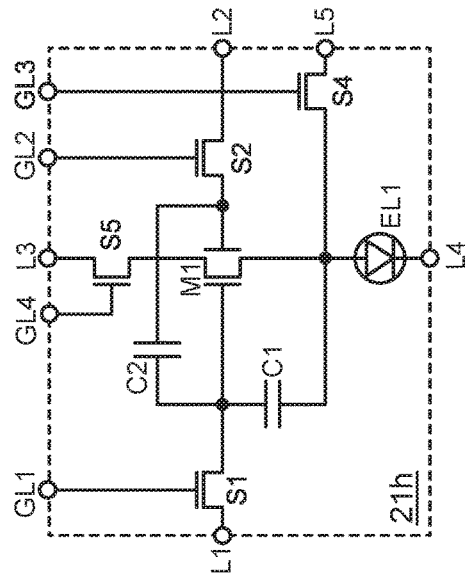
FIGS. 21A to 21D are circuit diagrams each illustrating a configuration example of a pixel.
Figure 21B:
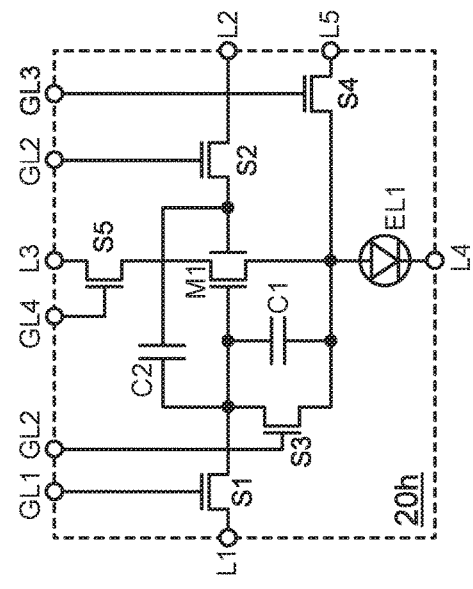
Figure 21C:
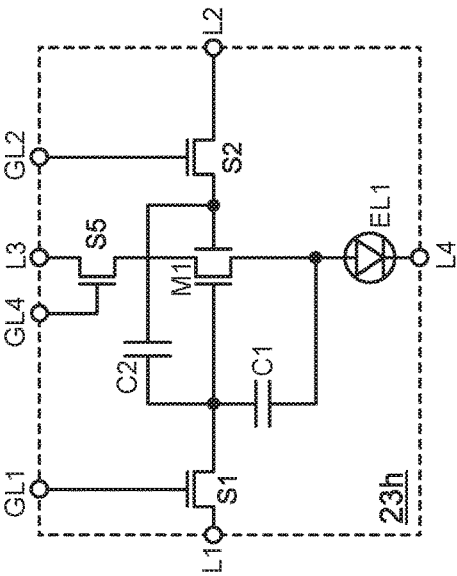
Figure 21D:
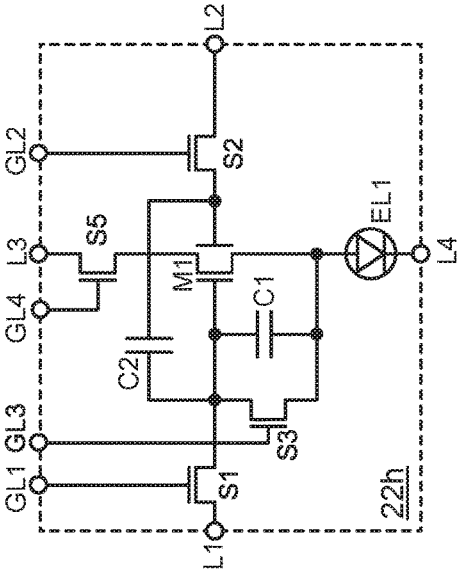
Figure 22A:
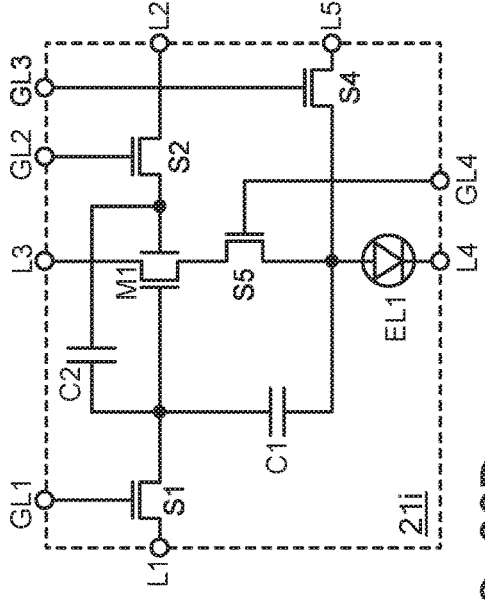
FIGS. 22A to 22D are circuit diagrams each illustrating a configuration example of a pixel.
Figure 22B:
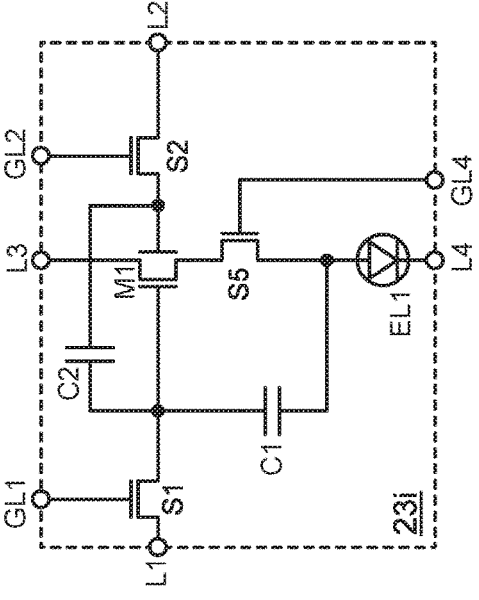
Figure 22C:
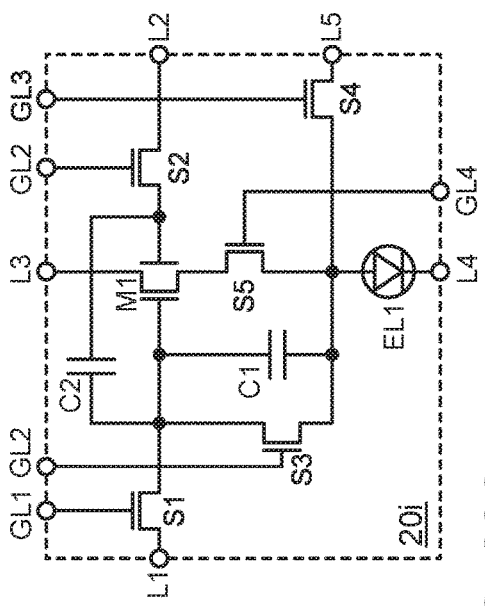
Figure 22D:
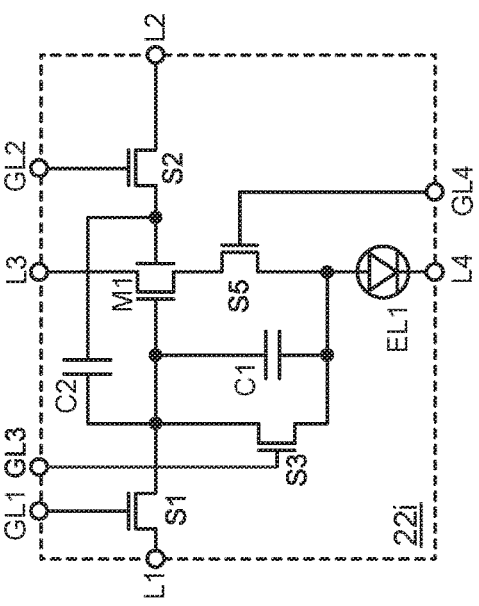
Figure 23A:
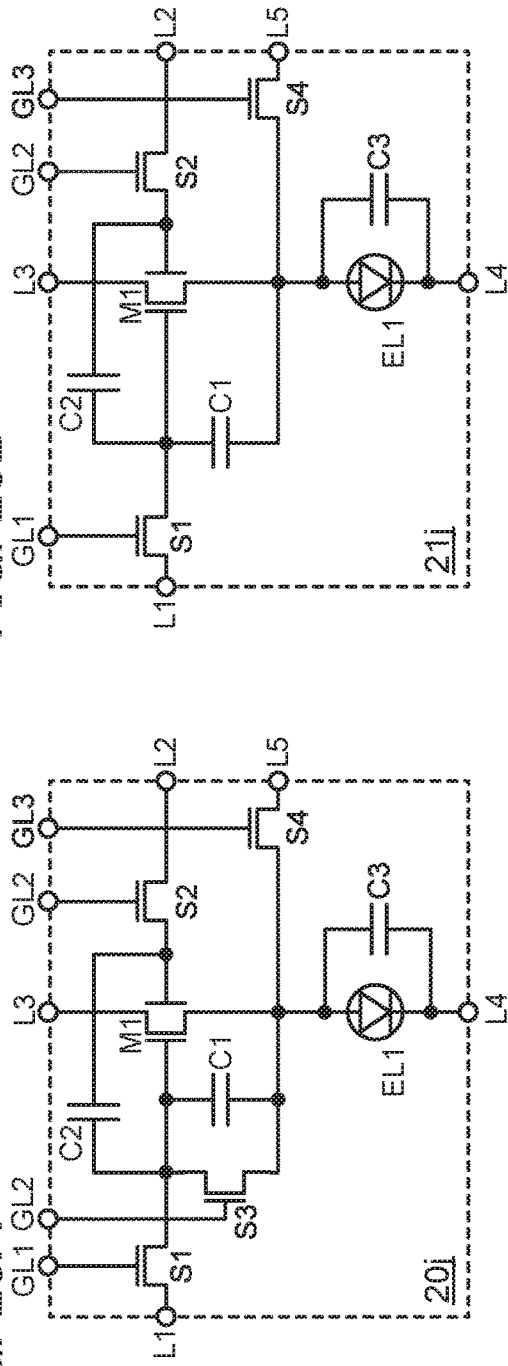
FIGS. 23A to 23D are circuit diagrams each illustrating a configuration example of a pixel.
Figure 23B:
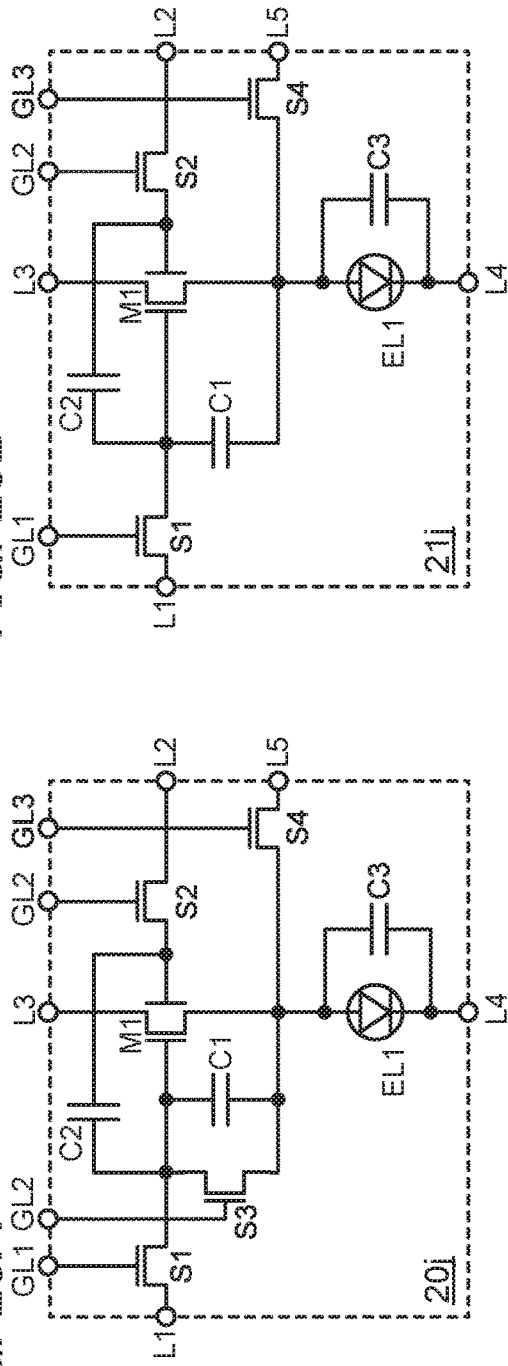
Figure 23C:
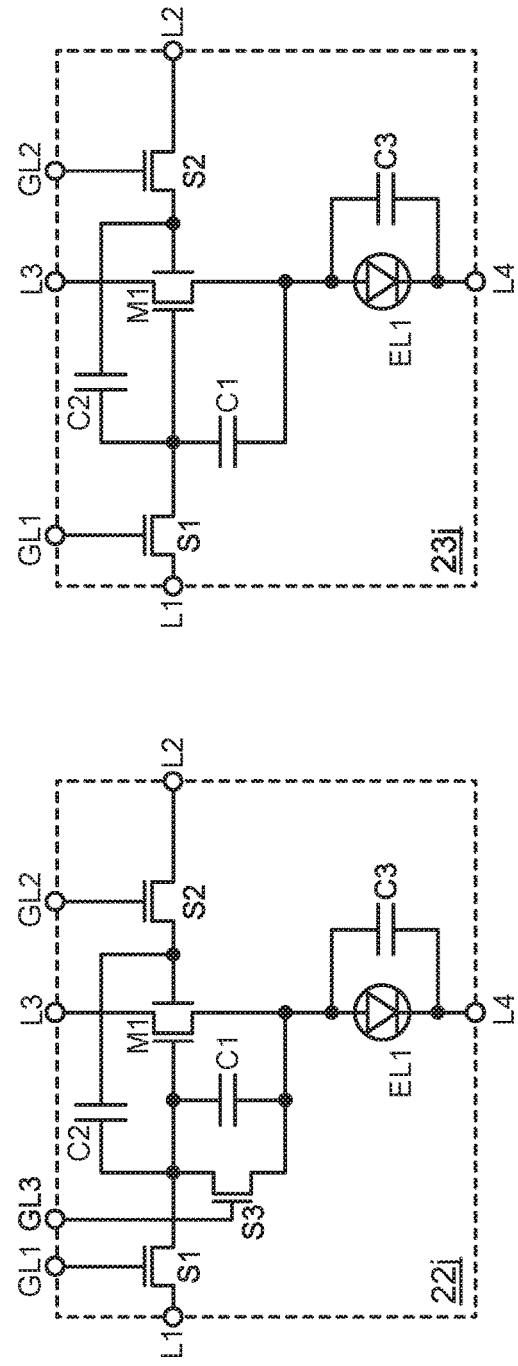
Figure 23D:
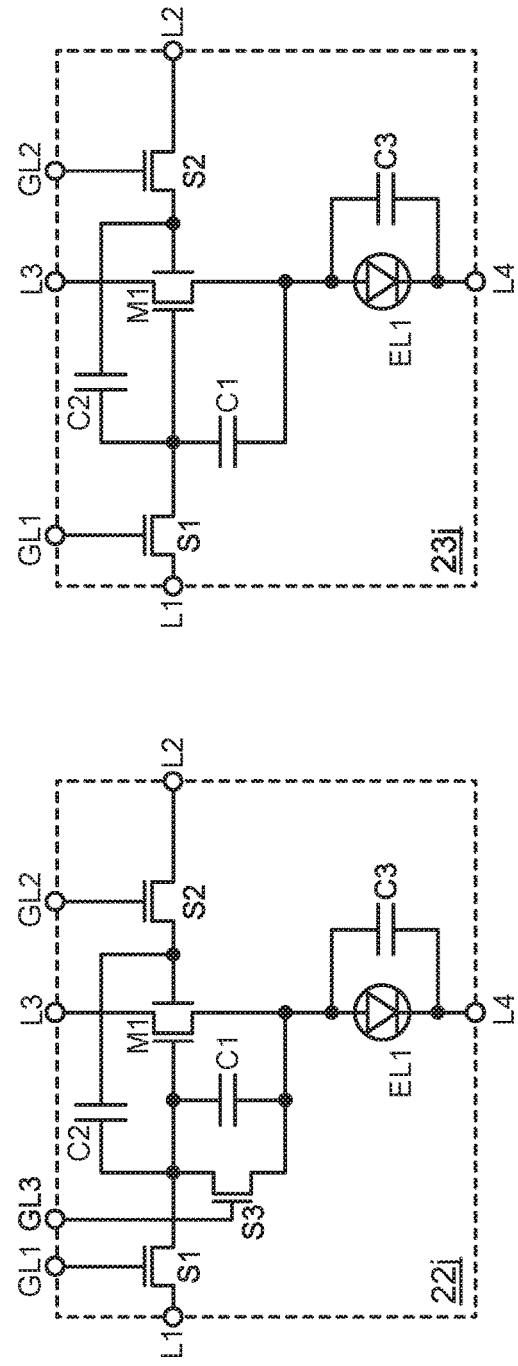
Figure 24B:
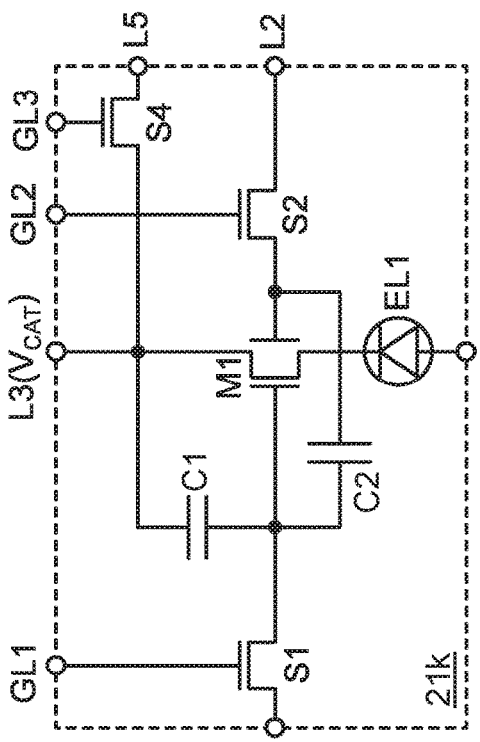
FIGS. 24A to 24D are circuit diagrams each illustrating a configuration example of a pixel.
Figure 24D:
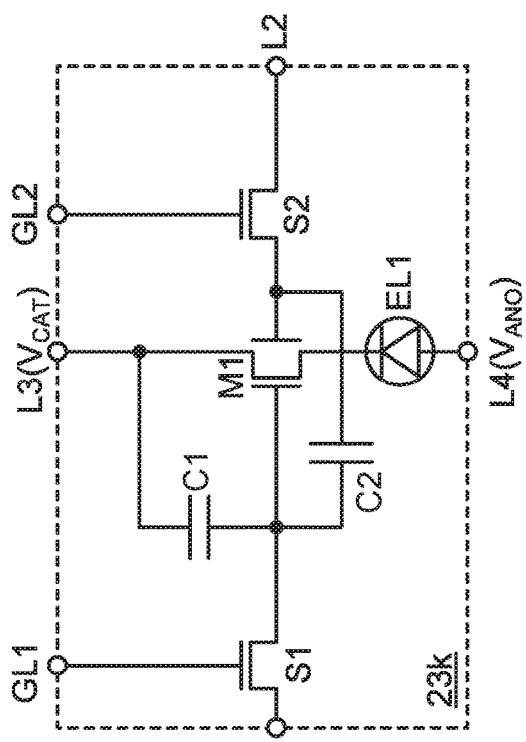
Figure 24A:
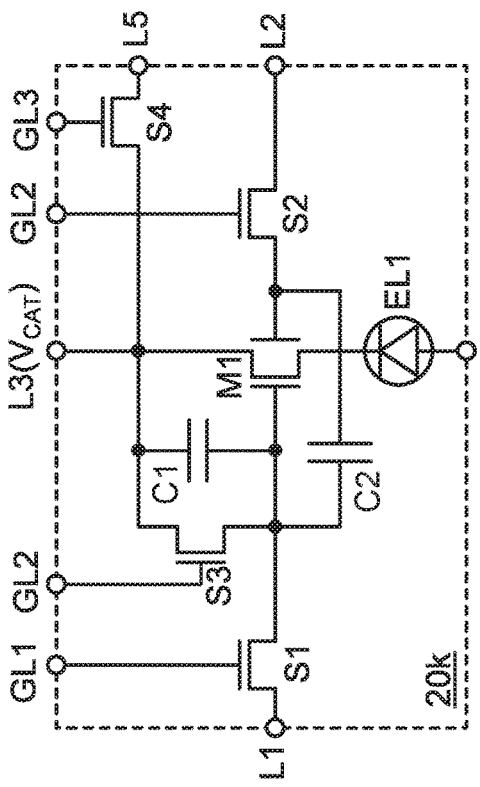
Figure 24C:
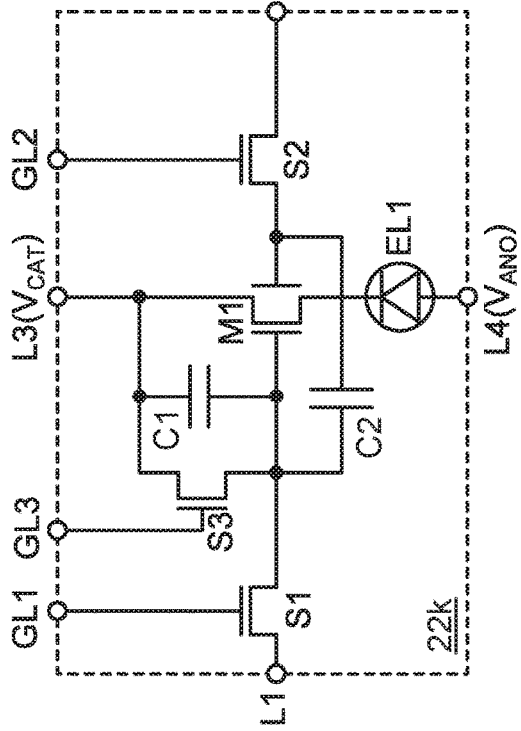
Figure 25A:
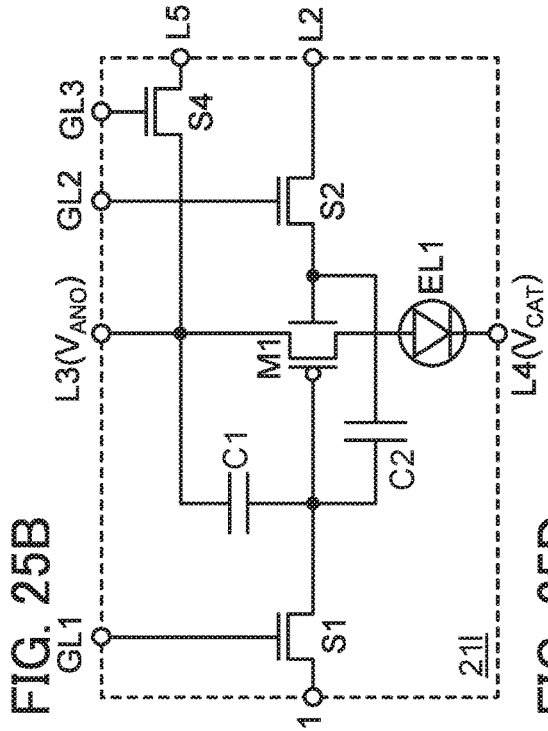
FIGS. 25A to 25D are circuit diagrams each illustrating a configuration example of a pixel.
Figure 25B:
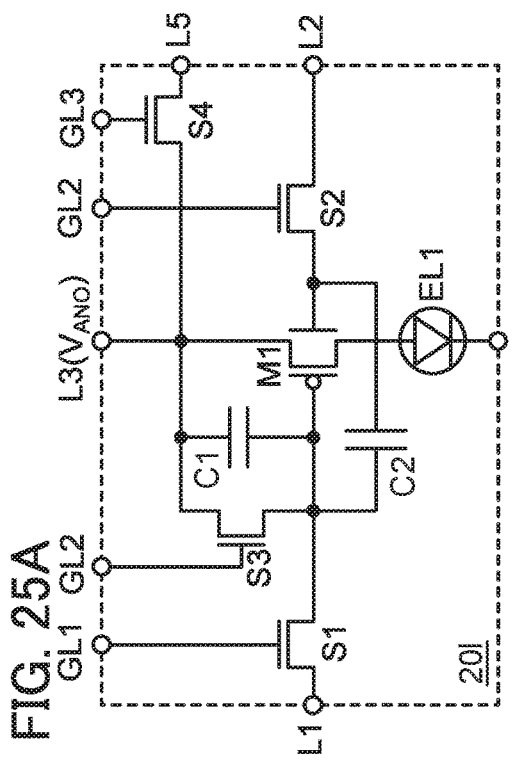
Figure 25C:
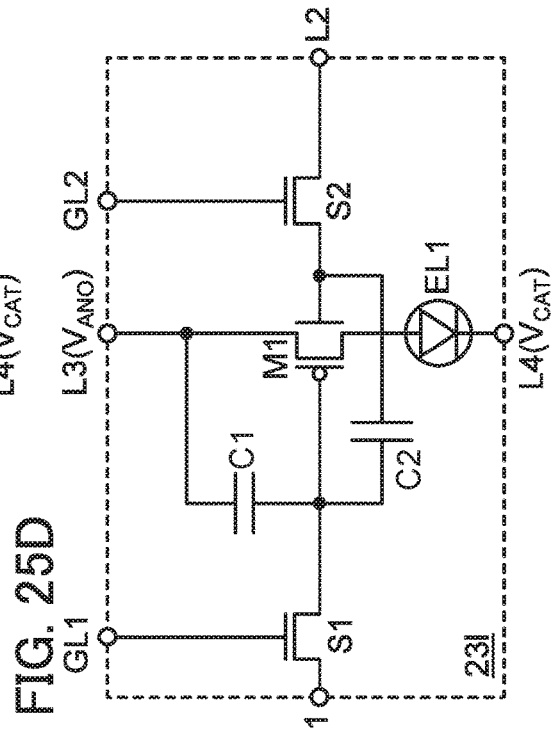
Figure 25D:
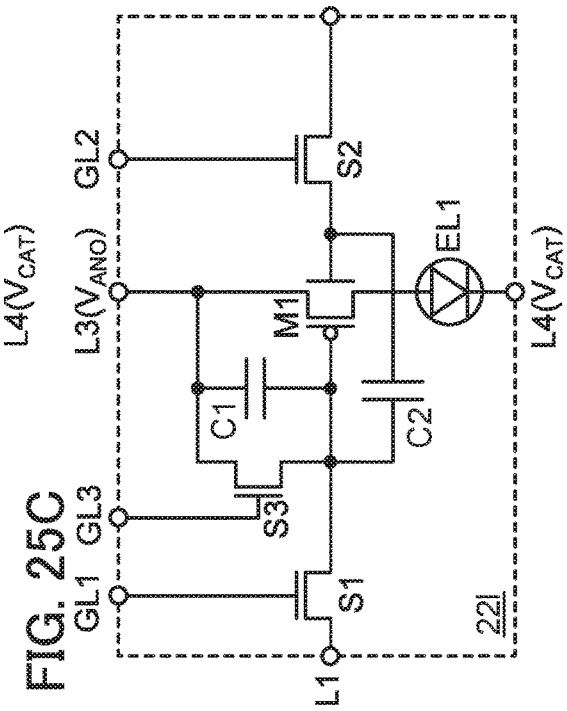

FIG. 13 is a timing chart showing a potential supplied to the wiring L1, potentials supplied to the wirings GL1 to GL3, and a potential supplied to the wiring L3. The timing chart in FIG. 13 illustrates periods P1 to P4. FIG. 14A illustrates the state of the pixel 23a in the period P1. FIG. 14B illustrates the state of the pixel 23a in the period P2. FIG. 14C illustrates the state of the pixel 23a in the period P3. To simply show the operation of the pixel 23a, each of the switches S1 and S2 is illustrated as a switch in FIGS. 14A to 14C.

The period P1 is a period for initializing the pixel 23a. The period P2 is a period for fixing the threshold voltage of the transistor M1 at $V_2-V_5$. The period P3 is a period for writing data to the pixel 23a. The period P4 is a period for light emission from the pixel 23a.

In FIGS. 14A to 14C, a node of the first gate of the transistor M1, the first terminal of the capacitor C1, and the first terminal of the capacitor C2 is denoted by a node N1; a node of the second gate of the transistor M1 and the second terminal of the capacitor C2 is denoted by a node N2; and a node of the second terminal of the transistor M1, the second terminal of the capacitor C1, and the first terminal of the light-emitting element EL1 is denoted by a node N3.

Throughout the periods P1 to P4, the wiring L2 is supplied with $V_0$, and the wiring L4 is supplied with $V_{CAT}$.

First, in the period P1, the pixel 23a is initialized. The wirings GL1 and GL2 are supplied with an H level. The switches S1 and S2 are turned on (FIG. 14A).

The wiring L1 is supplied with a given fixed potential (a potential $V_2$), and the wiring L3 is supplied with a low potential (a potential $V_L$). The node N1 is supplied with $V_2$, and the node N2 is supplied with $V_0$. When the potential of the node N3 at that time is referred to as a potential $V_5$, $V_{GS}$ is equal to $V_2-V_5$ and $V_{BGS}$ is equal to $V_0-V_5$. The threshold voltage of the transistor M1 is $V_{th3}$. The supply of $V_L$ to the wiring L3 in the period P1 can prevent a current from flowing to the transistor M1 and the light-emitting element EL1.

Next, $V_{th}$ of the transistor M1 in the pixel 23a is fixed at $V_2-V_5$ in the period P2. The wiring GL1 is supplied with an L level, and the wiring GL2 is supplied with the H level. The switch S1 is turned off, and the switch S2 is turned on. The node N2 is supplied with $V_0$. The wiring L3 is supplied with $V_{ANO}$ (FIG. 14B).

At this time, current flows through the transistor M1, and the potential of the node N3 increases. The capacitor C1 keeps $V_{GS}$ at $V_2-V_5$; accordingly, $V_{GS}$ is equal to $V_{th1}$ n the case of $V_{th}=V_2-V_5$, so that the transistor M1 is turned off and the potential of the node N3 stops increasing. At that time, $V_{BGS}$ is $(V_{th0}-V_2+V_5)/\alpha$.

In the period P3, data is written to the pixel 23a. The wiring GL1 is supplied with the H level, and the wiring GL2 is supplied with an L level. The switch S1 is turned on, and the switch S2 is turned off. The node N1 is supplied with $V_{DATA}$ through the switch S1. When the potential of the node N3 at that time is referred to as a potential $V_6$, $V_{GS}$ is equal to $V_{DATA}-V_6$, and $V_{BGS}$ is equal to $V_{DATA}-V_2+V_5$ $(V_{th0}-V_2+V_5/\alpha-V_6$ (FIG. 14C).

The first gate and the second gate of the transistor M1 are supplied with a $V_{DATA}$-dependent potential. In other words, the transistor M1 is brought into a dual-gate driving state.

Since $V_{th}$ of the transistor M1 is corrected to be $V_2-V_5$ in the period P2, in the light-emitting element EL1, light emission which does not depend on $V_{th}$ of the transistor M1 can be obtained. Since the dual-gate driving of the transistor M1 is performed, the transistor M1 allows a larger current to flow therethrough.

When the dual-gate driving of the transistor M1 is performed, the transistor M1 allows a larger current to flow therethrough with a smaller channel width, and the area occupied by the transistor M1 can be decreased. The decrease in the area occupied by the transistor M1 leads to a decrease in the area occupied by the pixel 23a and an increase in resolution of the display device.

In the case where light from the light-emitting element EL1 is blocked by the transistor M1, the decrease in the area occupied by the transistor M1 leads to an increase in aperture ratio of the display device and an increase in display quality of the display device.

In the display device including the pixel 23a, variation in luminance among the pixels can be suppressed. The display device can have a high resolution, a high aperture ratio, or a high display quality.

<Other Pixel Configuration Examples>

In each of the above-described pixels 20a to 23a, the first gate and the second gate of the transistor M1 may be interchanged with each other. FIGS. 15A to 15D illustrate circuit diagrams in that case. A pixel 20b illustrated in FIG. 15A corresponds to the pixel 20a. A pixel 21b illustrated in FIG. 15B corresponds to the pixel 21a. A pixel 22b illustrated in FIG. 15C corresponds to the pixel 22a. A pixel 23b illustrated in FIG. 15D corresponds to the pixel 23a.

In each of the above-described pixels 20a to 23a, a capacitance of the first gate of the transistor M1 can be used as a substitute for the capacitor C1. FIGS. 16A to 16D illustrate circuit diagrams in that case. A pixel 20c illustrated in FIG. 16A corresponds to the pixel 20a. A pixel 21c illustrated in FIG. 16B corresponds to the pixel 21a. A pixel 22c illustrated in FIG. 16C corresponds to the pixel 22a. A pixel 23c illustrated in FIG. 16D corresponds to the pixel 23a.

In each of the above-described pixels 20a to 23a, transistors each including a first gate and a second gate may be used as the switches S1 to S4. FIGS. 17A to 17D illustrate circuit diagrams in that case. A pixel 20d illustrated in FIG. 17A corresponds to the pixel 20a. A pixel 21d illustrated in FIG. 17B corresponds to the pixel 21a. A pixel 22d illustrated in FIG. 17C corresponds to the pixel 22a. A pixel 23d illustrated in FIG. 17D corresponds to the pixel 23a. The second gates of the switches S1 to S4 may be supplied with a common potential $V_7$. This configuration makes it possible to control the threshold voltage of the switches S1 to S4.

The first gate and the second gate of each of the switches S1 to S4 illustrated in FIGS. 17A to 17D may be electrically connected to each other. FIGS. 18A to 18D illustrate circuit diagrams in that case. A pixel 20e illustrated in FIG. 18A corresponds to the pixel 20d. A pixel 21e illustrated in FIG. 18B corresponds to the pixel 21d. A pixel 22e illustrated in FIG. 18C corresponds to the pixel 22d. A pixel 23e illustrated in FIG. 18D corresponds to the pixel 23d. This configuration makes it possible to increase the on-state current of the transistors used as the switches S1 to S4.

In each of the above-described pixels 20a to 23a, the positions of the anode and the cathode of the light-emitting element EL1 may be interchanged with each other by using a p-channel transistor as the transistor M1. FIGS. 19A to 19D illustrate circuit diagrams in that case. A pixel 20f illustrated in FIG. 19A corresponds to the pixel 20a. A pixel 21f illustrated in FIG. 19B corresponds to the pixel 21a. A pixel 22f illustrated in FIG. 19C corresponds to the pixel 22a. A pixel 23f illustrated in FIG. 19D corresponds to the pixel 23a. When the positions of the anode and the cathode of the light-emitting element EL1 are interchanged, the wiring L3 is preferably supplied with $V_{CAT}$ and the wiring L4 is preferably supplied with $V_{ANO}$.

In each of the above-described pixels 20a to 23a, a switch S5 may be provided between the second terminal of the capacitor C1 and the first terminal of the light-emitting element EL1. FIGS. 20A to 20D illustrate circuit diagrams in that case. A pixel 20g illustrated in FIG. 20A corresponds to the pixel 20a. A pixel 21g illustrated in FIG. 20B corresponds to the pixel 21a. A pixel 22g illustrated in FIG. 20C corresponds to the pixel 22a. A pixel 23g illustrated in FIG. 20D corresponds to the pixel 23a. FIGS. 20A to 20D illustrate the cases where an n-channel transistor is used as the switch S5. A gate of the switch S5 is electrically connected to a wiring GL4. Each of the pixels 20g to 23g including the switch S5 can control the flow of current to the light-emitting element EL1.

In each of the above-described pixels 20a to 23a, the switch S5 may be provided between the first terminal of the transistor M1 and the wiring L3. FIGS. 21A to 21D illustrate circuit diagrams in that case. A pixel 20h illustrated in FIG. 21A corresponds to the pixel 20a. A pixel 21h illustrated in FIG. 21B corresponds to the pixel 21a. A pixel 22h illustrated in FIG. 21C corresponds to the pixel 22a. A pixel 23h illustrated in FIG. 21D corresponds to the pixel 23a. FIGS. 21A to 21D illustrate the cases where an n-channel transistor is used as the switch S5. A gate of the switch S5 is electrically connected to the wiring GL4. Each of the pixels 20h to 23h having the above configuration can control the flow of current to the transistor M1 and the light-emitting element EL1.

In each of the above-described pixels 20a to 23a, the switch S5 may be provided between the second terminal of the transistor M1 and the second terminal of the capacitor C1. FIGS. 22A to 22D illustrate circuit diagrams in that case. A pixel 20i illustrated in FIG. 22A corresponds to the pixel 20a. A pixel 21i illustrated in FIG. 22B corresponds to the pixel 21a. A pixel 22i illustrated in FIG. 22C corresponds to the pixel 22a. A pixel 23i illustrated in FIG. 22D corresponds to the pixel 23a. FIGS. 22A to 22D illustrate the cases where an n-channel transistor is used as the switch S5. A gate of the switch S5 is electrically connected to the wiring GL4. Each of the pixels 20i to 23i having the above configuration can control the flow of current to the transistor M1 and the light-emitting element EL1.

In each of the above-described pixels 20a to 23a, a capacitor C3 may be connected in parallel to the light-emitting element EL1. FIGS. 23A to 23D illustrate circuit diagrams in that case. A pixel 20j illustrated in FIG. 23A corresponds to the pixel 20a. A pixel 21j illustrated in FIG. 23B corresponds to the pixel 21a. A pixel 22j illustrated in FIG. 23C corresponds to the pixel 22a. A pixel 23j illustrated in FIG. 23D corresponds to the pixel 23a. Each of the pixels 20j to 23j having the above configuration can stabilize the potential of the first terminal of the light-emitting element EL1.

In each of the above-described pixels 20a to 23a, the positions of the anode and the cathode of the light-emitting element EL1 may be interchanged with each other. FIGS. 24A to 24D illustrate circuit diagrams in that case. A pixel 20k illustrated in FIG. 24A corresponds to the pixel 20a. A pixel 21k illustrated in FIG. 24B corresponds to the pixel 21a. A pixel 22k illustrated in FIG. 24C corresponds to the pixel 22a. A pixel 23k illustrated in FIG. 24D corresponds to the pixel 23a. In each of the pixels 20k and 22k, the switch S3 has a function of controlling electrical connection between the first gate and the first terminal of the transistor M1. In each of the pixels 20k to 23k, the first terminal of the capacitor C1 is electrically connected to the first gate, and the second terminal of the capacitor C1 is electrically connected to the first terminal of the transistor M1. When the positions of the anode and the cathode of the light-emitting element EL1 are interchanged, the wiring L3 is preferably supplied with $V_{CAT}$ and the wiring L4 is preferably supplied with $V_{ANO}$.

In each of the above-described pixels 20a to 23a, the transistor M1 may be a p-channel transistor. FIGS. 25A to 25D illustrate circuit diagrams in that case. A pixel 20l illustrated in FIG. 25A corresponds to the pixel 20a. A pixel 21l illustrated in FIG. 25B corresponds to the pixel 21a. A pixel 22l illustrated in FIG. 25C corresponds to the pixel 22a. A pixel 23l illustrated in FIG. 25D corresponds to the pixel 23a. In each of the pixels 20l and 22l, the switch S3 has a function of controlling electrical connection between the first gate and the first terminal of the transistor M1. In each of the pixels 20*l* to 23*l*, the first terminal of the capacitor C1 is electrically connected to the first gate, and the second terminal of the capacitor C1 is electrically connected to the first terminal of the transistor M1.

<Configuration Examples of Pixel Portion and Selection Circuit>

FIG. 26 illustrates, as an example, a configuration of a pixel portion in a display device according to one embodiment of the present invention.

In FIG. 26, a pixel portion 40 includes a plurality of pixels 20*a* arranged in a matrix. The pixel portion 40 further includes the wirings GL1 to GL3 connected to a driver circuit 110, the wirings L1 to L3 connected to a driver circuit 120, the wirings L4 (not illustrated), and the wirings L5. Note that a set of the wirings GL1 to GL3 corresponds to one wiring GL in FIG. 26. Each of the plurality of pixels 20*a* is electrically connected to at least one of the wirings GL1, at least one of the wirings GL2, at least one of the wirings GL3, at least one of the wirings L1, at least one of the wirings L2, at least one of the wirings L3, at least one of the wirings L4, and at least one of the wirings L5.

Note that the kinds and number of the wirings can be determined depending on the configuration, number, and position of the pixels 20*a*. Specifically, in the pixel portion 40 in FIG. 26, the pixels 20*a* are electrically connected to each other in a matrix of m rows and n columns. In the pixel portion 40, a plurality of wirings GL (wirings GL[1] to GL[*m*]), a plurality of wirings L1 (wirings L1[1] to L1[*n*]), a plurality of wirings L2 (wirings L2[1] to L2[*n*]), a plurality of wirings L3 (L3[1] to L3[*n*]), and a plurality of wirings L5 (wirings L5[1] to L5[*n*]) are provided.

Although FIG. 26 illustrates a configuration example of the pixel portion including the pixel 20*a*, one embodiment of the present invention is not limited thereto. FIG. 26 can be applied to all the pixels described as examples in this embodiment.

Embodiment 2

In this embodiment, a transistor including an oxide semiconductor film for a channel formation region (OS transistor) and a transistor including silicon for a channel formation region (Si transistor) will be described as examples of the transistor applied to the pixel described in the above embodiment.

<Structure Example 1 of Transistor>

First, an OS transistor will be described.

FIGS. 27A, 27B, and 27C respectively show top views (layouts) and circuit symbols of three transistors TA1, TA2, and TB1 with different device structures. FIGS. 28A and 28B are cross-sectional views of the transistors TA1, TA2, and TB1. Specifically, FIGS. 28A and 28B are cross-sectional views illustrating the transistor TA1 along the lines a1-a2 and b1-b2, the transistor TA2 along the lines a3-a4 and b3-b4, and the transistor TB1 along the lines a5-a6 and b5-b6. FIGS. 28A and 28B illustrate the cross-sectional structures of the transistors in the channel length direction and the channel width direction, respectively.

As illustrated in FIGS. 28A and 28B, the transistors TA1, TA2, and TB1 are formed over the same insulating surface and can be formed through the same manufacturing process. Note that for clarity of the device structures, a wiring for supplying a potential or power to a gate (G), a source (S), or a drain (D) of each transistor is not illustrated.

The transistor TA1 in FIG. 27A and the transistor TA2 in FIG. 27B each include a gate electrode (G) and a backgate electrode (BG). The gate electrode corresponds to a first gate electrode, and the backgate electrode corresponds to a second gate electrode. In each of the transistors TA1 and TA2, the backgate electrode is connected to the gate electrode. In contrast, the transistor TB1 in FIG. 27C does not include a backgate electrode. As illustrated in FIGS. 28A and 28B, the transistors TA1, TA2, and TB1 are formed over a substrate 30. The structures of the transistors will be described below with reference to FIGS. 27A to 27C and FIGS. 28A and 28B.

[Transistor TA1]

The transistor TA1 includes a gate electrode GE1, a source electrode SE1, a drain electrode DE1, a backgate electrode BGE1, and an oxide semiconductor film OS1.

The channel length of the OS transistor corresponds to the distance between the source electrode and the drain electrode in this embodiment. The channel width of the OS transistor corresponds to the width of the source electrode or the drain electrode in a region where the oxide semiconductor film and the gate electrode overlap with each other. The channel length and the channel width of the transistor TA1 are represented by La1 and Wa1, respectively.

The oxide semiconductor film OS1 overlaps with the gate electrode GE1 with an insulating film 34 provided therebetween. The pair of electrodes (SE1 and DE1) are formed in contact with an upper surface and side surfaces of the oxide semiconductor film OS1. As illustrated in FIG. 27A, the oxide semiconductor film OS1 includes a region which overlaps with neither the gate electrode GE1 nor the pair of electrodes (SE1 and DE1). The length in the channel length direction of the oxide semiconductor film OS1 is longer than the channel length La1, and the length in the channel width direction is longer than the channel width Wa1.

An insulating film 35 is formed so as to cover the oxide semiconductor film OS1, the gate electrode GE1, the source electrode SE1, and the drain electrode DE1. The backgate electrode BGE1 is formed over the insulating film 35. The backgate electrode BGE1 overlaps with the oxide semiconductor film OS1 and the gate electrode GE1. Here, for example, the backgate electrode BGE1 has the same shape as the gate electrode GE1 and is located in the same position as the gate electrode GE1. The backgate electrode BGE1 is in contact with the gate electrode GE1 through an opening CG1 in the insulating films 34 and 35 and an insulating film 36. With this structure, the gate electrode is electrically connected to the backgate electrode in the transistor TA1.

The backgate electrode BGE1 is connected to the gate electrode GE1, so that the on-state current of the transistor TA1 can be increased. The strength of the transistor TA1 can be increased with the backgate electrode BGE1. When the substrate 30 is deformed by bending or the like, the backgate electrode BGE1 serves as a reinforcement member to prevent the transistor TA1 from being broken.

The oxide semiconductor film OS1 including a channel formation region has a multilayer structure; here, three oxide semiconductor films 31, 32, and 33 are stacked as an example. The oxide semiconductor films included in the oxide semiconductor film OS1 are preferably metal oxide films containing at least one common metal element, more preferably metal oxide films each containing In. As a metal oxide containing In which can be used as a semiconductor film of a transistor, an In—Ga oxide film and an In-M-Zn oxide film (M is Al, Ga, Y, Zr, La, Ce, or Nd) are typical examples. Another element or material may also be added to these metal oxide films.

The oxide semiconductor film 32 includes a channel formation region of the transistor TA1. The oxide semiconductor film 33 includes channel formation regions of the transistors TA2 and TB1, which are described later. An oxide semiconductor film with an appropriate composition may be used as the oxide semiconductor film 33 depending on required electrical characteristics (e.g., field-effect mobility and threshold voltage) of the transistors TA2 and TB1.

Since a channel is formed in the oxide semiconductor film 32 in the transistor TA1, the channel formation region is not in contact with the insulating films 34 and 35. When the oxide semiconductor films 31 to 33 are metal oxide films containing at least one common metal element, interface scattering is unlikely to occur at the interface between the oxide semiconductor films 32 and 31 and at the interface between the oxide semiconductor films 32 and 33. The field-effect mobility of the transistor TA1 can be thus higher than those of the transistors TA2 and TB1. In addition, drain current in an on-state (on-state current) of the transistor TA1 can be increased.

[Transistor TA2]

The transistor TA2 includes a gate electrode GE2, a source electrode SE2, a drain electrode DE2, a backgate electrode BGE2, and an oxide semiconductor film OS2. The backgate electrode BGE2 is in contact with the gate electrode GE2 through an opening CG2 formed in the insulating films 34 to 36. The transistor TA2 is a modification example of the transistor TA1; unlike in the transistor TA1, the oxide semiconductor film OS2 of the transistor TA2 is formed with a single-layer structure of the oxide semiconductor film 33, and other components are the same. The channel length La2 and the channel width Wa2 of the transistor TA2 are equal to the channel length La1 and the channel width Wa1 of the transistor TA1, respectively.

[Transistor TB1]

The transistor TB1 includes a gate electrode GE3, a source electrode SE3, a drain electrode DE3, and an oxide semiconductor film OS3. The transistor TB1 is a modification example of the transistor TA2. As in the transistor TA2, the oxide semiconductor film OS3 of the transistor TB1 is formed with a single-layer structure of the oxide semiconductor film 33. Unlike the transistor TA2, the transistor TB1 does not include a backgate electrode. In addition, the layout of the oxide semiconductor film OS3 and the electrodes GE3, SE3, and DE3 is different. As illustrated in FIG. 27C, regions of the oxide semiconductor film OS3 which do not overlap with the gate electrode GE3 overlap with the source electrode SE3 and the drain electrode DE3. The channel width Wb1 of the transistor TB1 is thus determined by the width of the oxide semiconductor film OS3. The channel length Lb1 of the transistor TB1 is determined by the distance between the source electrode SE3 and the drain electrode DE3 as in the transistor TA2 and is longer than the channel length La2 of the transistor TA2.

[Insulating Film]

The insulating films 34 to 36 are formed in the entire region over the substrate 30 where the transistors TA1, TA2, and TB1 are formed. Each of the insulating films 34 to 36 is a single film or a multilayer film. The insulating film 34 serves as gate insulating films of the transistors TA1, TA2, and TB1. The insulating films 35 and 36 each serve as gate insulating films on the backchannel side of the transistors TA1, TA2, and TB1. The insulating film 36, which is the uppermost film, is preferably formed using a material that allows it to serve as a protective film of a transistor over the substrate 30. The insulating film 36 is provided if necessary. In order to insulate the electrode in the third layer (BGE1) from the electrodes in the second layer (SE1 and DE1), at least one insulating film is formed therebetween.

The insulating films 34 to 36 can each be formed with a single layer of insulating film or a multilayer of two or more insulating films. Examples of an insulating film used for the insulating films 34 to 36 include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film. These insulating films can be formed by a sputtering method, a CVD method, an MBE method, an ALD method, or a PLD method.

[Oxide Semiconductor Film]

An oxide semiconductor film used for the semiconductor film of the OS transistor is described. In the case where the semiconductor film is a multilayer like the oxide semiconductor film OS1, oxide semiconductor films included in the multilayer semiconductor film are preferably metal oxide films containing at least one common metal element, more preferably metal oxide films each containing In.

When the oxide semiconductor film 31 is an In—Ga oxide film, for example, the atomic proportion of In is set lower than that of Ga. When the oxide semiconductor film 31 is an In-M-Zn oxide film (M is Al, Ga, Y, Zr, La, Ce, or Nd), the atomic proportion of In is set lower than the atomic proportion of M, and the atomic proportion of Zn can be the highest among the three elements.

When the oxide semiconductor film 32 is an In—Ga oxide film, for example, the atomic proportion of In is set higher than that of Ga. When the oxide semiconductor film 32 is an In-M-Zn oxide film, the atomic proportion of In is set higher than that of M. In the case of an In-M-Zn oxide film, the atomic proportion of In is preferably higher than those of M and Zn.

When the oxide semiconductor film 33 is an In—Ga oxide film, for example, the atomic proportion of In is set equal to or lower than that of Ga. When the oxide semiconductor film 33 is an In-M-Zn oxide film, the atomic proportion of In is set equal to that of M, and the atomic proportion of Zn can be higher than those of In and M. Here, the oxide semiconductor film 33 is a film including channel formation regions of the transistors TA2 and TB1.

When the oxide semiconductor films 31 to 33 are formed by a sputtering method, the atomic ratio of constituents of each film can be adjusted by adjusting the atomic ratio or the like of constituents of a target. When the oxide semiconductor films 31 to 33 are formed by a CVD method, the atomic ratio of constituents of each film can be adjusted by adjusting the flow rates of source gases or the like. Deposition targets for forming In-M-Zn oxide films as the oxide semiconductor films 31 to 33 by a sputtering method will be described below as an example. In order to form these films, In-M-Zn oxide targets are used.

When the atomic ratio of metal elements of a target for the oxide semiconductor film 31 is In:M:Zn=$x_1$:$y_1$:$z_1$, $x_1/y_1$ is preferably greater than or equal to 1/6 and less than 1, and $z_1/y_1$ is preferably greater than or equal to 1/3 and less than or equal to 6, more preferably greater than or equal to 1 and less than or equal to 6.

Typical examples of the atomic ratio of the metal elements of the target are In:M:Zn=1:3:2, InM:Zn=1:3:4, In:M:Zn=1:3:6, In:M:Zn=1:3:8, In:M:Zn=1:4:4, In:M:Zn=1:4:5, InM:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, In:M:Zn=1:6:8, and the like.

When the atomic ratio of metal elements of a target for the oxide semiconductor film 32 is In:M:Zn=$x_2$:$y_2$:$z_2$, $x_2/y_2$ is preferably greater than 1 and less than or equal to 6, and $z_2/y_2$ is preferably greater than 1 and less than or equal to 6. Typical examples of the atomic ratio of the metal elements of the target are In:M:Zn=2:1:1.5, In:M:Zn=2:1:2.3, In:M:Zn=2:1:3, In:M:Zn=3:1:2, In:M:Zn=3:1:3, and In:M:Zn=3:1:4.

When the atomic ratio of metal elements of a target for the oxide semiconductor film 33 is In:M:Zn=$x_3$:$y_3$:$z_3$, $x_3/y_3$ is preferably greater than or equal to 1/6 and less than or equal to 1, and $z_3/y_3$ is preferably greater than or equal to 1/3 and less than or equal to 6, more preferably greater than or equal to 1 and less than or equal to 6. Typical examples of the atomic ratio of the metal elements of the target are In:M:Zn=1:1:1, In:M:Zn=1:1:1.2, In:M:Zn=1:3:2, In:M:Zn=1:3:4, In:M:Zn=1:3:6, In:M:Zn=1:3:8, InM:Zn=1:4:4, In:M:Zn=1:4:5, In:M:Zn=1:4:6, In:M:Zn=1:4:7, In:M:Zn=1:4:8, InM:Zn=1:5:5, In:M:Zn=1:5:6, In:M:Zn=1:5:7, In:M:Zn=1:5:8, and InM:Zn=1:6:8.

When the atomic ratio of metal elements of a deposition target for an In-M-Zn oxide film is In:M:Zn=x:y:z, $1 \leq z/y \leq 6$ is preferably satisfied because a CAAC-OS film is easily formed as the In-M-Zn oxide film. Note that the CAAC-OS film will be described later.

An oxide semiconductor film with a low carrier density is used as the oxide semiconductor films 31 to 33. For example, an oxide semiconductor film whose carrier density is lower than or equal to $1\times10^{17}/cm^3$, preferably lower than or equal to $1\times10^{15}/cm^3$, more preferably lower than or equal to $1\times10^{13}/cm^3$, more preferably lower than $8\times10^{11}/cm^3$, more preferably lower than $1\times10^{11}/cm^3$, more preferably lower than $1\times10^{10}/cm^3$, and is higher than or equal to $1\times10^{-9}/cm^3$ is preferably used as the oxide semiconductor films 31 to 33.

It is preferable to use, as the oxide semiconductor films 31 to 33, an oxide semiconductor film in which the impurity concentration is low and the density of defect states is low, in which case the transistor can have more excellent electrical characteristics. Here, the state where the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources and thus has a low carrier density in some cases. Thus, a transistor including a channel region in the oxide semiconductor film rarely has negative threshold voltage (is rarely normally-on). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, i.e., lower than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and a high reliability. As examples of the impurity, hydrogen, nitrogen, alkali metal, alkaline earth metal, and the like are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on.

Accordingly, it is preferable that hydrogen as well as the oxygen vacancies be reduced as much as possible in the oxide semiconductor films 31 to 33. Specifically, in the oxide semiconductor films 31 to 33, the hydrogen concentration measured by secondary ion mass spectrometry (SIMS) is set to lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$.

When the oxide semiconductor films 31 to 33 contain silicon or carbon, which is an element belonging to Group 14, the number of oxygen vacancies in the films is increased, so that the films have n-type conductivity. Thus, the concentration of silicon or carbon (measured by SIMS) in the oxide semiconductor films 31 to 33 is set to lower than or equal to $2\times10^{18}$ atoms/cm$^3$, preferably lower than or equal to $2\times10^{17}$ atoms/cm$^3$.

The concentration of alkali metal or alkaline earth metal in the oxide semiconductor films 31 to 33, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor films 31 to 33.

Furthermore, when containing nitrogen, the oxide semiconductor films 31 to 33 easily become n-type films by generation of electrons serving as carriers and an increase of carrier density. Thus, a transistor including an oxide semiconductor that contains nitrogen is likely to be normally on. For this reason, nitrogen in the oxide semiconductor films 31 to 33 is preferably reduced as much as possible; the nitrogen concentration which is measured by SIMS is preferably set to be, for example, lower than or equal to $5\times10^{18}$ atoms/cm$^3$.

Without limitation to the oxide semiconductor films 31 to 33 described above, other oxide semiconductor films with appropriate compositions can be used depending on required semiconductor characteristics and electrical characteristics (e.g., field-effect mobility and threshold voltage) of transistors. To obtain the required semiconductor characteristics and electrical characteristics of the transistors, it is preferable that the carrier density, the impurity concentration, the defect density, the atomic ratio of metal elements and oxygen, the interatomic distance, the density, and the like of the oxide semiconductor films 31 to 33 be set to appropriate values.

The field-effect mobility of the transistor TA1 can be high because a channel is formed in the oxide semiconductor film 32 in which the atomic proportion of In is higher than that of Ga or M (M is Al, Ga, Y, Zr, La, Ce, or Nd). For example, the field-effect mobility is higher than 10 cm$^2$/Vs and lower than 60 cm$^2$/Vs, preferably higher than or equal to 15 cm$^2$/Vs and lower than 50 cm$^2$/Vs. The transistor TA1 is thus preferably used in a driver circuit which needs to operate at high speed in an active-matrix display device.

The transistor TA1 is preferably provided in a region shielded from light. Furthermore, the driving frequency of a driver circuit including the transistor TA1 with a high field-effect mobility can be increased, so that a display device with higher resolution can be achieved.

The field-effect mobility of the transistors TA2 and TB1 each including a channel formation region in the oxide semiconductor film 33 is approximately higher than or equal to 3 $cm^2/Vs$ and lower than or equal to 10 $cm^2/Vs$, which is lower than that of the transistor TA1. Because the transistors TA2 and TB1 do not include the oxide semiconductor film 32, they are less degraded by light than the transistor TA1, and thus, the amount of off-state current increased by light irradiation is small. For this reason, the transistors TA2 and TB1 each including a channel formation region in the oxide semiconductor film 33 are preferably used for a pixel portion, which is irradiated with light.

The amount of off-state current increased by light irradiation is likely to be large in the transistor TA1 as compared to the transistors TA2 and TB1 which do not include the oxide semiconductor film 32. This is a reason why the transistor TA1 is suitable for a peripheral driver circuit, which is less influenced by light than a pixel portion, which cannot be sufficiently shielded from light. Needless to say, a transistor like the transistors TA2 and TB1 can also be provided in a driver circuit.

The structures of transistors and oxide semiconductor films are not limited to those of the transistors TA1, TA2, and TB1 and the oxide semiconductor films 31 to 33 described above, and the structure of the transistor can be changed depending on the required semiconductor characteristics and electrical characteristics of the transistor. For example, the presence or absence of a backgate electrode, a stacked-layer structure of an oxide semiconductor film, the shapes and positions of an oxide semiconductor film, a gate electrode, and source and drain electrodes, and the like can be appropriately changed.

[Structure of Oxide Semiconductor]

Next, a structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a highly purified intrinsic or substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film having a density of lower than 78% of the density of the single crystal oxide semiconductor.

Specific examples of the above description are given. For example, in the case of an oxide semiconductor film having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve highly favorable off-state current characteristics.

[Substrate 30]

The type of the substrate 30 is not limited to a certain type, and any of a variety of substrates can be used as the substrate 30. Examples of the substrate 30 include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, a bonding film, paper containing a fibrous material, and a base film. As an example of a glass substrate, a barium borosilicate glass substrate, an aluminoborosilicate glass substrate, a soda lime glass substrate, and the like can be given. Examples of a flexible substrate, a bonding film, a base film, and the like include substrates of plastics typified by polyethylene terephthalate (PET), polyethylene naphthalate (PEN), and polyether sulfone (PES). Another example is a substrate of a synthetic resin such as acrylic. Other examples are substrates of polypropylene, polyester, polyvinyl fluoride, and polyvinyl chloride. Other examples are substrates of polyamide, polyimide, aramid, epoxy, an inorganic vapor deposition film, and paper. Specifically, when a transistor is formed using a semiconductor substrate, a single crystal substrate, an SOI substrate, or the like, it is possible to form a transistor with a small variation in characteristics, size, shape, or the like and with a high current capability and a small size. By forming a circuit with the use of such a transistor, power consumption of the circuit can be reduced or the circuit can be highly integrated.

A base insulating film may be formed over the substrate 30 before the gate electrodes GE1 to GE3 are formed. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when a silicon nitride film, a gallium oxide film, a hafnium oxide film, an yttrium oxide film, an aluminum oxide film, or the like is used as the base insulating film, it is possible to suppress diffusion of impurities (typically, alkali metal, water, hydrogen, and the like) from the substrate 30 into the oxide semiconductor films OS1 to OS3.

[Gate Electrodes GE1, GE2, and GE3]

The gate electrodes GE1 to GE3 are a single-layer conductive film or a multilayer conductive film including two or more conductive films. The conductive film used for the gate electrodes GE1 to GE3 can be formed using a metal element selected from aluminum, chromium, copper, tantalum, titanium, molybdenum, and tungsten; an alloy containing any of these metal elements as a component; an alloy containing any of these metal elements in combination; or the like. Furthermore, one or more metal elements selected from manganese and zirconium may be used. Alternatively, an alloy film or a nitride film in which aluminum and one or more elements selected from titanium, tantalum, tungsten, molybdenum, chromium, neodymium, and scandium are combined may be used. The conductive film can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide.

An aluminum film containing silicon can be formed as the gate electrodes GE1 to GE3, for example. For the gate electrodes GE1 to GE3, for example, a two-layer structure in which a titanium film is formed over an aluminum film, a titanium film is formed over a titanium nitride film, a tungsten film is formed over a titanium nitride film, or a tungsten film is formed over a tantalum nitride film or a tungsten nitride film can be used. In addition, for example, a three-layer structure in which an aluminum film is sandwiched between titanium films may be employed for the gate electrodes GE1 to GE3.

The gate electrodes GE1 to GE3 are formed by a sputtering method, a vacuum evaporation method, a pulsed laser deposition (PLD) method, a thermal CVD method, or the like.

Note that a tungsten film can be formed with a deposition apparatus utilizing an ALD method. In that case, a WF$_6$ gas and a B$_2$H$_6$ gas are sequentially introduced more than once to form an initial tungsten film, and then, a WF$_6$ gas and an H$_2$ gas are used to form a tungsten film. Note that an SiH$_4$ gas may be used instead of a B$_2$H$_6$ gas.

The gate electrodes GE1 to GE3 can be formed by an electrolytic plating method, a printing method, an ink-jet method, or the like instead of the above formation methods.

[Insulating Film 34 (Gate Insulating Film)]

The insulating film 34 is formed so as to cover the gate electrodes GE1 to GE3. The insulating film 34 is a single layer or a multilayer (two or more layers). An oxide insulating film, a nitride insulating film, an oxynitride insulating film, a nitride oxide insulating film, or the like can be used as the insulating film 34. In this specification, oxynitride refers to a substance which contains more oxygen than nitrogen, and nitride oxide refers to a substance which contains more nitrogen than oxygen.

As an insulating film used as the insulating film 34, for example, an insulating film including silicon oxide, silicon oxynitride, silicon nitride oxide, silicon nitride, aluminum oxide, hafnium oxide, gallium oxide, a Ga—Zn-based metal oxide, or the like can be used. A film including a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide may also be used as the insulating film, in which case gate leakage current of the transistor can be reduced.

The insulating film 34 functions as a gate insulating film. A region of the insulating film 34 that is in contact with the oxide semiconductor films OS1 to OS3 is preferably formed using an oxide insulating film or an oxynitride insulating film in order to improve the interface characteristics between the oxide semiconductor films OS1 to OS3 and the gate insulating film. For example, the uppermost film of the insulating film 34 is a silicon oxide film or a silicon oxynitride film.

The thickness of the insulating film 34 is, for example, greater than or equal to 5 nm and less than or equal to 400 nm, preferably greater than or equal to 10 nm and less than or equal to 300 nm, more preferably greater than or equal to 50 nm and less than or equal to 250 nm.

In the case where the oxide semiconductor films OS1 to OS3 are formed by a sputtering method, a power source for generating plasma can be an RF power source, an AC power source, a DC power source, or the like as appropriate.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

A target may be appropriately selected in accordance with the compositions of the oxide semiconductor films OS1 to OS3.

In the case where the oxide semiconductor films OS1 to OS3 are formed by a sputtering method at a substrate temperature of higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor films 31 to 33 can each be a CAAC-OS film.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, preferably, the proportion of oxygen in the deposition gas is increased and the power is optimized in order to reduce plasma damage at the deposition. The proportion of oxygen in the deposition gas is preferably 30 vol % or higher, more preferably 100 vol %.

By forming the oxide semiconductor film while it is heated or performing heat treatment after the formation of the oxide semiconductor film, the hydrogen concentration of the oxide semiconductor film is $2×10^{20}$ atoms/cm$^3$ or lower, preferably $5×10^{19}$ atoms/cm$^3$ or lower, further preferably $1×10^{19}$ atoms/cm$^3$ or lower, still further preferably less than $5×10^{18}$ atoms/cm$^3$, yet still further preferably $1×10^{18}$ atoms/cm$^3$ or lower, yet still further preferably $5×10^{17}$ atoms/cm$^3$ or lower, yet still further preferably $1×10^{16}$ atoms/cm$^3$ or lower.

When the heat treatment is performed at temperatures higher than 350° C. and lower than or equal to 650° C., preferably higher than or equal to 450° C. and lower than or equal to 600° C., it is possible to obtain an oxide semiconductor film whose proportion of CAAC, which is described later, is greater than or equal to 70% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. This means that an oxide semiconductor film with a low impurity concentration and a low density of defect states can be formed.

The oxide semiconductor film can be formed with a deposition apparatus utilizing an ALD method. For example, in the case where an $InGaZnO_X$ (X>0) film is formed, an $In(CH_3)_3$ gas and an $O_3$ gas are sequentially introduced a plurality of times to form an $InO_2$ layer, a $Ga(CH_3)_3$ gas and an $O_3$ gas are used to form a GaO layer, and then, a $Zn(CH_3)_2$ gas and an $O_3$ gas are used to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. A $Zn(CH_3)_2$ gas may be used.

The oxide semiconductor films 32 and 33 are each a film where a channel of the transistor is formed, and the thickness of each film can be greater than or equal to 3 nm and less than or equal to 200 nm, preferably greater than or equal to 3 nm and less than or equal to 100 nm, more preferably greater than or equal to 30 nm and less than or equal to 50 nm. The thickness of the oxide semiconductor film 31 is, for example, greater than or equal to 3 nm and less than or equal to 100 nm, preferably greater than or equal to 3 nm and less than or equal to 30 nm, more preferably greater than or equal to 3 nm and less than or equal to 15 nm. The thickness of the oxide semiconductor film 31 is preferably smaller than those of the oxide semiconductor films 32 and 33.

Here, In—Ga—Zn films are formed by a sputtering method as the oxide semiconductor films 31 to 33. The atomic ratios of metal elements (In:Ga:Zn) of targets for forming the films are, for example, 1:3:6 for the oxide semiconductor film 31, 3:1:2 for the oxide semiconductor film 32, and 1:1:1.2 or 1:1:1 for the oxide semiconductor film 33. The thicknesses of the oxide semiconductor films 31, 32, and 33 are 5 nm, 35 nm, and 35 nm, respectively.

[Source Electrode and Drain Electrode]

The source and drain electrodes SE1, DE1, SE2, DE2, SE3, and DE3 can be formed in a manner similar to those of the gate electrodes GE1 to GE3.

For example, a 50-nm-thick copper-manganese alloy film, a 400-nm-thick copper film, and a 100-nm-thick copper-manganese alloy film are stacked in this order by a sputtering method, and three-layer source and drain electrodes can be formed.

[Insulating Films 35 and 36]

A two-layer insulating film can be formed as the insulating film 35. Here, the first film in the insulating film 35 is referred to as an insulating film 35a, and the second film in the insulating film 35 is referred to as an insulating film 35b.

As the insulating film 35a, an oxide insulating film including silicon oxide or the like, or an oxide insulating film containing nitrogen and having a small number of defects can be formed. Typical examples of the oxide insulating film containing nitrogen and having a small number of defects include a silicon oxynitride film and an aluminum oxynitride film.

In an ESR spectrum at 100 K or lower of the oxide insulating film having a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The width of the split between the first and second signals and the width of the split between the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the smaller the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

When the insulating film 35a contains a low content of nitrogen oxide, carrier traps at the interface between the insulating film 35a and the oxide semiconductor films OS1 to OS3 can be reduced. As a result, a shift in the threshold voltage of the transistor can be reduced, which leads to a reduced variation in the electrical characteristics of the transistor.

To improve the reliability of the transistor, the insulating film 35a preferably has a nitrogen concentration measured by SIMS of lower than or equal to $6\times10^{20}$ atoms/cm$^3$. This is because nitrogen oxide is unlikely to be generated in the insulating film 35a through the manufacturing process of the transistor.

A silicon oxynitride film, which is an example of an oxide insulating film containing nitrogen and having a small number of defects, can be formed by a CVD method as the insulating film 35a. In that case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

An oxide insulating film containing nitrogen and having a small number of defects can be formed as the insulating film 35a by a CVD method under the conditions where the flow rate of an oxidizing gas is more than 20 times and less than 100 times, preferably more than or equal to 40 times and less than or equal to 80 times, that of a deposition gas, and the pressure in a treatment chamber is lower than 100 Pa, preferably lower than or equal to 50 Pa.

The insulating film 35b can be formed using, for example, an oxide insulating film which contains oxygen in excess of that in the stoichiometric composition (excess oxygen). Part of oxygen of the oxide insulating film containing excess oxygen is released by heat treatment. The oxide insulating film containing excess oxygen is an oxide insulating film in which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness of greater than or equal to 30 nm and less than or equal to 500 nm, preferably greater than or equal to 50 nm and less than or equal to 400 nm can be used as the insulating film 35b. A silicon oxynitride film containing excess oxygen can be formed as the insulating film 35b by a CVD method.

The conditions for forming a silicon oxide film or a silicon oxynitride film as the insulating film 35b are as follows. The substrate placed in a treatment chamber of a plasma CVD apparatus, which is vacuum-evacuated, is held at a temperature of higher than or equal to 180° C. and lower than or equal to 280° C., preferably higher than or equal to 200° C. and lower than or equal to 240° C., the pressure is set to higher than or equal to 100 Pa and lower than or equal to 250 Pa, preferably higher than or equal to 100 Pa and lower than or equal to 200 Pa with introduction of a source gas into the treatment chamber, and a high-frequency power of higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the insulating film 36, a film having an effect of blocking at least hydrogen and oxygen is used. Preferably, the insulating film 36 has an effect of blocking oxygen, hydrogen, water, alkali metal, alkaline earth metal, and the like. Typically, a nitride insulating film such as a silicon nitride film, a silicon nitride oxide film, an aluminum nitride film, or an aluminum nitride oxide film can be used.

The insulating film 36 may include an oxide insulating film having an effect of blocking oxygen, hydrogen, water, and the like. As such an oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

The thickness of the insulating film 36 may be greater than or equal to 50 nm and less than or equal to 300 nm, preferably greater than or equal to 100 nm and less than or equal to 200 nm. The insulating film 36 that has an effect of blocking oxygen, hydrogen, water, and the like can prevent oxygen diffusion from the oxide semiconductor films 31 to 33 to the outside and entry of hydrogen, water, and the like from the outside to the oxide semiconductor films 31 to 33.

In the case where a silicon nitride film is formed by a plasma CVD method as the insulating film 36, a deposition gas containing silicon, nitrogen, and ammonia are preferably used as a source gas. When these source gases are used, ammonia is dissociated in the plasma and activated species are generated. The activated species cut a bond between silicon and hydrogen which are contained in the deposition gas containing silicon and a triple bond between nitrogen molecules. As a result, a dense silicon nitride film having a small number of defects, in which bonds between silicon and nitrogen are promoted and the number of bonds between silicon and hydrogen is small, can be formed. On the other hand, when the amount of ammonia with respect to nitrogen is large in a source gas, decomposition of the deposition gas containing silicon and decomposition of nitrogen are not promoted, so that a sparse silicon nitride film in which bonds between silicon and hydrogen remain and the amount of defects is increased is formed. Therefore, in a source gas, the flow ratio of nitrogen to ammonia is set to preferably greater than or equal to 5 and less than or equal to 50, more preferably greater than or equal to 10 and less than or equal to 50.

Heat treatment may be performed after the insulating film 35 is formed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C. By the heat treatment, oxygen contained in the oxide insulating film which is the second layer of the insulating film 35 can move to the oxide semiconductor films 31 to 33, so that the amount of oxygen vacancies contained in these oxide semiconductor films can be reduced. The heat treatment is performed at 350° C. in a mixed gas atmosphere containing nitrogen and oxygen for one hour.

Heat treatment to release hydrogen and the like from the oxide semiconductor films 31 to 33 may be performed after the insulating film 36 is formed. The heat treatment may be performed at 350° C. in a mixed gas atmosphere containing nitrogen and oxygen for one hour.

[Backgate Electrode]

The backgate electrodes BGE1 and BGE2 can be formed in a manner similar to that of the gate electrodes GE1 to GE3.

Other structure examples of transistors will be described below.

(Transistors TA3 and TA4)

Figure 29B:
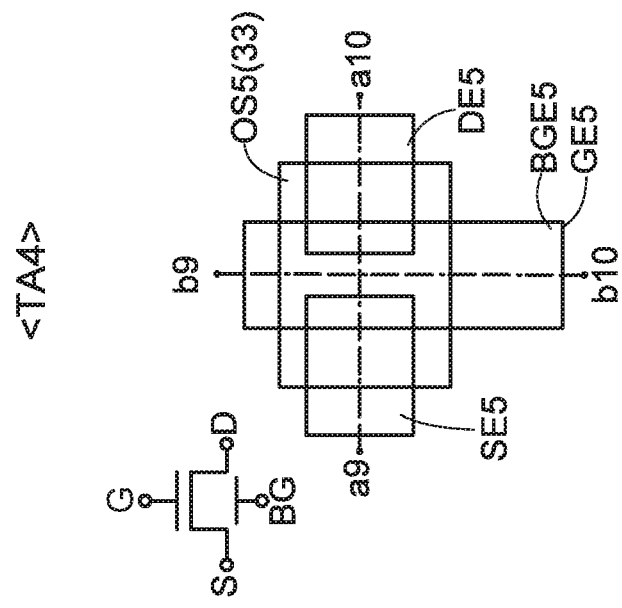
FIGS. 29A and 29B are top views of transistors.
Figure 29A:
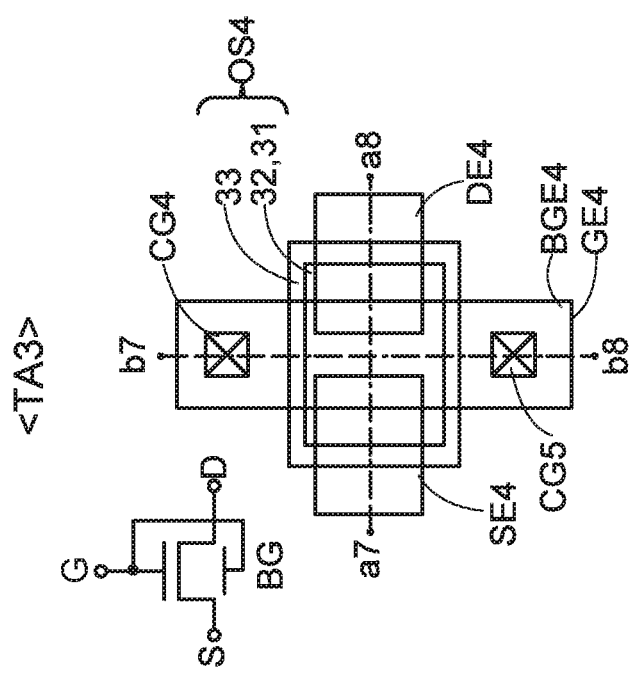
Figure 30A:
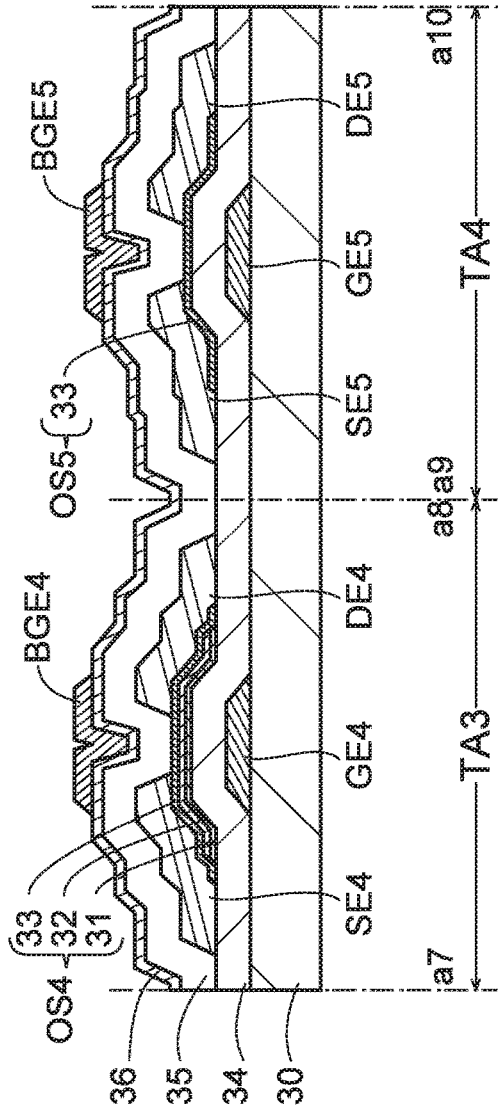
FIGS. 30A and 30B are cross-sectional views of transistors.
Figure 30B:
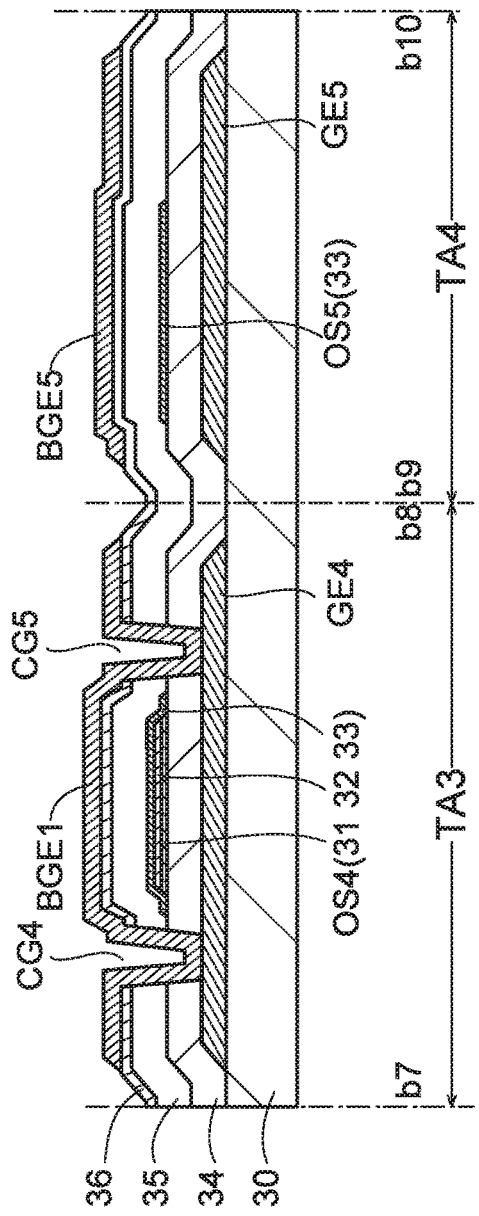

FIGS. 29A and 29B respectively illustrate top views (layouts) and circuit symbols of transistors TA3 and TA4. FIGS. 30A and 30B are cross-sectional views of the transistor TA3 along the lines a7-a8 and b7-b8 and the transistor TA4 along the lines a9-a10 and b9-b10.

The transistor TA3 includes a gate electrode GE4, an oxide semiconductor film OS4, a source electrode SE4, a drain electrode DE4, and a backgate electrode BGE4. The transistor TA3 is a modification example of the transistor TA1 and similar to the transistor TA1 except that the backgate electrode BGE4 is in contact with the gate electrode GE4 through two openings CG4 and CG5. As illustrated in FIG. 30B, the oxide semiconductor film OS4 is surrounded by the gate electrode GE4 and the backgate electrode BGE4 in the channel width direction, which can increase the strength of the transistor TA3.

The transistor TA4 includes a gate electrode GE5, an oxide semiconductor film OS5, a source electrode SE5, a drain electrode DE5, and a backgate electrode BGE5. The transistor TA4 is a modification example of the transistor TA2. Unlike in the transistor TA2, the backgate electrode BGE5 is not connected to the gate electrode GE5, and thus, different signals or potentials can be input to the backgate electrode BGE5 and the gate electrode GE5. For example, a signal for controlling the state of conduction of the transistor TA4 is input to the gate electrode GE5, whereas a signal or a potential for correcting the threshold voltage of the transistor TA4 is input to the backgate electrode BGE5.

(Transistors TC1, TB2, and TD1)

FIGS. 31A, 31B, and 31C respectively illustrate top views (layouts) and circuit symbols of transistors TC1, TB2, and TD1. FIGS. 32A and 32B are cross-sectional views of the transistor TC1 along the lines a11-a12 and b11-b12, the transistor TB2 along the lines a13-a14 and b13-b14, and the transistor TD1 along the lines a15-a16 and b15-b16.

The transistor TC1 includes a gate electrode GE6, an oxide semiconductor film OS6, a source electrode SE6, a drain electrode DE6, and a backgate electrode BGE6. The backgate electrode BGE6 is in contact with the gate electrode GE6 through an opening CG6. The transistor TC1 is a modification example of the transistor TA1, in which the oxide semiconductor film OS6 has a two-layer structure of the oxide semiconductor films 32 and 33. A channel formation region of the transistor TC1 is formed in the oxide semiconductor film 32, as in the transistor TA1. The field-effect mobility of the transistor TC1 is thus as high as that of the transistor TA1, i.e., for example, higher than 10 cm$^2$/Vs and lower than 60 cm$^2$/Vs, preferably higher than or equal to 15 cm$^2$/Vs and lower than 50 cm$^2$/Vs. Like the transistor TA1, the transistor TC1 is suitable for a high-speed transistor in a driver circuit.

The transistor TB2 includes a gate electrode GE7, an oxide semiconductor film OS7, a source electrode SE7, a drain electrode DE7, and a backgate electrode BGE7. The backgate electrode BGE7 is in contact with the gate electrode GE7 through an opening CG7. The transistor TB2 is a modification example of the transistor TB1 and differs from the transistor TB1 in including the backgate electrode BGE7. Since the transistor TB2 includes the backgate electrode BGE7 connected to the gate electrode GE7, the transistor TB2 has a higher on-state current and a higher mechanical strength than the transistor TB1.

The transistor TD1 includes a gate electrode GE8, an oxide semiconductor film OS8, a source electrode SE8, and a drain electrode DE8. The transistor TD1 is a modification example of the transistor TB1 and differs from the transistor TB1 in that the entire oxide semiconductor film OS8 overlaps with the gate electrode GE8 and the oxide semiconductor film OS8 does not exist outside an end portion of the gate electrode GE8. With this structure, the transistor TD1 is suitable for a pixel portion because the oxide semiconductor film OS8 in the transistor TD1 is less exposed to light than in the transistor TB1.

A structure in which a channel formation region (an active layer region) is electrically surrounded by electric fields of gate electrodes above and below the channel formation region in a cross-sectional view in the channel width direction, like those of the transistors TA1, TA2, TA3, TC1, and TB2, is referred to as a surrounded channel (s-channel) structure. In an s-channel structure, a large amount of current can flow between a source and a drain of a transistor, so that the transistor can have a high on-state current.

In the case of using an s-channel transistor including an oxide semiconductor in a channel formation region, variation in threshold voltage among the transistors is small. The s-channel transistor is highly resistant to negative gate bias temperature (NGBT) stress and positive gate bias temperature (PGBT) stress. In the s-channel transistor, a drain-induced barrier lowering (DIBL) effect is suppressed, and the transistor is less affected by a short-channel effect. The s-channel transistor has a high drain withstand voltage and exhibits favorable $I_d$-$V_d$ saturation characteristics ($I_d$ is drain current, and $V_d$ is drain voltage). The s-channel transistor has favorable switching characteristics and a small sub-threshold swing in $I_d$-$V_g$ characteristics ($V_g$ is gate voltage).

The channel length of a transistor operated at high speed, such as a transistor used in a driver circuit or the like in a light-emitting device, is preferably short as in the transistor TA1, TA2, TA3, TA4, or TC1. The channel length of such a transistor is preferably shorter than 2.5 μm, for example, shorter than or equal to 2.2 μm. The channel length of the transistor in this embodiment depends on the distance between a source electrode and a drain electrode, and the minimum value of the channel length is limited by the accuracy of processing a conductive film to be source and drain electrodes. The channel length of the transistor in this embodiment can be thus longer than or equal to 0.5 μm, or longer than or equal to 1.0 μm, for example.

<Structure Example 2 of Transistor>

A transistor used in the display device of one embodiment of the present invention may include a channel formation region in a semiconductor film or a semiconductor substrate of silicon, germanium, or the like in an amorphous, microcrystalline, polycrystalline, or single crystal state. In the case where a transistor is formed using a thin silicon film, any of the following can be used: amorphous silicon deposited by a sputtering method or a vapor phase growth method such as a plasma CVD method, polycrystalline silicon obtained by crystallization of amorphous silicon by treatment such as laser annealing, single crystal silicon obtained by separation of a surface portion of a single crystal silicon wafer by implantation of hydrogen ions or the like into the silicon wafer, and the like.

Figure 33A:
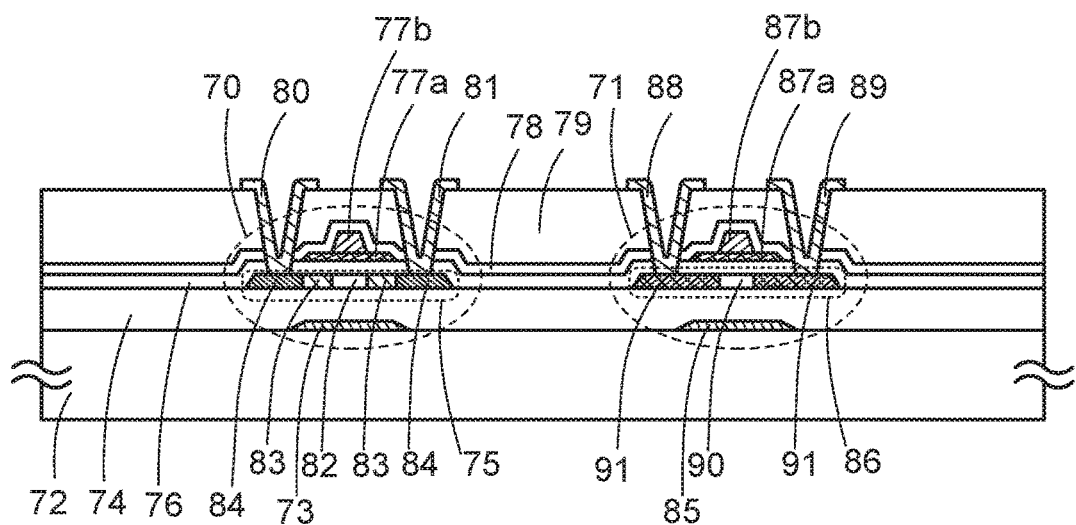
FIGS. 33A and 33B are cross-sectional views of transistors.
Figure 33B:
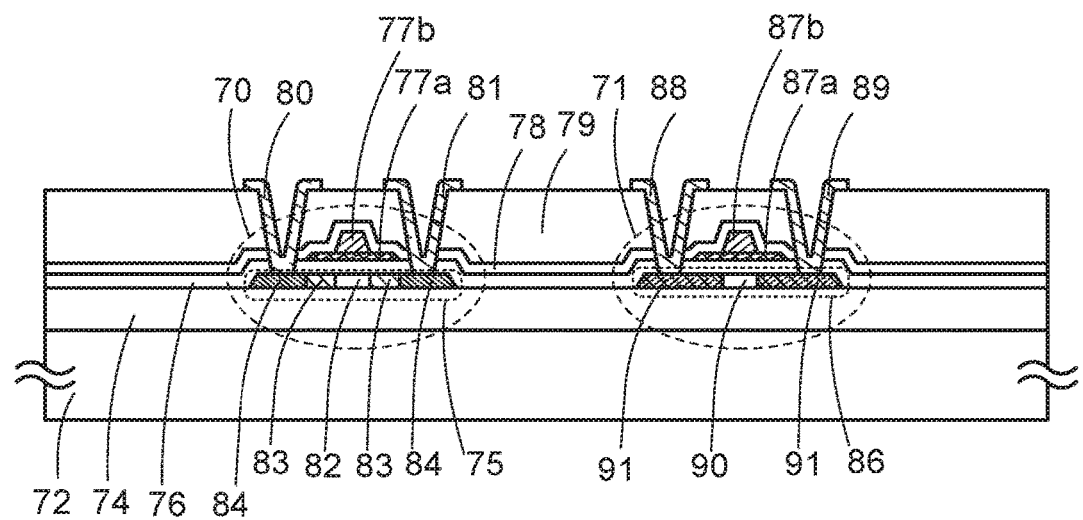

FIGS. 33A and 33B are each a cross-sectional view of transistors each including a thin silicon film, which can be used in the display device of one embodiment of the present invention. FIGS. 33A and 33B illustrate an n-channel transistor 70 and a p-channel transistor 71.

The transistor 70 includes, over a substrate 72 having an insulating surface, a conductive film 73 functioning as a gate electrode, an insulating film 74 over the conductive film 73, a semiconductor film 75 overlapping with the conductive film 73 with the insulating film 74 provided therebetween, an insulating film 76 over the semiconductor film 75, a conductive film 77a and a conductive film 77b overlapping with the semiconductor film 75 with the insulating film 76 provided therebetween and functioning as a gate electrode, an insulating film 78 over the conductive films 77a and 77b, an insulating film 79 over the insulating film 78, and a conductive film 80 and a conductive film 81 electrically connected to the semiconductor film 75 through openings in the insulating films 78 and 79 and functioning as a source and a drain.

The width in the channel length direction of the conductive film 77b is shorter than that of the conductive film 77a. The conductive films 77a and 77b are stacked in this order from the insulating film 76 side. The semiconductor film 75 includes a channel formation region 82 overlapping with the conductive film 77b, a pair of lightly doped drain (LDD) regions 83 between which the channel formation region 82 is sandwiched, and a pair of impurity regions 84 between which the channel formation region 82 and the LDD regions 83 are sandwiched. The pair of impurity regions 84 function as a source region and a drain region. An impurity element imparting n-type conductivity to the semiconductor film 75, such as boron (B), aluminum (Al), or gallium (Ga), is added to the LDD regions 83 and the impurity regions 84.

The transistor 71 includes, over the substrate 72 having an insulating surface, a conductive film 85 functioning as a gate electrode, the insulating film 74 over the conductive film 85, a semiconductor film 86 overlapping with the conductive film 85 with the insulating film 74 provided therebetween, the insulating film 76 over the semiconductor film 86, a conductive film 87a and a conductive film 87b overlapping with the semiconductor film 86 with the insulating film 76 provided therebetween and functioning as a gate electrode, the insulating film 78 over the conductive films 87a and 87b, the insulating film 79 over the insulating film 78, and a conductive film 88 and a conductive film 89 electrically connected to the semiconductor film 86 through openings in the insulating films 78 and 79 and functioning as a source and a drain.

The width in the channel length direction of the conductive film 87b is shorter than that of the conductive film 87a. The conductive films 87a and 87b are stacked in this order from the insulating film 76 side. The semiconductor film 75 includes a channel formation region 90 overlapping with the conductive film 87b, and a pair of impurity regions 91 between which the channel formation region 90 is sandwiched. The pair of impurity regions 91 function as a source region and a drain region. An impurity element imparting p-type conductivity to the semiconductor film 86, such as phosphorus (P) or arsenic (As), is added to the impurity regions 91.

Note that the semiconductor film 75 or 86 may be crystallized by various techniques. Examples of the various techniques of crystallization include a laser crystallization method using a laser beam and a crystallization method using a catalyst element. Alternatively, a crystallization method using a catalyst element and a laser crystallization method may be combined. In the case of using a thermally stable substrate such as quartz for the substrate 72, any of the following crystallization methods can be used in combination: a thermal crystallization method with an electrically-heated oven, a lamp annealing crystallization method with infrared light, a crystallization method with a catalyst element, and high temperature annealing at about 950° C.

Although FIG. 33A illustrates a structure in which the conductive films 77a and 77b function as a gate electrode and the conductive film 73 functions as a backgate electrode, other structures may be employed. For example, the conductive film 73 functioning as a backgate electrode may be omitted as illustrated in FIG. 33B. Although FIG. 33A illustrates a structure in which the conductive films 87a and 87b function as a gate electrode and the conductive film 85 functions as a backgate electrode, other structures may be employed. For example, the conductive film 85 functioning as a backgate electrode may be omitted as illustrated in FIG. 33B. Note that the structure illustrated in FIG. 33B can be used for an OS transistor.

Figure 34A:
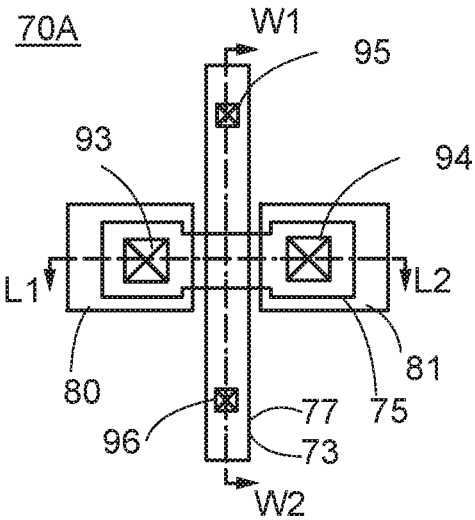
FIGS. 34A to 34C are a top view and cross-sectional views of a transistor.

FIG. 34A is a top view of a transistor 70A which corresponds to the n-channel transistor 70 illustrated in FIG. 33A.

Figure 34B:
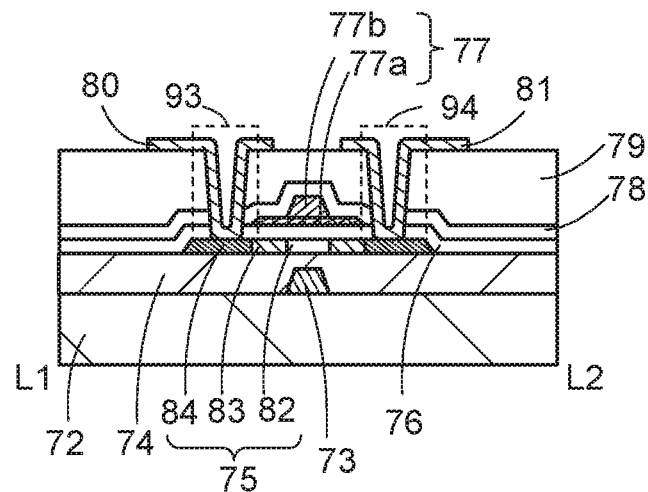
Figure 34C:
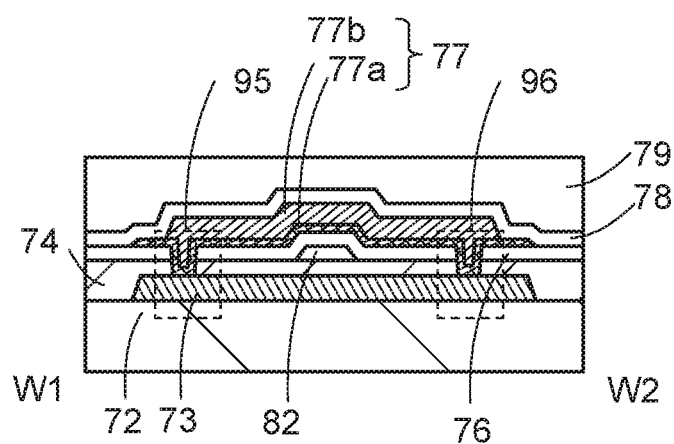

FIG. 34B is a cross-sectional view taken along the line L1-L2 in the channel length direction of the transistor 70A. FIG. 34C is a cross-sectional view taken along the line W1-W2 in the channel width direction of the transistor 70A.

FIG. 34A illustrates a conductive film 77, the conductive film 73, the semiconductor film 75, the conductive film 80, the conductive film 81, an opening 93, an opening 94, an opening 95, and an opening 96. The conductive film 77 functions as a gate electrode. The conductive film 73 functions as a backgate electrode. Details of the components denoted by the same reference numerals as those in FIG. 33A are omitted in the description of FIG. 34A. The openings 93 and 94 are openings for connecting the semiconductor film 75 and the conductive films 80 and 81. The openings 95 and 96 are openings for electrically connecting the conductive films 77 and 73.

As illustrated in FIG. 34B, the transistor 70A includes, over the substrate 72, the conductive film 73, the insulating film 74, the semiconductor film 75 overlapping with the conductive film 73 with the insulating film 74 provided therebetween, the insulating film 76 over the semiconductor film 75, the conductive films 77a and 77b overlapping with the semiconductor film 75 with the insulating film 76 provided therebetween and functioning as a gate electrode, the insulating film 78 over the conductive films 77a and 77b, the insulating film 79 over the insulating film 78, and the conductive films 80 and 81 electrically connected to the semiconductor film 75 through the openings 93 and 94 in the insulating films 78 and 79 and functioning as a source and a drain. Details of the components denoted by the same reference numerals as those in FIG. 33A are omitted in the description of FIG. 34B.

As illustrated in FIG. 34B, the transistor 70A includes, over the substrate 72, the conductive film 73, the insulating film 74, the semiconductor film 75 overlapping with the conductive film 73 with the insulating film 74 provided therebetween, the insulating film 76 over the semiconductor film 75, the conductive films 77a and 77b overlapping with the semiconductor film 75 with the insulating film 76 provided therebetween and functioning as a gate electrode, the insulating film 78 over the conductive films 77a and 77b, the insulating film 79 over the insulating film 78, and the conductive films 80 and 81 electrically connected to the semiconductor film 75 through the openings 93 and 94 in the insulating films 78 and 79 and functioning as a source and a drain. The semiconductor film 75 includes the channel formation region 82, the pair of LDD regions 83, and the pair of impurity regions 84. The pair of impurity regions 84 function as a source region and a drain region. Details of the components denoted by the same reference numerals as those in FIG. 33A are omitted in the description of FIG. 34B.

FIG. 34C illustrates, over the substrate 72, the conductive film 73, the insulating film 74, the channel formation region 82, the insulating film 76, the conductive films 77a and 77b electrically connected to the conductive film 73 through the openings 95 and 96, the insulating film 78 over the conductive films 77a and 77b, and the insulating film 79 over the insulating film 78. Details of the components denoted by the same reference numerals as those in FIG. 33A are omitted in the description of FIG. 34C.

The structure illustrated in the top view and the cross-sectional views of FIGS. 34A to 34C is an s-channel structure in which the conductive film 77 and the conductive film 73 electrically connected to the conductive film 77 electrically surround the channel formation region 82 of the semiconductor film 75 in the channel width direction. In the s-channel structure, the conductive films wrap around the top surface, the bottom surface, and the side surfaces of the channel formation region. Such a structure can increase the on-state current and reduce the size in the channel width direction. Besides, such a structure in which the channel formation region is surrounded by the conductive films can easily block light and thus can suppress photoexcitation caused by undesired light irradiation in the channel formation region.

In addition, the structure illustrated in the top view and the cross-sectional views of FIGS. 34A to 34C can avoid an accidental electrical connection at the ends of the semiconductor film 75 in the W1-W2 direction caused by an undesired increase in conductivity. The influence of non-uniform distribution of the impurity element added to the semiconductor film 75 can also be reduced.

Although the structure illustrated in the top view and the cross-sectional views of FIGS. 34A to 34C includes a gate electrode and a backgate electrode electrically connected to each other, different voltages may also be applied to them, which is particularly effective in a circuit in which all transistors are n-channel transistors. That is, the threshold voltage of a transistor can be controlled by applying a voltage to a backgate electrode; thus, a logic circuit, such as an inverter circuit, can be formed using ED-MOS transistors whose threshold voltages are different from each other. The area occupied by a pixel driver circuit using such a logic circuit can be reduced, leading to a narrower frame of a display device. In addition, when the voltage of the backgate electrode is set so that a transistor is turned off, the off-state current of the transistor can be further reduced. Therefore, even when the frequency of refresh of the display device is reduced, written voltage can be maintained, and accordingly, the number of writings can be reduced, leading to low power consumption of the display device.

Figure 35A:
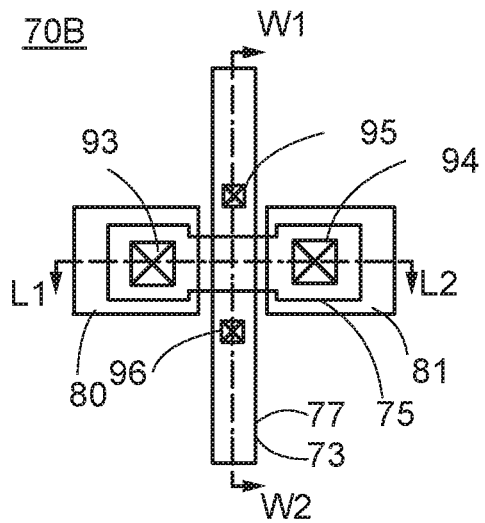
FIGS. 35A to 35C are a top view and cross-sectional views of a transistor.
Figure 35B:
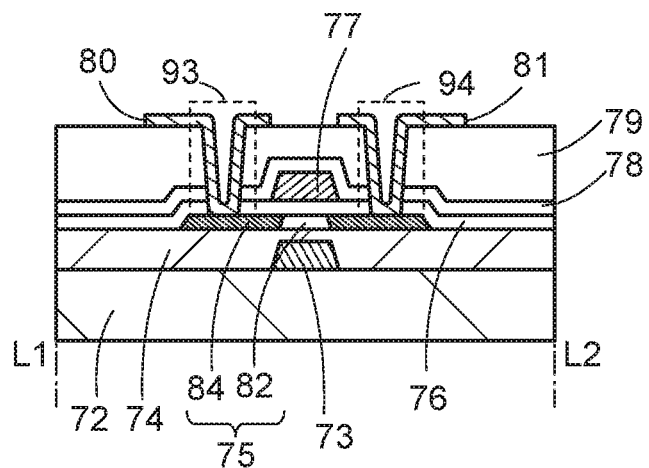
Figure 35C:
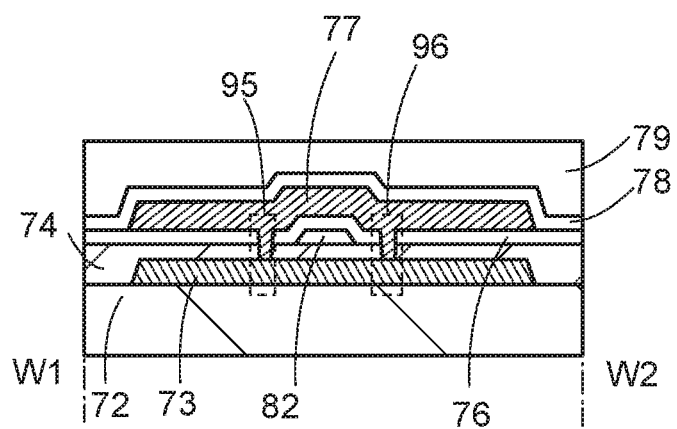

Note that the top view and the cross-sectional views of FIGS. 34A to 34C illustrate just one example, and other structures can be employed. FIGS. 35A to 35C are a top view and cross-sectional views different from those of FIGS. 34A to 34C.

Different points of the structure illustrated in FIGS. 35A to 35C from the structure illustrated in FIGS. 34A to 34C are as follows: the conductive film 77 functioning as a gate electrode is a single layer, and the openings 95 and 96 are closer to the channel formation region 82. Such a structure facilitates application of an electric field to the channel formation region from the top, bottom, and side surfaces thereof. Effects similar to those of the structure in FIGS. 34A to 34C can also be obtained from the structure illustrated in FIGS. 35A to 35C.

Figure 36A:
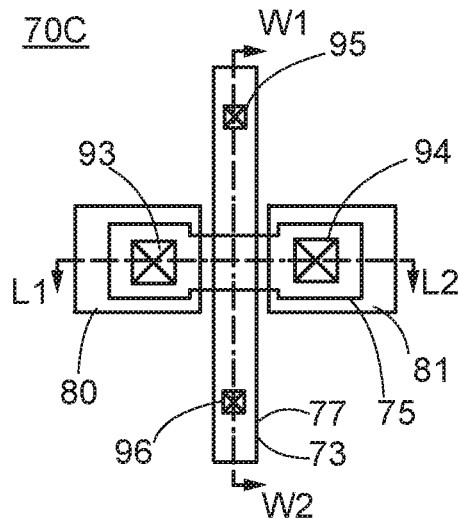
FIGS. 36A to 36C are a top view and cross-sectional views of a transistor.
Figure 36B:
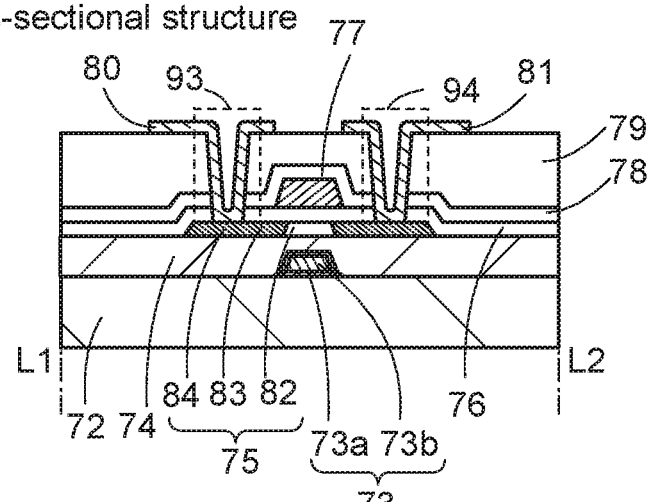
Figure 36C:
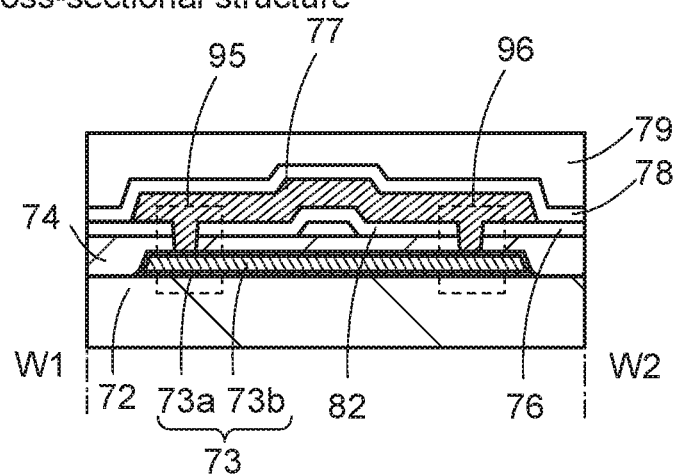

FIGS. 36A to 36C illustrate a top view and cross-sectional views of a structure different from the structures illustrated in FIGS. 34A to 34C and FIGS. 35A to 35C.

A different point of the structure illustrated in FIGS. 36A to 36C from the structures illustrated in FIGS. 34A to 34C and FIGS. 35A to 35C is as follows: the conductive film 73 functioning as a backgate electrode includes a conductive film 73a and a conductive film 73b which is surrounded by the conductive film 73a. Effects similar to those of the structure in FIGS. 34A to 34C can also be obtained from the structure illustrated in FIGS. 36A to 36C.

In addition, even when the conductive film 73b contains a movable element (e.g., copper (Cu)), the structure illustrated in FIGS. 36A to 36C can prevent the movable element from entering the semiconductor film and causing degradation of the semiconductor film.

As a material for the conductive film 73a, which functions as a barrier film and is provided over the formation surface of the wiring, any of tungsten (W), molybdenum (Mo), chromium (Cr), titanium (Ti), and tantalum (Ta), which are high melting point materials, an alloy thereof (e.g., W—Mo, Mo—Cr, or Ta—Mo) or a nitride thereof (e.g., tungsten nitride, titanium nitride, tantalum nitride, or TiSiN$_x$), or the like can be used. A sputtering method, a CVD method, or the like can be adopted as the formation method. As a material for the conductive film 73$b$, copper (Cu) is preferable; however, there is no particular limitation as long as it is a low resistance material. For example, silver (Ag), aluminum (Al), gold (Au), or an alloy thereof can be used. As the formation method of the conductive film 73$b$, a sputtering method is preferable; however, a CVD method can be adopted as long as conditions that do not damage a resist mask are selected.

Each of the transistors illustrated in FIGS. 34A to 34C, FIGS. 35A to 35C, and FIGS. 36A to 36C has an s-channel structure. In the case of using an s-channel transistor including silicon in a channel formation region, the on-state current is high, and variation in threshold voltage among the transistors is small. In such an s-channel transistor, a DIBL effect is suppressed, and the transistor is less affected by a short-channel effect. In addition, such an s-channel transistor is less affected by impact ions and thus has a high drain withstand voltage. Therefore, such an s-channel transistor exhibits favorable $I_d$-$V_d$ saturation characteristics, and moreover, favorable switching characteristics and a small sub-threshold swing in $I_d$-$V_g$ characteristics.

<Manufacturing Process of Transistor>

Described below using cross-sectional views is an example of a manufacturing process of the above-described transistor including a backgate electrode, which is described with reference to FIGS. 33A and 33B, FIGS. 34A to 34C, FIGS. 35A to 35C, and FIGS. 36A to 36C, and a light-emitting element provided over the transistor.

First, a conductive film 502 functioning as a backgate electrode is formed over an insulating surface of a substrate 501 as illustrated in FIG. 37A. The conductive film 502 can be formed using a conductive material containing one or more elements selected from Al, W, Mo, Ti, and Ta. Although tungsten is used for the conductive film 502 in this embodiment, a film in which tungsten is stacked over tantalum nitride may also be used. The conductive film 502 may include a plurality of films without limitation to a single film.

As the substrate 501, for example, a glass substrate made of barium-borosilicate glass or alumino-borosilicate glass, a quartz substrate, a ceramic substrate, or the like can be used. A metal substrate or a silicon substrate each having an insulating film formed over its surface may also be used. Although a substrate formed of a flexible synthetic resin such as plastics generally has a lower resistance temperature than the aforementioned substrates, it may be used as long as being resistant to a processing temperature during the manufacturing process.

Next, an insulating film 503 is formed so as to cover the conductive film 502. The insulating film 503 includes an insulating film 503$a$ and an insulating film 503$b$ stacked thereover. A silicon oxynitride film is used as the insulating film 503$a$, for example. A silicon oxide film or a silicon oxynitride film is used as the insulating film 503$b$, for example. Note that the insulating film 503 is not limited to this structure and may include a single insulating film or three or more insulating films. The material is not limited to the above, either.

The surface of the insulating film 503 (i.e., the surface of the insulating film 503$b$) may have projections and depressions because of the conductive film 502 that has been formed. In that case, it is preferable to provide a step of planarizing the projections and depressions. In this embodiment, chemical-mechanical polishing (CMP) is performed for the planarization.

Next, an amorphous semiconductor film 504 is formed over the insulating film 503 by a plasma CVD method. Depending on the amount of hydrogen contained in the amorphous semiconductor film 504, dehydrogenation treatment is desirably performed before a crystallization step. The dehydrogenation treatment is preferably performed for several hours at a heating temperature of 400° C. to 550° C. so that the amount of hydrogen is reduced to less than or equal to 5 atomic %. Alternatively, a sputtering method, an evaporation method, or the like may be used for forming the amorphous semiconductor film. In any case, impurity elements contained in the film, such as oxygen and nitrogen, are desirably reduced to a sufficient level.

For example, silicon germanium can be used as the semiconductor without limitation to silicon. In the case of using silicon germanium, the concentration of germanium is preferably approximately 0.01 atomic % to 4.5 atomic %.

Note that when the insulating film 503 and the amorphous semiconductor film 504 are formed by a plasma CVD method, these films can be successively formed without exposure to the air. Such a successive deposition can minimize contamination of the surface with the air, so that variation in characteristics of the transistor can be reduced.

Next, a catalyst is added to the amorphous semiconductor film 504. In this embodiment, a nickel acetate solution containing nickel of 1 ppm to 100 ppm by weight is applied by a spinner. Note that the following treatment may be performed so as to apply the nickel acetate solution sufficiently: the surface of the amorphous semiconductor film 504 is processed using an aqueous solution containing ozone to form an extremely thin oxide film thereon; the oxide film is etched away with a mixed solution of hydrofluoric acid and hydrogen peroxide water to obtain a clean surface; then, treatment using an aqueous solution containing ozone is performed again to form an extremely thin oxide film. Although the surface of the semiconductor film is hydrophobic, the nickel acetate solution can be applied uniformly thereon by forming the oxide film in the above manner. The above is the description of FIG. 37A.

Needless to say, the method for adding a catalyst to the amorphous semiconductor film is not limited to the above, and a sputtering method, an evaporation method, plasma treatment, or the like may be used.

Next, heat treatment is performed at 500° C. to 650° C. for 4 hours to 24 hours (e.g., at 570° C. for 14 hours), whereby a nickel-containing layer 505 enhances the crystallization. Thus, a highly crystallized semiconductor film is formed.

As a method for the heat treatment, a furnace annealing method using an electrically heated furnace, or an RTA method using a halogen lamp, a metal halide lamp, a xenon arc lamp, a carbon arc lamp, a high-pressure sodium lamp, a high-pressure mercury lamp, or the like can be employed. Alternatively, RTA using a heated inert gas can be used.

In the case of an RTA method, a lamp light source for heating is turned on for 1 second to 60 seconds, preferably 30 seconds to 60 seconds, which is repeated 1 to 10 times, preferably 2 to 6 times. The lamp light source may have any light intensity as long as the amorphous semiconductor film 504 can be heated instantaneously to about 600° C. to 1000° C., preferably about 650° C. to 750° C. The semiconductor film is only instantaneously heated to such high temperature, and there is no change in the shape of the substrate 501.

In the case of a furnace annealing method, heat treatment at 500° C. for about one hour is performed first to release hydrogen from the amorphous semiconductor film 504. Then, heat treatment is performed in an electrically heated furnace in a nitrogen atmosphere at higher than or equal to 550° C. and lower than or equal to 600° C., preferably 580° C., for four hours, thereby crystallizing the amorphous semiconductor film 504.

Note that a catalyst element other than nickel (Ni), which is used in this embodiment, such as germanium (Ge), iron (Fe), palladium (Pd), tin (Sn), lead (Pb), cobalt (Co), platinum (Pt), copper (Cu), or gold (Au), may also be used.

Next described is gettering of a catalyst element which exists in a crystalline semiconductor film 506. After the crystallization using the catalyst element, the catalyst element (here, nickel) probably remains in the crystalline semiconductor film 506 at an average concentration of higher than $1 \times 10^{19}/cm^3$. The remaining catalyst element can adversely affect the transistor characteristics, and thus, a process for reducing the concentration of the catalyst element is required.

Among a variety of gettering methods, an example described in this embodiment is gettering before the crystalline semiconductor film 506 is patterned. First, a barrier layer 507 is formed over the surface of the crystalline semiconductor film 506 as illustrated in FIG. 37B. The barrier layer 507 is provided to prevent the crystalline semiconductor film 506 from being etched in a later step of removing a gettering site.

The thickness of the barrier layer 507 is approximately 1 nm to 10 nm. Chemical oxide formed by treatment using ozone water may be used as the barrier layer. Chemical oxide can also be formed by treatment using a mixed aqueous solution of hydrogen peroxide solution and sulfuric acid, hydrochloric acid, nitric acid, or the like. Alternatively, plasma treatment in an oxidizing atmosphere, oxidation treatment in which ozone is generated by ultraviolet light irradiation in an oxygen-containing atmosphere, or the like can be used. A thin oxide film formed in a clean oven at a heating temperature of about 200° C. to 350° C. may also be used as the barrier layer. Alternatively, an oxide film serving as a barrier layer may be deposited by a plasma CVD method, a sputtering method, an evaporation method, or the like to have a thickness of about 1 nm to 5 nm. In any case, a film through which the catalyst element can move to the gettering site side in the gettering step and which is not impregnated with an etchant (i.e., protects the crystalline semiconductor film 506 from an etchant) in the step of removing the gettering site may be used. Examples of such a film include a chemical oxide film formed by treatment using ozone water, a silicon oxide ($SiO_x$) film, and a porous film.

Next, as a gettering site 508, a gettering semiconductor film (typically, an amorphous silicon film) containing a rare gas element at a concentration of higher than or equal to $1 \times 10^{20}/cm^3$ and having a thickness of 25 nm to 250 nm is formed over the barrier layer 507 by a sputtering method. A low-density film is preferably formed so that the gettering site 508, which is removed later, is etched more preferentially than the crystalline semiconductor film 506.

Note that a rare gas element does not adversely affect the crystalline semiconductor film 506 because the rare gas element itself is inert in the semiconductor film. The rare gas element may be one or more of helium (He), neon (Ne), argon (Ar), krypton (Kr), and xenon (Xe).

Then, heat treatment is performed for gettering (FIG. 37B). A furnace annealing method, an RTA method, or the like is used for the heat treatment. In the case of a furnace annealing method, the heat treatment is performed at 450° C. to 600° C. for 0.5 hours to 12 hours in a nitrogen atmosphere. In the case of an RTA method, a lamp light source for the heating is turned on for 1 second to 60 seconds, preferably 30 seconds to 60 seconds, which is repeated 1 to 10 times, preferably 2 to 6 times. The lamp light source may have any light intensity as long as the semiconductor film can be heated instantaneously to about 600° C. to 1000° C., preferably about 700° C. to 750° C.

By the heat treatment, the catalyst element in the crystalline semiconductor film 506 is released by thermal energy and diffused toward the gettering site 508 as shown by the arrows. Thus, the gettering efficiency depends on the treatment temperature; the higher the treatment temperature is, the faster the gettering proceeds.

After the gettering process is finished, the gettering site 508 is selectively etched and removed. As the etching, dry etching using $ClF_3$ without plasma or wet etching using an alkaline solution such as an aqueous solution containing hydrazine or tetramethyl ammonium hydroxide (chemical formula: $(CH_3)_4NOH$) can be performed. The barrier layer 507 functions as an etching stopper in this step and is then removed using fluoric acid (FIG. 37C).

After the barrier layer 507 is removed, the crystalline semiconductor film 506 is patterned to form island-shaped semiconductor films 509 and 510 (FIG. 37D). The thickness of the semiconductor films 509 and 510 is 25 nm to 100 nm, preferably 30 nm to 60 nm. Then, an insulating film 511 is formed so as to cover the semiconductor films 509 and 510. Since the insulating film 511 will be reduced in thickness by about 10 nm to 40 nm by dry etching which is performed later for forming an electrode functioning as a gate electrode, the thickness of the insulating film 511 is desirably determined in consideration of the reduction in thickness. Specifically, the insulating film 511 is formed to have a thickness of 40 nm to 150 nm, preferably 60 nm to 120 nm.

For example, silicon oxide, silicon nitride, silicon nitride oxide, or the like can be used for the insulating film 511. Although the case where the insulating film 511 is formed using a single insulating film is described in this embodiment, the insulating film 511 may be formed using two or more insulating films. As the film-forming method, a plasma CVD method, a sputtering method, or the like can be used. For example, in the case where the insulating film 511 is formed using silicon oxide by a plasma CVD method, a mixed gas of TEOS (tetraethyl orthosilicate) and $O_2$ is used, the reaction pressure is 40 Pa, the substrate temperature is 300° C. to 400° C., and the high-frequency (13.56 MHz) power density is 0.5 $W/cm^2$ to 0.8 $W/cm^2$.

Aluminum nitride can be used for the insulating film 511. Aluminum nitride has comparatively high thermal conductivity and can efficiently diffuse heat generated in a transistor. Further alternatively, silicon oxide, silicon oxynitride, or the like containing no aluminum may be formed, and then, aluminum nitride may be stacked thereon to form the insulating film 511.

Then, a conductive film is formed over the insulating film 511 (FIG. 37E). In this embodiment, a conductive film 512a formed of tantalum nitride and a conductive film 512b formed of tungsten are formed to have a thickness of 20 nm to 100 nm and a thickness of 100 nm to 400 nm, respectively. Specifically, tantalum nitride used for the conductive film 512a is deposited under the following conditions: the purity of a Ta target is 99.99%, the temperature in a chamber is room temperature, the flow rates of Ar and $N_2$ are 50 ml/min and 10 ml/min, respectively, the pressure in the chamber is 0.6 Pa, the deposition power is 1 kW, and the deposition rate is approximately 40 nm/min. Tungsten used for the conductive film 512b is deposited under the following conditions: the purity of a tungsten target is 99.99%, the temperature in a chamber is 230° C., the flow rate of Ar is 100 ml/min, the pressure in the chamber is 1.5 Pa, the deposition power is 6 kW, and the deposition rate is approximately 390 nm/min.

Although an example in which a two-layer conductive film is used as an electrode functioning as a gate electrode is described in this embodiment, the conductive film may include a single layer or three or more layers. In addition, the materials of the conductive layers are not limited to those described in this embodiment.

Specifically, the conductive films can each be formed of an element selected from Ta, W, Ti, Mo, Al, and Cu, or an alloy or a compound containing the element as its main component. For example, tantalum and tungsten may be used for the first layer and the second layer, respectively; tantalum nitride and aluminum may be used for the first layer and the second layer, respectively; or tantalum nitride and copper may be used for the first layer and the second layer, respectively. A silver-palladium-copper alloy may be used for either the first layer or the second layer. Alternatively, a three-layer structure in which tungsten, an aluminum-silicon (Al—Si) alloy, and titanium nitride are stacked in this order may be used. Instead of tungsten, tungsten nitride may be used. Instead of an aluminum-silicon (Al—Si) alloy, an aluminum-titanium (Al—Ti) alloy may be used. Instead of titanium nitride, titanium may be used. Note that in order to make a difference between the widths of the plurality of conductive films after the etching in the channel length direction, materials of the conductive films are selected in consideration of the etching selectivity.

Note that it is important to appropriately select an optimal etching gas for the material of the conductive film.

Next, a mask 514 is formed, and the conductive films 512a and 512b are etched as illustrated in FIG. 38A (first etching treatment). In this embodiment, an inductively coupled plasma (ICP) etching method is used. A mixed gas of $Cl_2$, $CF_4$, and $O_2$ is used as an etching gas. The etching gas pressure in a chamber is 1.0 Pa. A high-frequency (RF) power of 500 W at 13.56 MHz is applied to a coiled electrode to generate plasma. A high-frequency (RF) power of 150 W at 13.56 MHz is applied to a stage (lower electrode) over which the substrate is disposed so that self-bias voltage is applied to the substrate. Then, the etching gas is replaced with a mixed gas of $Cl_2$ and $CF_4$, and the total pressure is set to 1.0 Pa. A high-frequency power (13.56 MHz) of 500 W is applied to the coiled electrode, and a high-frequency power (13.56 MHz) of 20 W is applied to the substrate side (sample stage).

With the use of the mixed gas of $Cl_2$ and $CF_4$ as the etching gas, the etching rate of tantalum nitride used for the conductive film 512a is substantially equal to that of tungsten used for the conductive film 512b, so that the films are etched to substantially the same extent.

By the first etching treatment, a conductive film 515 which has a first shape and includes a lower layer 515a and an upper layer 515b and a conductive film 516 which has a first shape and includes a lower layer 516a and an upper layer 516b are formed. Note that the first etching treatment makes the side surfaces of the lower layers 515a and 516a and the upper layers 515b and 516b slightly tapered. In addition, as a result of etching so as not to leave residuals of the conductive films, the surface of the insulating film 511 which is not covered by the conductive films 515 and 516 each having the first shape might be etched and reduced in thickness by about 5 nm to 10 nm or more.

Next, as illustrated in FIG. 38B, the conductive films 515 and 516 each having the first shape are etched (second etching treatment) using the mask 514 whose surface is etched by the first etching treatment and which is reduced in width. An ICP etching method is used in the second etching treatment as in the first etching treatment. A mixed gas of $SF_6$, $Cl_2$, and $O_2$ is used as the etching gas. The etching gas pressure in the chamber is 1.3 Pa. A high-frequency (13.56 MHz) power of 700 W is applied to the coiled electrode to generate plasma. A high-frequency (13.56 MHz) power of 10 W is applied to the stage (lower electrode) over which the substrate is disposed so that self-bias voltage is applied to the substrate.

The addition of $O_2$ to the mixed gas of $SF_6$ and $Cl_2$ increases the etching rate of tungsten and dramatically decreases the etching rate of tantalum nitride in the conductive films 515 and 516 each having the first shape, so that their etching selectivity is secured.

By the second etching treatment, a conductive film 517 (a lower layer 517a and an upper layer 517b) and a conductive film 518 (a lower layer 518a and an upper layer 518b) each having a second shape are formed. The width in the channel length direction of the upper layers 517b and 518b is smaller than that of the lower layers 517a and 518a. Note that by the second etching treatment, the surface of the insulating film 511 which is not covered by the conductive films 517 and 518 each having the second shape is etched and reduced in thickness by about 5 nm to 10 nm or more.

Next, as illustrated in FIG. 38C, an impurity element imparting n-type conductivity to the semiconductor films 509 and 510 is added using the conductive films 517 and 518 each having the second shape as masks (first doping treatment). An ion implantation method is used for the doping. The doping is performed under the conditions where the dosage is $1 \times 10^{13}$ atoms/cm$^2$ to $5 \times 10^{14}$ atoms/cm$^2$ and the acceleration voltage is in the range of from 40 kV to 80 kV. As an impurity element imparting n-type conductivity, an element belonging to Group 5, such as phosphorus (P), arsenic (As), or antimony (Sb), an element belonging to Group 6, such as sulfur (S), tellurium (Te), or selenium (Se), or the like which functions as a donor is used. In this embodiment, P is used. By the first doping treatment, impurity regions 520 and 521 are formed in a self-aligned manner. The impurity element imparting n-type conductivity is added to the impurity regions 520 and 521 at a concentration of $1 \times 10^{18}$ atoms/cm$^3$ to $1 \times 10^{20}$ atoms/cm$^3$.

After that, second doping treatment is performed, so that the state illustrated in FIG. 38D is obtained. In the second doping treatment, the acceleration voltage is 50 kV to 100 kV, and the dosage is $1 \times 10^{15}$ atoms/cm$^2$ to $1 \times 10^{17}$ atoms/cm$^2$. By the first doping treatment and the second doping treatment, impurity regions 522 and 523 overlapping with the lower layers 517a and 518a and impurity regions 524 and 525 are formed. The impurity element imparting n-type conductivity is added to the impurity regions 522 and 523 at a concentration of $1 \times 10^{18}$ atoms/cm$^3$ to $5 \times 10^{19}$ atoms/cm$^3$. The impurity element imparting n-type conductivity is added to the impurity regions 524 and 525 at a concentration of $1 \times 10^{19}$ atoms/cm$^3$ to $5 \times 10^{21}$ atoms/cm$^3$.

The impurity regions 522 and 523 are formed on the inner side than the impurity regions 524 and 525. The impurity regions 522 and 523 function as LDD regions. The impurity regions 524 and 525 function as source and drain regions.

Needless to say, the first doping treatment and the second doping treatment may be combined into one doping treatment by adjusting the acceleration voltage appropriately, so that a low-concentration impurity region and a high-concentration impurity region can be formed by one doping treatment.

Through the aforementioned steps, the impurity regions are formed in the island-shaped semiconductor films.

Next, an interlayer insulating film 530 is formed so as to cover the island-shaped semiconductor films 509 and 510, the insulating film 511, and the conductive films 517 and 518 each having the second shape (FIG. 39A). The interlayer insulating film 530 can be formed using an insulating film containing silicon, i.e., formed of silicon oxide, silicon nitride, silicon oxynitride, or the like to have a thickness of about 100 nm to 200 nm.

Next, heat treatment is performed to activate the impurity elements which have been added into the island-shaped semiconductor films 509 and 510. This step can use a thermal annealing method using an annealing furnace, a laser annealing method, or a rapid thermal annealing method (an RTA method). For example, activation is performed by a thermal annealing method in a nitrogen atmosphere in which the oxygen concentration is lower than or equal to 1 ppm, preferably lower than or equal to 0.1 ppm at 400° C. to 700° C. (preferably 500° C. to 600° C.). Furthermore, hydrogenation of the island-shaped semiconductor films is performed by heat treatment at 300° C. to 450° C. for 1 hour to 12 hours in an atmosphere containing hydrogen at 3% to 100%. This step is performed for the purpose of termination of dangling bonds by thermally excited hydrogen. Alternatively, plasma hydrogenation (using hydrogen excited by plasma) may be performed for hydrogenation. The activation treatment may also be performed before the interlayer insulating film 530 is formed.

Through the sequence of the above steps, a transistor 531 and a transistor 532 can be formed. Although the transistors 531 and 532 are n-channel transistors in this embodiment, the transistor 531 or 532 may also be a p-channel transistor. In that case, an impurity element imparting p-type conductivity may be added in the first or second doping treatment. Alternatively, the first doping treatment and the second doping treatment for adding the impurity element imparting p-type conductivity may be combined into one doping treatment. As the impurity element imparting p-type conductivity, boron (B) can be used, for example. The impurity element imparting p-type conductivity may be added to the impurity regions 522 and 523 at a concentration of $1\times10^{18}$ atoms/cm$^3$ to $5\times10^{19}$ atoms/cm$^3$. The impurity element imparting p-type conductivity may be added to the impurity regions 524 and 525 at a concentration of $1\times10^{19}$ atoms/cm$^3$ to $5\times10^{21}$ atoms/cm$^3$.

Alternatively, the first doping treatment may be performed between the first etching treatment and the second etching treatment. After the first doping treatment, the upper layers may be etched to be shortened in the channel length direction by the second etching treatment, and then, the second doping may be performed, so that the impurity regions 522 and 523 and the impurity regions 524 and 525 can be formed.

Note that, without limitation, methods other than an ICP etching method can be used for the plasma etching, such as an electron cyclotron resonance (ECR) etching method, an RIE etching method, a helicon wave etching method, a helical resonance etching method, a pulse modulated etching method, or other plasma etching methods.

Although only crystallization using a catalyst element is used in this embodiment, one embodiment of the present invention is not limited thereto. After the crystallization using a catalyst element, irradiation with pulsed laser light may be carried out to further increase the crystallinity. In addition, the gettering process is not limited to the method described in this embodiment. Other methods may also be used to decrease the concentration of the catalyst element in the semiconductor film.

Next, an interlayer insulating film 533 and an interlayer insulating film 534 are formed so as to cover the interlayer insulating film 530. In this embodiment, an organic resin, such as nonphotosensitive acrylic, is used for the interlayer insulating film 533. A film used as the interlayer insulating film 534 is less permeable to a substance that can accelerate deterioration of an OLED, such as moisture or oxygen, than other insulating films. Typically, for example, it is preferable to use a DLC film, a carbon nitride film, a silicon nitride film formed by an RF sputtering method, or the like.

Next, the insulating film 511 and the interlayer insulating films 530, 533, and 534 are etched to form openings. Then, wirings 535 to 538 electrically connected to the island-shaped semiconductor films 509 and 510 are formed.

Next, a transparent conductive film covering the interlayer insulating film 534 and the wirings 535 to 538 is formed and patterned to form a pixel electrode (anode) 540 connected to the wiring 538 which is connected to the island-shaped semiconductor film 510 of the transistor 532 (FIG. 39B). As the transparent conductive film used for the pixel electrode 540, an indium tin oxide (ITO) film or a transparent conductive film formed of a mixture of indium oxide and 2% to 20% of zinc oxide (ZnO) can be used. The surface of the pixel electrode 540 may be polished by a CMP method or by cleaning with a polyvinyl alcohol-based porous body so as to be planarized. Furthermore, after the polishing by a CMP method, ultraviolet light irradiation, oxygen plasma treatment, or the like may be performed on the surface of the pixel electrode 540.

Then, an organic resin film 541 used as a partition wall is formed over the interlayer insulating film 534. The organic resin film 541 includes an opening in a region overlapping with the pixel electrode 540. The organic resin film 541 is heated in a vacuum atmosphere to remove adsorbed moisture, oxygen, or the like before an electroluminescent layer is formed. Specifically, heat treatment is performed at a temperature of 100° C. to 200° C. for about 0.5 hours to 1 hour in a vacuum atmosphere. The pressure is preferably lower than or equal to $3\times10^{-7}$ Torr, most preferably lower than or equal to $3\times10^{-8}$ Torr if possible. In addition, in the case where the electroluminescent layer is formed after the organic resin film 541 is subjected to the heat treatment in a vacuum atmosphere, the vacuum atmosphere is maintained until the timing just before the formation of the electroluminescent layer; thus, the reliability can be further improved.

An end portion of the organic resin film 541 in the opening is preferably rounded so that the electroluminescent layer, which will be formed over the end portion, does not have a hole. Specifically, the radius of curvature of a curve drawn by the cross section of the organic resin film 541 in the opening is desirably approximately 0.2 μm to 2 μm.

A positive photosensitive acrylic resin is used for the organic resin film 541 in the example illustrated in FIG. 39C. A photosensitive organic resin is classified into a positive type and a negative type. A portion subjected to exposure to an energy-ray, such as light, an electron, or an ion, is removed in the positive type and is left in the negative type. A negative photosensitive organic resin film may also be used in one embodiment of the present invention. Alternatively, photosensitive polyimide may be used for the organic resin film 541.

The end portion of the organic resin film 541 formed of a negative acrylic resin has an S-shape cross section in the opening. The radius of curvature of each of the upper and lower end portions of the opening is preferably 0.2 μm to 2 μm.

Such a structure enables the electroluminescent layer and a cathode, which are formed later, with good coverage and can prevent the short circuit between the pixel electrode 540 and the cathode through a hole formed in the electroluminescent layer. In addition, stress applied to the electroluminescent layer can be relieved, and occurrence of defects called shrink, that is, decrease in light-emitting area can be decreased, so that the reliability can be improved.

Next, a light-emitting layer 542 is formed over the pixel electrode 540. The light-emitting layer 542 may include a single layer or a plurality of layers, and each layer may contain an inorganic material as well as an organic material.

Then, a cathode 543 is formed so as to cover the light-emitting layer 542. The cathode 543 can be formed using a conductive film formed of a known material with a low work function. For example, Ca, Al, MgAg, AlLi, or the like is desirably used.

The pixel electrode 540, the light-emitting layer 542, and the cathode 543 overlap with each other in the opening of the organic resin film 541, and this overlapping portion corresponds to a light-emitting element 544.

Next, a protective film 545 is formed over the organic resin film 541 and the cathode 543. As in the case of the interlayer insulating film 534, a film which is less permeable to a substance which accelerates deterioration of a light-emitting element, such as moisture or oxygen, than other insulating films is used as the protective film 545. Typically, for example, it is preferable to use a DLC film, a carbon nitride film, a silicon nitride film formed by an RF sputtering method, or the like. Alternatively, the film which is less permeable to the substance, such as moisture or oxygen, and a film which is more permeable to the substance, such as moisture or oxygen, than the former film may be stacked to be used as a protective film.

Note that, in FIG. 39C, a structure in which light emitted from the light-emitting element is emitted to the substrate 501 side is illustrated; however, a light-emitting element having a structure in which light is emitted to the side opposite to the substrate may also be used.

In practice, after the state illustrated in FIG. 39C is obtained, packaging (filling and sealing) is preferably performed by using a protective film (a laminate film, an ultraviolet curable resin film, or the like) with high airtightness and little degasification so as not to expose the device to the outside air, or by using a light-transmitting cover material. At that time, if the inside of the cover material is made an inert atmosphere or a hygroscopic material (e.g., barium oxide) is provided in the inside, the reliability of the display device including the light-emitting element is improved.

By the above-described manufacturing method, a transistor including a backgate electrode and a light-emitting element over the transistor can be formed over one substrate.

Embodiment 3

In this embodiment, an example of a method for manufacturing a display device will be described with reference to FIGS. 40A to 40D, FIGS. 41A and 41B, and FIGS. 42A to 42D. In particular, a method for manufacturing a flexible display device will be described in this embodiment.

<Manufacturing Method 1 of Display Device>

Figure 40A:
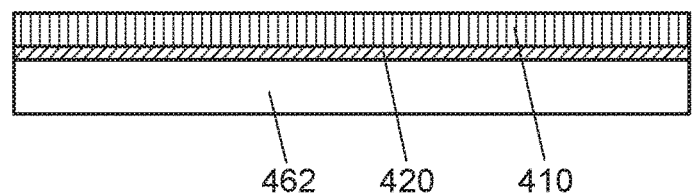
FIGS. 40A to 40D are cross-sectional views illustrating a method for manufacturing a display device.
Figure 40B:
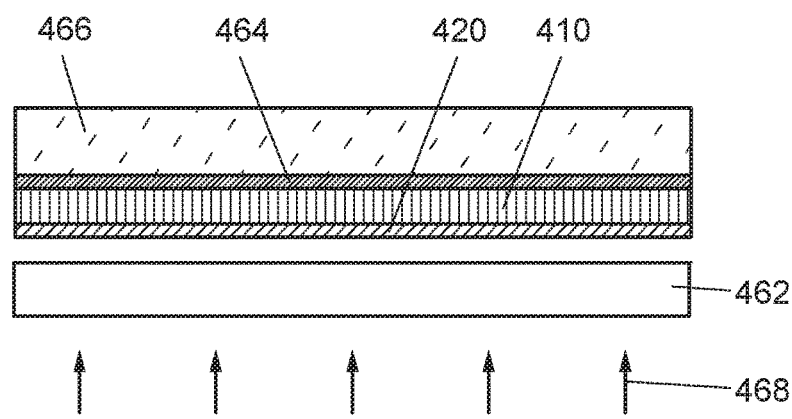

First, an insulating film 420 is formed over a substrate 462, and a first element layer 410 is formed over the insulating film 420 (see FIG. 40A). The first element layer 410 is provided with a semiconductor element. In addition to the semiconductor element, the first element layer 410 may be provided with a display element or part of a display element, such as a pixel electrode.

It is necessary that the substrate 462 has at least heat resistance high enough to withstand heat treatment performed later. For example, a glass substrate, a ceramic substrate, a quartz substrate, a sapphire substrate, or the like may be used as the substrate 462.

In the case where a glass substrate is used as the substrate 462, an insulating film such as a silicon oxide film, a silicon oxynitride film, a silicon nitride film, or a silicon nitride oxide film is preferably formed between the substrate 462 and the insulating film 420, in which case contamination from the glass substrate can be prevented.

For the insulating film 420, an organic resin film formed of an epoxy resin, an aramid resin, an acrylic resin, a polyimide resin, a polyamide resin, a polyamide-imide resin, or the like can be used, for example. It is particularly preferable to use a polyimide resin, which has high heat resistance. For example, in the case where a polyimide resin film is used for the insulating film 420, the thickness of the polyimide resin film is greater than or equal to 3 nm and less than or equal to 20 μm, preferably greater than or equal to 500 nm and less than or equal to 2 μm. In the case where a polyimide resin is used for the insulating film 420, the insulating film 420 can be formed by a spin coating method, a dip coating method, a doctor blade method, or the like. In the case where a polyimide resin is used for the insulating film 420, for example, the insulating film 420 with a desired thickness can be obtained by removing part of a film containing the polyimide resin by a doctor blade method.

Note that a temperature during the process of forming the first element layer 410 is preferably higher than or equal to room temperature and lower than or equal to 300° C. For example, the deposition temperature of an insulating film or a conductive film which is included in the first element layer 410 and is formed using an inorganic material is preferably higher than or equal to 150° C. and lower than or equal to 300° C., more preferably higher than or equal to 200° C. and lower than or equal to 270° C. Furthermore, an insulating film or the like which is included in the first element layer 410 and is formed using an organic resin material is preferably formed at a temperature of higher than or equal to room temperature and lower than or equal to 100° C.

A CAAC-OS described above is preferably used for an oxide semiconductor film of a transistor included in the first element layer 410. In the case where a CAAC-OS is used for the oxide semiconductor film of the transistor, for example, when the display device is bent, a crack or the like is less likely to be generated in a channel formation region, resulting in high resistance against bending.

Indium tin oxide to which silicon oxide is added is preferably used for a conductive film included in the first element layer 410 because a crack or the like is less likely to be generated in the conductive film when the display device is bent.

Next, the first element layer 410 and a temporary supporting substrate 466 are attached to each other with an adhesive 464 for separation, and then, the insulating film 420 and the first element layer 410 are separated from the substrate 462. In this manner, the insulating film 420 and the first element layer 410 are transferred to the temporary supporting substrate 466 (see FIG. 40B).

As the temporary supporting substrate 466, a glass substrate, a quartz substrate, a sapphire substrate, a ceramic substrate, a metal substrate, or the like can be used. Alternatively, a plastic substrate that can withstand a processing temperature of this embodiment may be used, or a flexible film-like substrate may be used.

An adhesive with which the temporary supporting substrate 466 and the first element layer 410 can be chemically or physically separated when necessary, such as an adhesive that is soluble in water or a solvent or an adhesive which is capable of being plasticized upon irradiation with UV light or the like, is used as the adhesive 464 for separation.

Any of various methods can be used as appropriate in the process for transferring the components to the temporary supporting substrate 466. For example, the substrate 462 and the insulating film 420 can be separated from each other in such a manner that the insulating film 420 is irradiated with laser light 468 from a side of the substrate 462 where the insulating film 420 is not formed, i.e., from the bottom side in FIG. 40B to make the insulating film 420 weak. Furthermore, a region where adhesion between the substrate 462 and the insulating film 420 is strong and a region where adhesion between the substrate 462 and the insulating film 420 is weak may be formed by adjustment of the irradiation energy density of the laser light 468, and then, the substrate 462 and the insulating film 420 may be separated.

Although the method in which separation is caused at the interface between the substrate 462 and the insulating film 420 is described in this embodiment, one embodiment of the present invention is not limited thereto. For example, separation may be caused at the interface between the insulating film 420 and the first element layer 410.

The insulating film 420 may be separated from the substrate 462 by impregnating the interface between the substrate 462 and the insulating film 420 with a liquid. Alternatively, the first element layer 410 may be separated from the insulating film 420 by impregnating the interface between the insulating film 420 and the first element layer 410 with a liquid. As the liquid, water, a polar solvent, or the like can be used, for example. The interface along which the insulating film 420 is separated, specifically, the interface between the substrate 462 and the insulating film 420 or the interface between the insulating film 420 and the first element layer 410 is impregnated with a liquid, whereby an influence of static electricity and the like which are generated owing to the separation and applied to the first element layer 410 can be reduced.

Figure 40C:
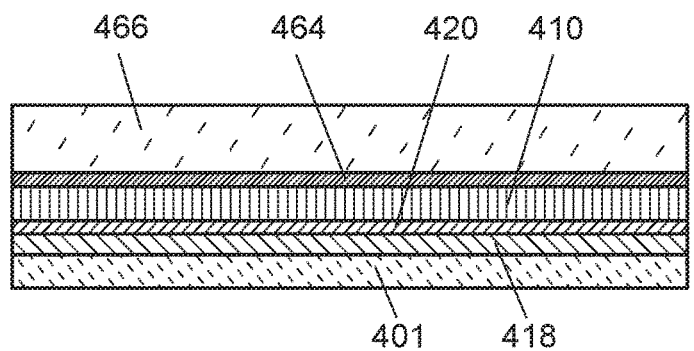

Next, a first substrate 401 is attached to the insulating film 420 using an adhesive layer 418 (see FIG. 40C).

Figure 40D:
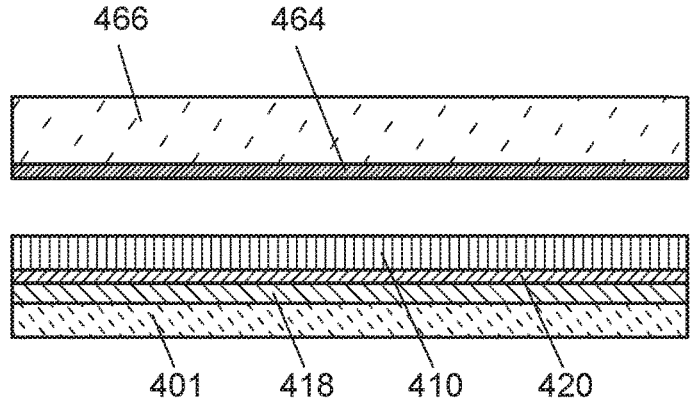

Then, the adhesive 464 for separation and the temporary supporting substrate 466 are detached from the first element layer 410 by dissolving or plasticizing the adhesive 464 for separation (see FIG. 40D).

Note that the adhesive 464 for separation is preferably removed by water, a solvent, or the like to expose the surface of the first element layer 410.

Through the above process, the first element layer 410 can be formed over the first substrate 401.

Figure 41A:
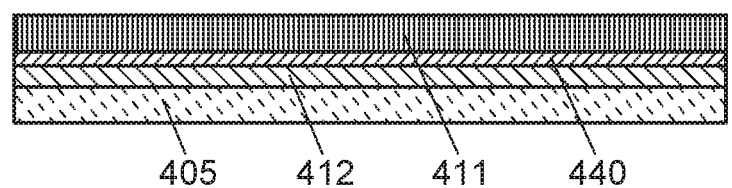
FIGS. 41A and 41B are cross-sectional views illustrating a method for manufacturing a display device.

Next, a second substrate 405 is prepared, and an adhesive layer 412 over the second substrate 405, an insulating film 440 over the adhesive layer 412, and a second element layer 411 are formed by a process similar to that illustrated in FIGS. 40A to 40D (see FIG. 41A). The second element layer 411 is provided with a semiconductor element. Alternatively, the second element layer 411 may be provided with a display element or part of the display element such as a pixel electrode in addition to the semiconductor element.

The insulating film 440 provided under the second element layer 411 can be formed using a material similar to that of the insulating film 420, here, using an organic resin.

Figure 41B:
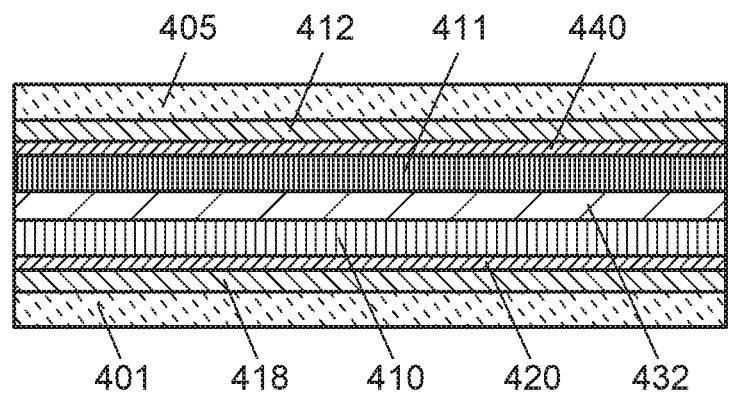

Next, a sealing layer 432 is provided between the first element layer 410 and the second element layer 411 to attach the first element layer 410 and the second element layer 411 to each other (see FIG. 41B).

With the sealing layer 432, for example, solid sealing is possible. Note that the sealing layer 432 is preferably flexible. For example, for the sealing layer 432, a glass material such as a glass frit, or a resin material such as a resin that is curable at room temperature (e.g., a two-component-mixture-type resin), a light curable resin, or a thermosetting resin can be used.

Through the above process, a display device can be manufactured.

<Manufacturing Method 2 of Display Device>

Next, another method for manufacturing a display device will be described with reference to FIGS. 42A to 42D. Note that an inorganic insulating film is used as the insulating film 420 in FIGS. 42A to 42D.

First, a separation layer 463 is formed over the substrate 462. Then, the insulating film 420 is formed over the separation layer 463, and the first element layer 410 is formed over the insulating film 420 (see FIG. 42A).

The separation layer 463 can have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements, for example. In the case of a layer containing silicon, a crystal structure of the layer containing silicon may be amorphous, microcrystal, polycrystal, or single crystal.

The separation layer 463 can be formed by a sputtering method, a PECVD method, a coating method, a printing method, or the like. Note that a coating method includes a spin coating method, a droplet discharge method, and a dispensing method.

In the case where the separation layer 463 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

When the separation layer 463 has a stacked-layer structure including a layer containing tungsten and a layer containing an oxide of tungsten, it may be utilized that the layer containing tungsten is formed first and an insulating layer formed of an oxide is formed thereover so that a layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer 463 can be changed by the plasma treatment or heat treatment, whereby adhesion between the separation layer 463 and the insulating film 420 formed later can be controlled.

The insulating film 420 can be formed using an inorganic insulating film with low moisture permeability, such as a silicon oxide film, a silicon nitride film, a silicon oxynitride film, a silicon nitride oxide film, or an aluminum oxide film, for example. The inorganic insulating film can be formed by a sputtering method or a PECVD method, for example.

Next, the first element layer 410 and the temporary supporting substrate 466 are attached to each other with the adhesive 464 for separation, and then, the insulating film 420 and the first element layer 410 are separated from the separation layer 463. In this manner, the insulating film 420 and the first element layer 410 are transferred to the temporary supporting substrate 466 (see FIG. 42B).

Any of various methods can be used as appropriate in the process for transferring the components to the temporary supporting substrate 466. For example, in the case where a layer including a metal oxide film is formed at the interface between the separation layer 463 and the insulating film 420, the metal oxide film is weakened by crystallization, so that the insulating film 420 can be separated from the separation layer 463. Alternatively, in the case where the separation layer 463 is formed using a tungsten film, separation may be performed in such a manner that the tungsten film is etched using a mixed solution of ammonia water and a hydrogen peroxide solution.

The insulating film 420 may be separated from the separation layer 463 by impregnating the interface between the separation layer 463 and the insulating film 420 with a liquid. As the liquid, water, a polar solvent, or the like can be used, for example. The interface along which the insulating film 420 is separated, specifically, the interface between the separation layer 463 and the insulating film 420 is impregnated with a liquid, whereby an influence of static electricity and the like which are generated owing to the separation and applied to the first element layer 410 can be reduced.

Figure 42A:
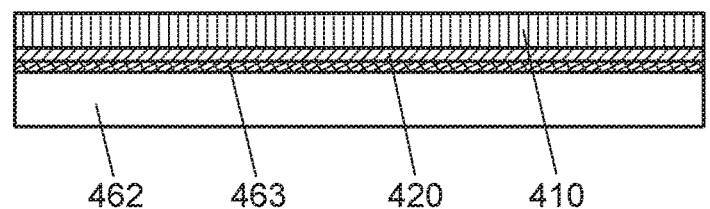
FIGS. 42A to 42D are cross-sectional views illustrating a method for manufacturing a display device.
Figure 42B:
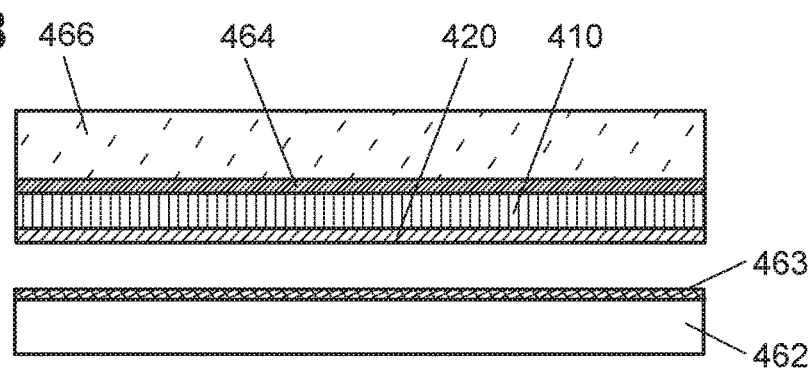
Figure 42C:
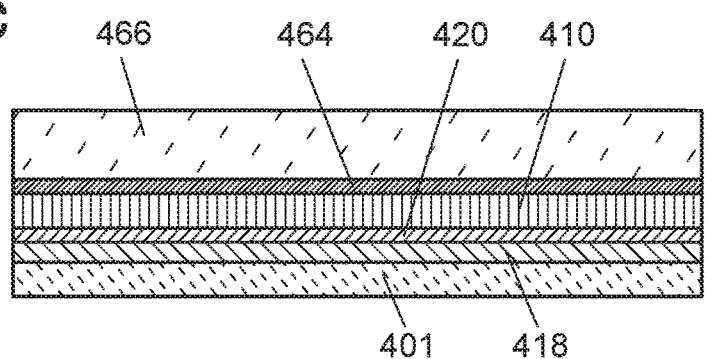

Next, the first substrate 401 is attached to the insulating film 420 using the adhesive layer 418 (see FIG. 42C).

Figure 42D:
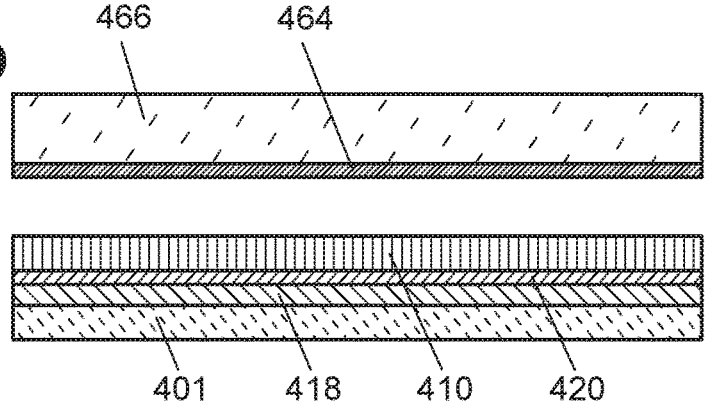

Then, the adhesive 464 for separation and the temporary supporting substrate 466 are removed from the first element layer 410 by dissolving or plasticizing the adhesive 464 for separation (see FIG. 42D).

Note that the adhesive 464 for separation is preferably removed by water, a solvent, or the like to expose the surface of the first element layer 410.

Through the above process, the first element layer 410 can be formed over the first substrate 401.

Through the above process, a display device can be manufactured.

Embodiment 4

In this embodiment, a display device of one embodiment of the present invention and an electronic device in which the display device is provided with an input device will be described with reference to FIGS. 43A and 43B, FIGS. 44A and 44B, FIG. 45, FIGS. 46A and 46B, FIGS. 47A and 47B, and FIG. 48.

<Touch Panel>

In this embodiment, a touch panel 2000 including a display device and an input device will be described as an example of an electronic device. In addition, an example in which a touch sensor is used as an input device will be described.

Figure 43A:
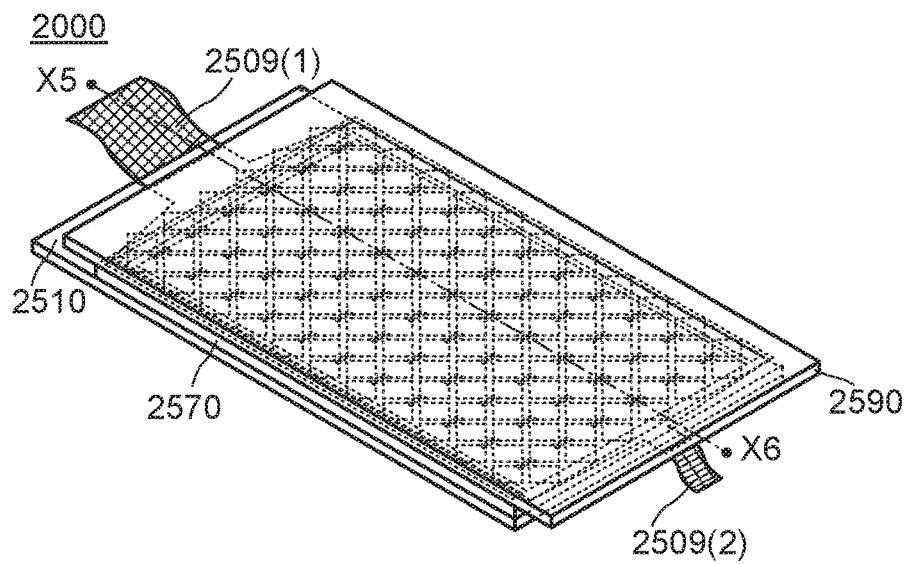
FIGS. 43A and 43B are perspective views of a display device and an input device.
Figure 43B:
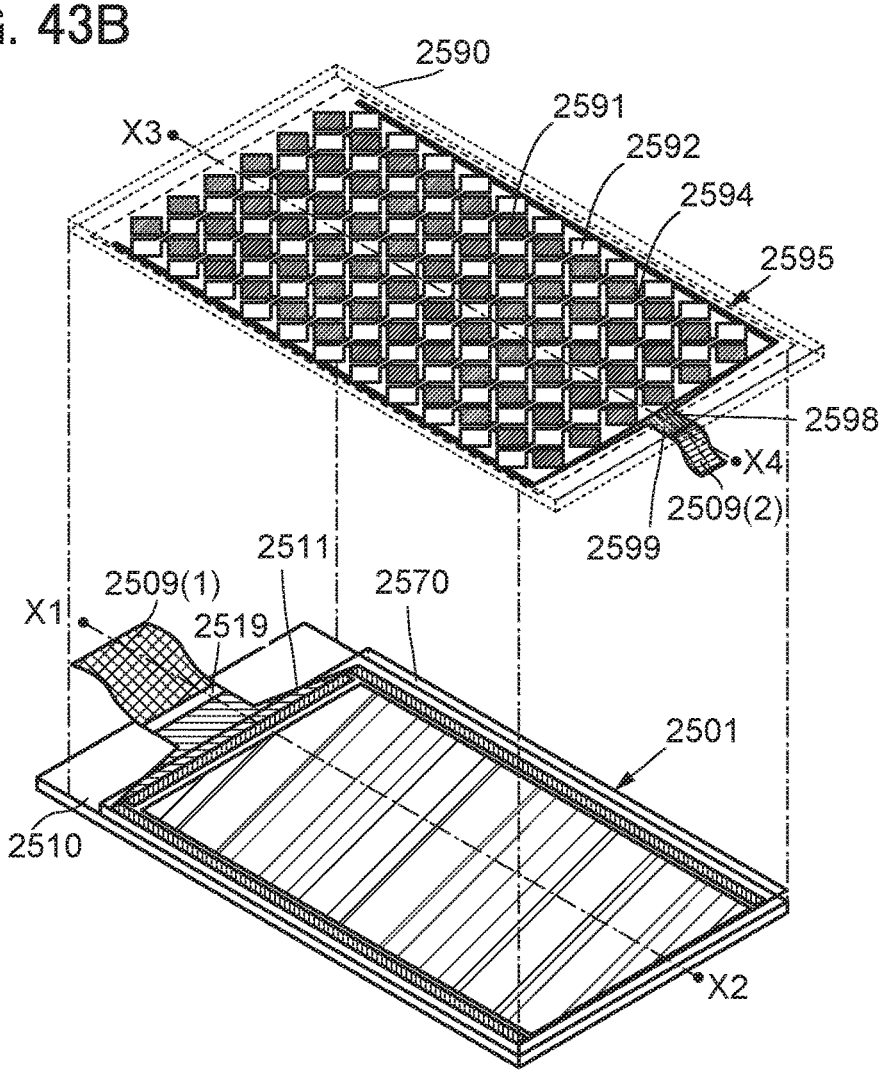

FIGS. 43A and 43B are perspective views of the touch panel 2000. Note that FIGS. 43A and 43B illustrate only main components of the touch panel 2000 for simplicity.

The touch panel 2000 includes a display device 2501 and a touch sensor 2595 (see FIG. 43B). The touch panel 2000 includes a substrate 2510, a substrate 2570, and a substrate 2590. Note that the substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 43B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used, for example. Examples of the capacitive touch sensor include a surface capacitive touch sensor and a projected capacitive touch sensor.

Examples of the projected capacitive touch sensor are a self-capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 43B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 43A and 43B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films such as the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/cm^2$ or more and 100 $\Omega/cm^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<Display Device>

Figure 44A:
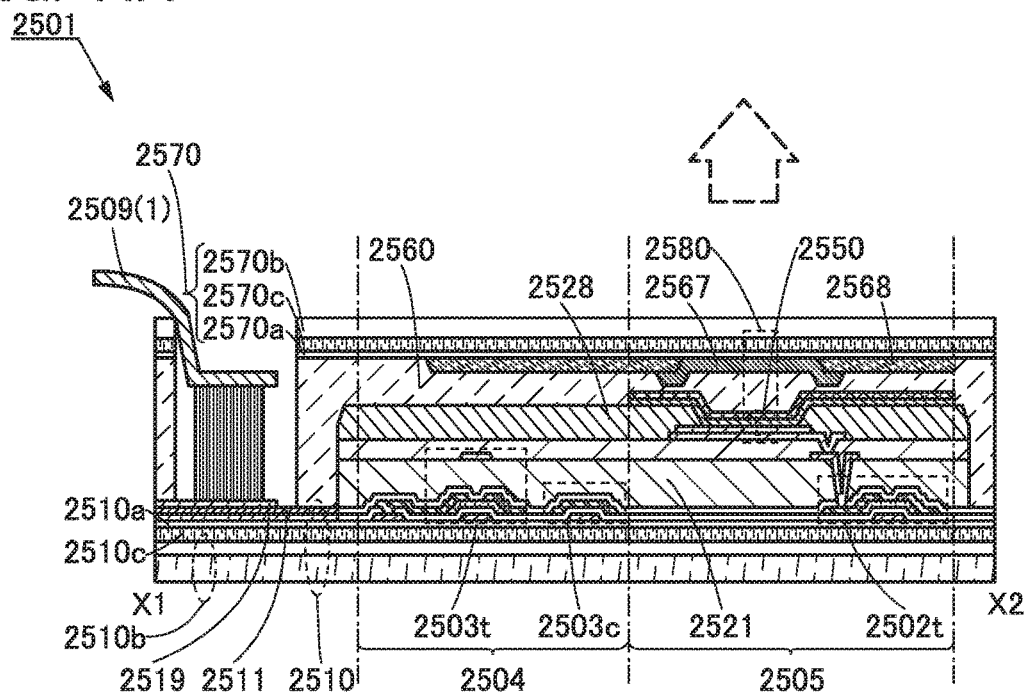
FIGS. 44A and 44B are cross-sectional views of a display device and an input device.
Figure 44B:
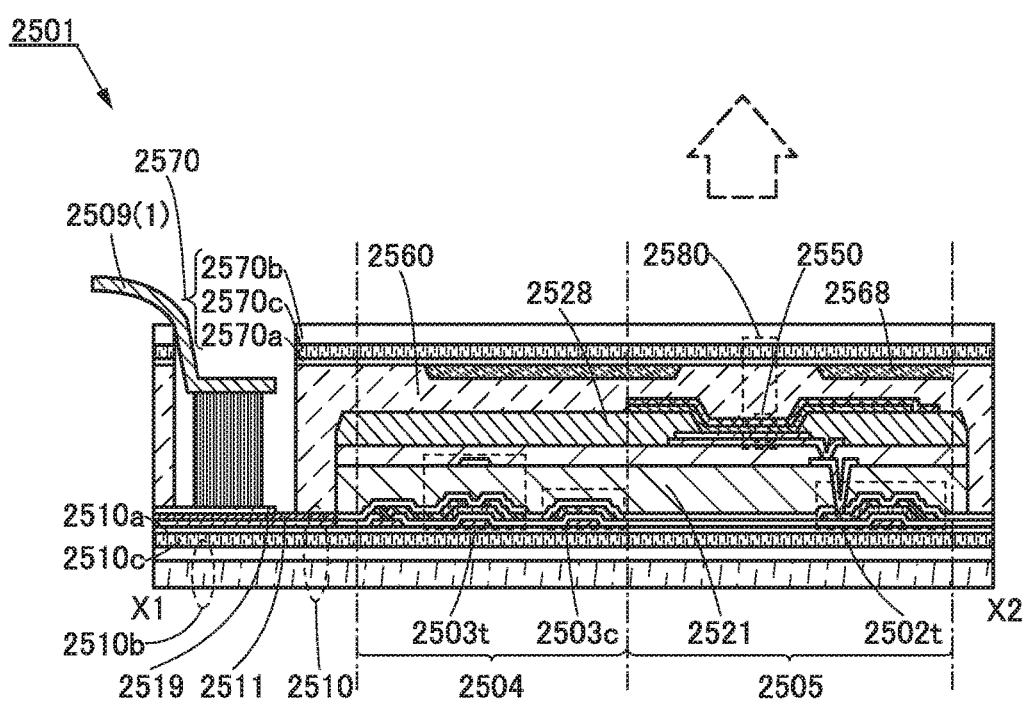

Next, the display device 2501 will be described in detail with reference to FIGS. 44A and 44B. FIGS. 44A and 44B correspond to cross-sectional views taken along dashed-dotted line X1-X2 in FIG. 43B.

The display device 2501 includes a plurality of pixels arranged in a matrix. Each of the pixels includes a display element and a pixel circuit for driving the display element.

In the cross-sectional view of FIG. 44A, an example of using an EL element that emits white light as a display element is illustrated; however, the EL element is not limited to such an element. For example, as illustrated in FIG. 44B, EL elements that emit light of different colors may be included in pixels so that the light of different colors can be emitted from the adjacent pixels. An example of using an EL element that emits white light as a display element will be described below.

For the substrate 2510 and the substrate 2570, for example, a flexible material with a vapor permeability of lower than or equal to $10^{-5}$ g/(m$^2$·day), preferably lower than or equal to $10^{-6}$ g/(m$^2$·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 44A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display device 2501 illustrated in FIG. 44A includes a pixel 2505. The pixel 2505 includes a light-emitting module 2580, the EL element 2550, and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567. Note that the coloring layer 2567 can be omitted as shown in FIG. 44B when emission colors from EL elements differ from pixel to pixel.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 44A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength range. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A gate line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and has high crystallinity. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. Note that the detail of the refresh operation will be described later.

In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

<Touch Sensor>

Figure 45:
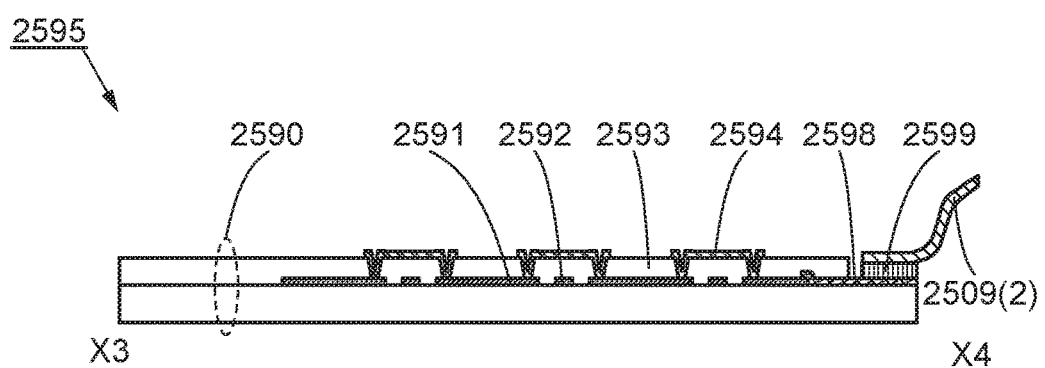
FIG. 45 is a cross-sectional view of an input device.

Next, the touch sensor 2595 will be described in detail with reference to FIG. 45. FIG. 45 corresponds to a cross-sectional view taken along dashed-dotted line X3-X4 in FIG. 43B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 include a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Touch Panel>

Figure 46A:
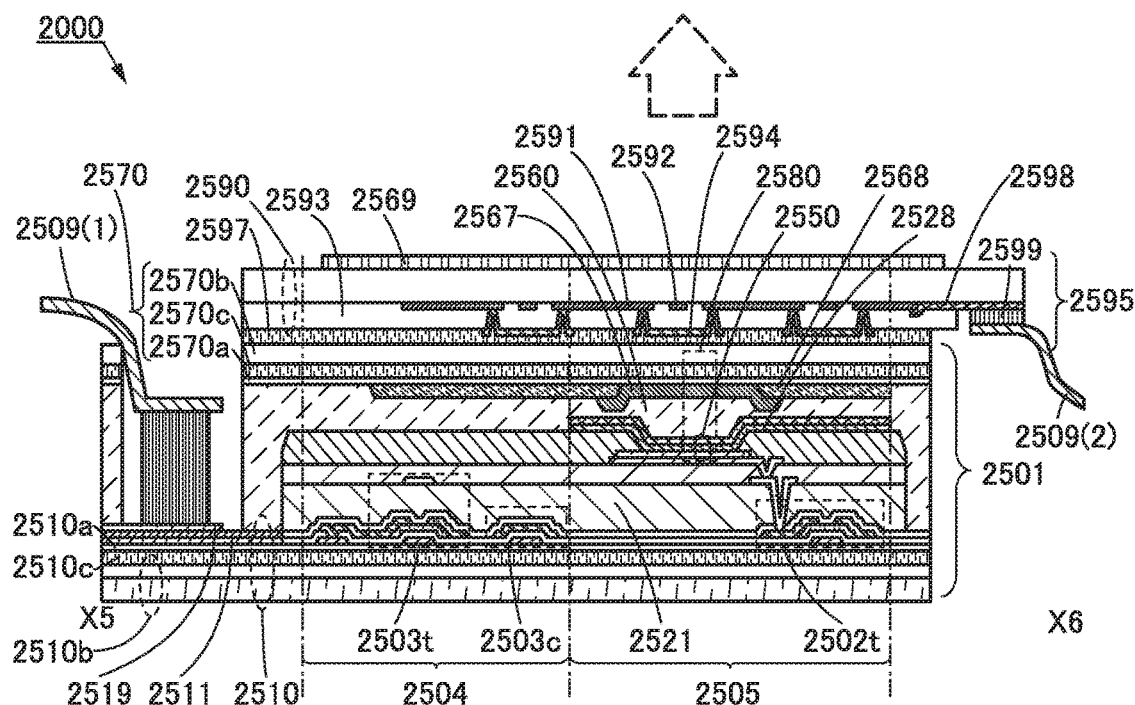
FIGS. 46A and 46B are cross-sectional views of a display device and an input device.

Next, the touch panel 2000 will be described in detail with reference to FIG. 46A. FIG. 46A corresponds to a cross-sectional view taken along dashed-dotted line X5-X6 in FIG. 43A.

In the touch panel 2000 illustrated in FIG. 46A, the display device 2501 described with reference to FIG. 44A and the touch sensor 2595 described with reference to FIG. 45 are attached to each other.

The touch panel 2000 illustrated in FIG. 46A includes an adhesive layer 2597 and an anti-reflective layer 2569 in addition to the components described with reference to FIG. 44A and FIG. 45.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 46A will be described with reference to FIG. 46B.

Figure 46B:
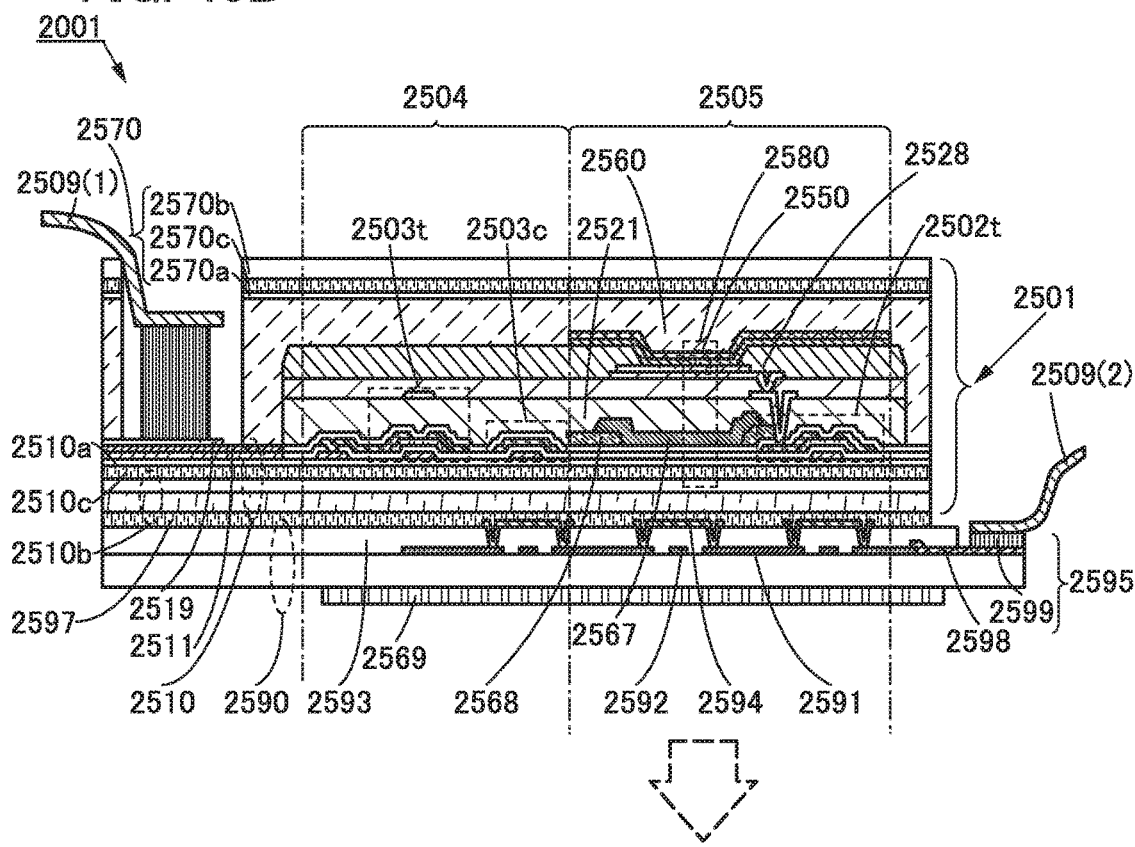

FIG. 46B is a cross-sectional view of a touch panel 2001. The touch panel 2001 illustrated in FIG. 46B differs from the touch panel 2000 illustrated in FIG. 46A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 46B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 46B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 46A or FIG. 46B, light may be emitted from the light-emitting element to one or both of the substrates 2510 and 2570.

<Driving Method of Touch Panel>

Next, an example of a method for driving a touch panel will be described with reference to FIGS. 47A and 47B.

Figure 47A:
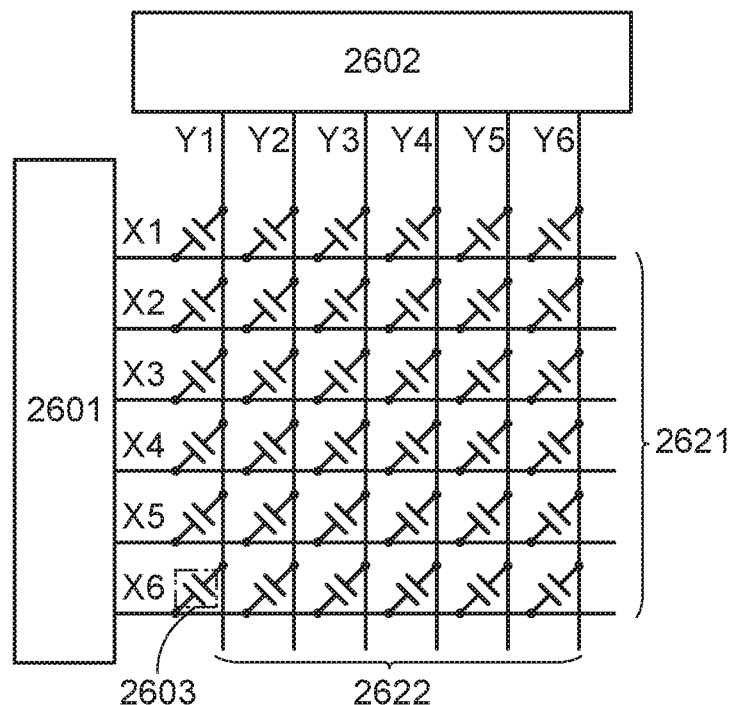
FIG. 47A is a block diagram illustrating a configuration example of a touch sensor.

FIG. 47A is a block diagram illustrating the structure of a mutual capacitive touch sensor. FIG. 47A illustrates a pulse voltage output circuit 2601 and a current sensing circuit 2602. Note that in FIG. 47A, six wirings X1 to X6 represent the electrodes 2621 to which a pulse voltage is applied, and six wirings Y1 to Y6 represent the electrodes 2622 that detect changes in current. FIG. 47A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 47B:
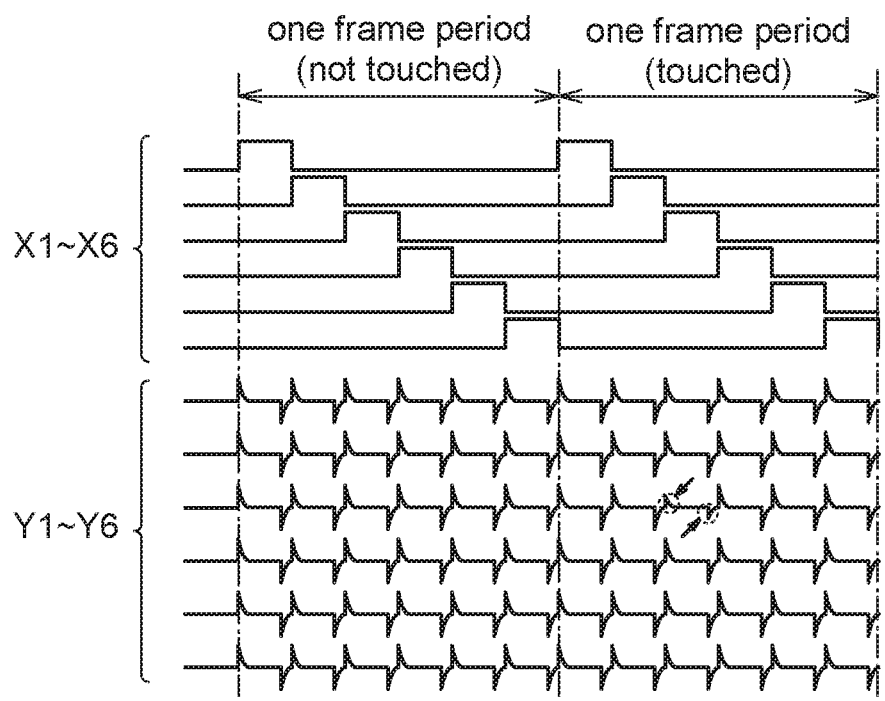
FIG. 47B is a timing chart illustrating an operation example of the touch sensor.

FIG. 47B is a timing chart showing input and output waveforms in the mutual capacitive touch sensor illustrated in FIG. 47A. In FIG. 47B, sensing of a sensing target is performed in all the rows and columns in one frame period. FIG. 47B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be detected.

<Sensor Circuit>

Figure 48:
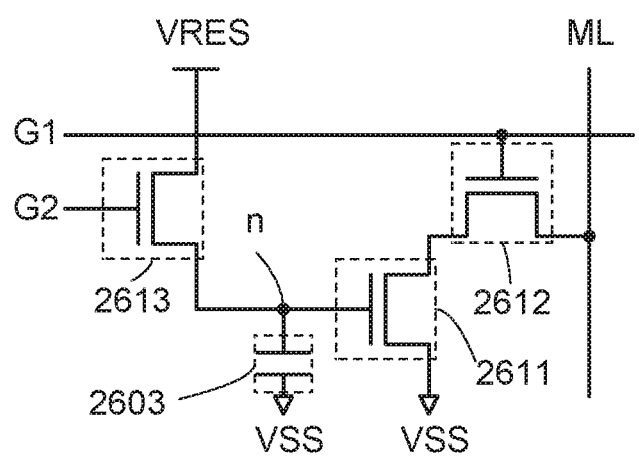
FIG. 48 is a circuit diagram illustrating an example of a sensor circuit.

Although FIG. 47A illustrates a passive-matrix type touch sensor in which only the capacitor 2603 is provided at the intersection of wirings as a touch sensor, an active-matrix type touch sensor including a transistor and a capacitor may be used. FIG. 48 illustrates an example of a sensor circuit included in an active-matrix type touch sensor.

The sensor circuit in FIG. 48 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 48 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

As each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

Embodiment 5

In this embodiment, an external view of a display device including the pixel described in the above embodiment and examples of an electronic device including the display device will be described.

<External View of Display Device>

Figure 49A:
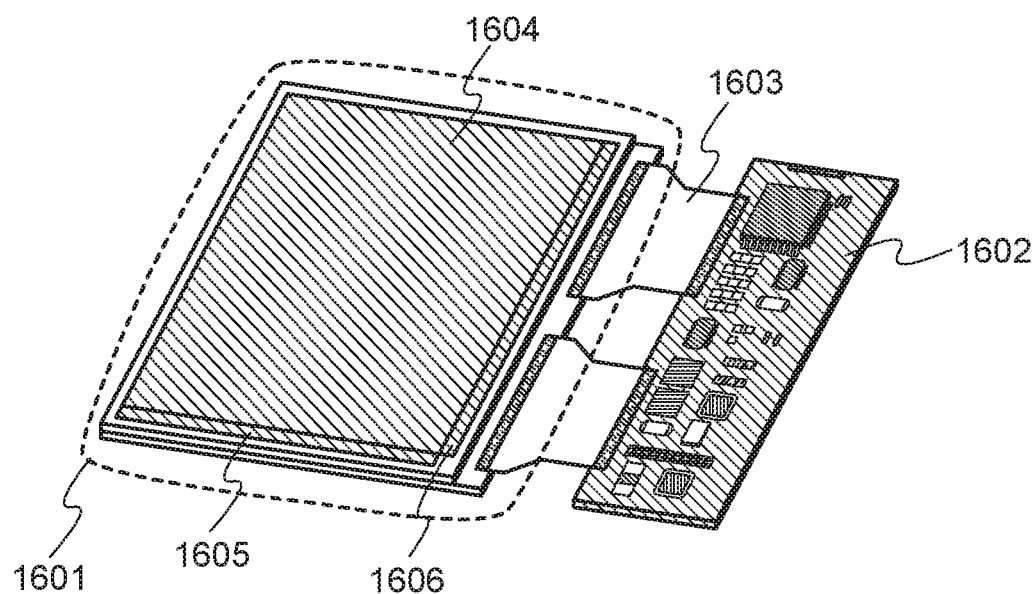
FIGS. 49A and 49B are perspective views illustrating an example of a display device.

FIG. 49A is a perspective view illustrating an example of an external view of a display device. The display device illustrated in FIG. 49A includes a panel 1601; a circuit board 1602 including a controller, a power supply circuit, an image processing circuit, an image memory, a CPU, and the like; and a connection portion 1603. The panel 1601 includes a pixel portion 1604 including a plurality of pixels, a driver circuit 1605 that selects pixels row by row, and a driver circuit 1606 that controls input of a data voltage to the pixels in a selected row.

A variety of signals and power supply potentials are input from the circuit board 1602 to the panel 1601 through the connection portion 1603. As the connection portion 1603, a flexible printed circuit (FPC) or the like can be used. A chip-mounted FPC is referred to as a COF tape, which achieves higher-density packaging in a smaller area. In the case where a COF tape is used as the connection portion 1603, part of circuits in the circuit board 1602 or part of the driver circuit 1605 or the driver circuit 1606 included in the panel 1601 may be formed on a chip separately prepared, and the chip may be connected to the COF tape by a chip-on-film (COF) method.

Figure 49B:
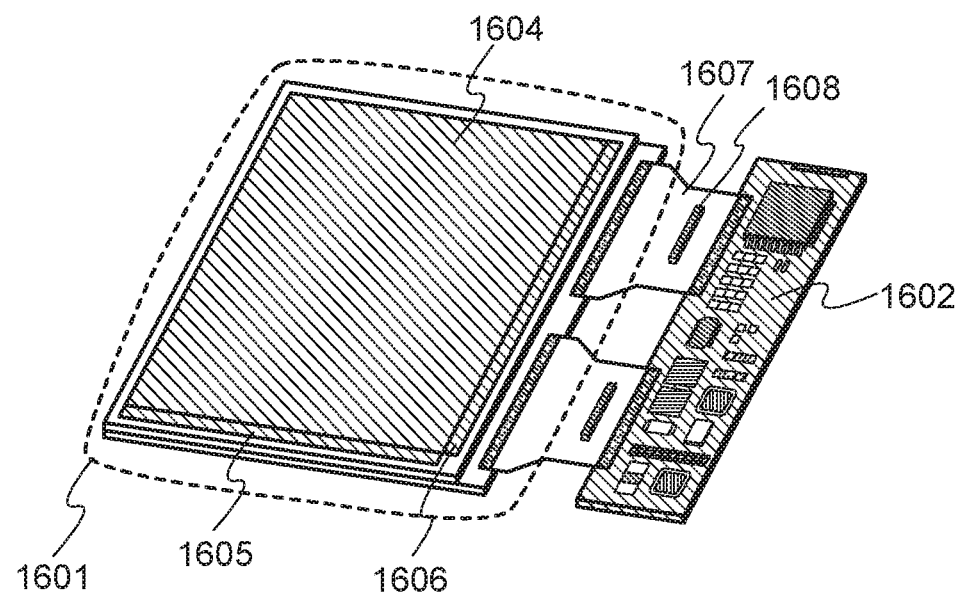

FIG. 49B is a perspective view of an example of an external view of a display device using a COF tape 1607.

A chip 1608 is a semiconductor bare chip including a terminal (e.g., bump) on its surface, i.e., IC or LSI. CR components can also be mounted on the COF tape 1607, so that the area of the circuit board 1602 can be reduced. There are a plurality of wiring patterns on a flexible substrate depending on a terminal of a mounted chip. The chip 1608 is mounted using a bonder apparatus or the like; the position of the chip is determined over the flexible substrate having a wiring pattern, and thermocompression bonding is performed.

One embodiment of the present invention is not limited to the example of FIG. 49B in which one COF tape 1607 is mounted with one chip 1608. Chips may be mounted in a plurality of lines on one side or both sides of one COF tape 1607; however, for cost reduction, the number of lines is preferably one in order to reduce the number of mounted chips. It is more preferable that the number of mounted chips is one.

<Structure Example of Electronic Device>

Next, electronic devices each including a display device will be described.

The display device according to one embodiment of the present invention can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can use the display device according to one embodiment of the present invention, cellular phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 50A to 50F.

Figure 50A:
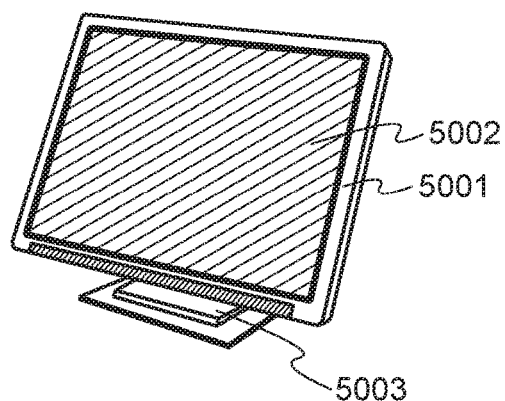
FIGS. 50A to 50F are perspective views each illustrating an example of an electronic device.

FIG. 50A illustrates a display device, which includes a housing 5001, a display portion 5002, a supporting base 5003, and the like. The display device according to one embodiment of the present invention can be used for the display portion 5002. Note that the display device includes all devices for displaying information such as for a personal computer, for receiving TV broadcasting, and for displaying an advertisement.

Figure 50B:
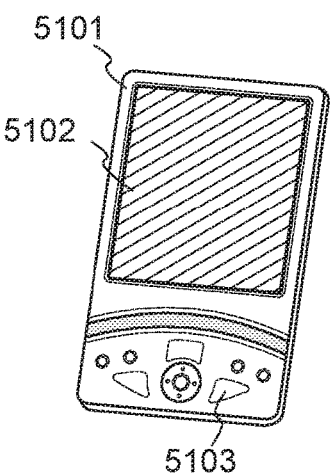

FIG. 50B illustrates a portable information terminal, which includes a housing 5101, a display portion 5102, operation keys 5103, and the like. The display device according to one embodiment of the present invention can be used for the display portion 5102.

Figure 50C:
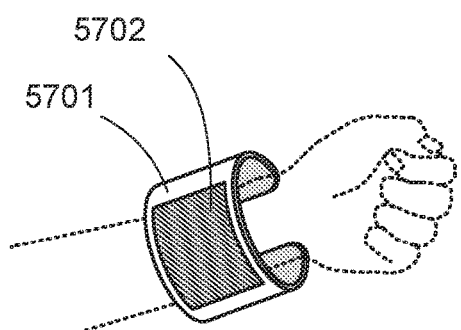

FIG. 50C illustrates a display device, which includes a housing 5701 having a curved surface, a display portion 5702, and the like. When a flexible substrate is used for the display device according to one embodiment of the present invention, it is possible to use the display device for the display portion 5702 supported by the housing 5701 having a curved surface. Consequently, it is possible to provide a user-friendly display device that is flexible and lightweight.

Figure 50D:
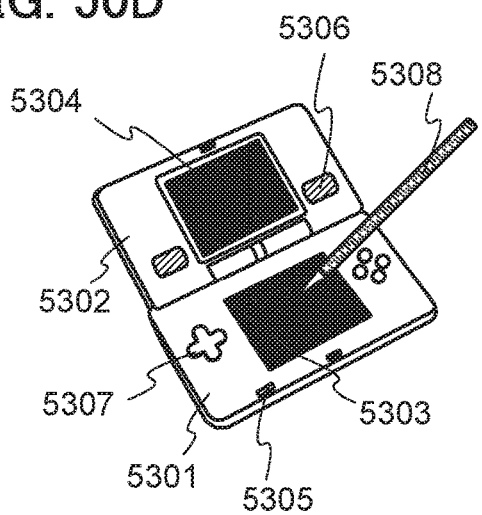

FIG. 50D illustrates a portable game machine, which includes a housing 5301, a housing 5302, a display portion 5303, a display portion 5304, a microphone 5305, a speaker 5306, an operation key 5307, a stylus 5308, and the like. The display device according to one embodiment of the present invention can be used for the display portion 5303 or the display portion 5304. When the display device according to one embodiment of the present invention is used for the display portion 5303 or 5304, it is possible to provide a user-friendly portable game machine with quality that hardly deteriorates. Note that although the portable game machine illustrated in FIG. 50D includes the two display portions 5303 and 5304, the number of display portions included in the portable game machine is not limited to two.

Figure 50E:
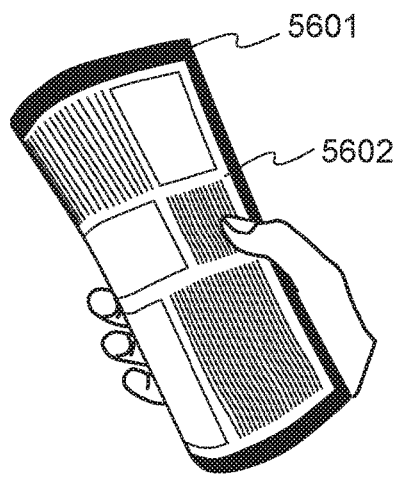

FIG. 50E illustrates an e-book reader, which includes a housing 5601, a display portion 5602, and the like. The display device according to one embodiment of the present invention can be used for the display portion 5602. When a flexible substrate is used, the display device can have flexibility, so that it is possible to provide a user-friendly e-book reader that is flexible and lightweight.

Figure 50F:
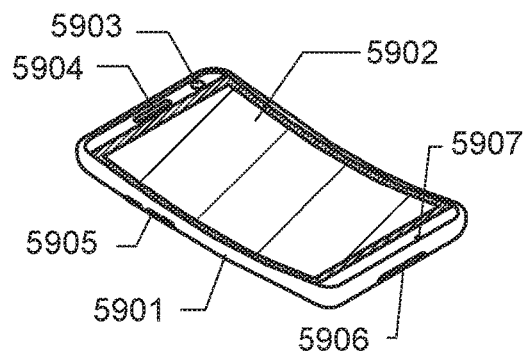

FIG. 50F illustrates a cellular phone, which includes a display portion 5902, a microphone 5907, a speaker 5904, a camera 5903, an external connection portion 5906, and an operation button 5905 in a housing 5901. It is possible to use the display device according to one embodiment of the present invention for the display portion 5902. When the display device according to one embodiment of the present invention is provided over a flexible substrate, the display device can be used for the display portion 5902 having a curved surface, as illustrated in FIG. 50F.

Note that in this specification and the like, terms for describing arrangement, such as "over" and "under," are used for convenience for describing the positional relation between components with reference to drawings. The positional relation between components is changed as appropriate in accordance with a direction in which each component is described. Thus, terms for describing arrangement are not limited to those used in this specification and can be changed to other terms as appropriate depending on the situation.

Furthermore, in a block diagram in this specification and the like, components are functionally classified and shown by blocks that are independent of each other. However, in an actual circuit and the like, such components are sometimes hard to classify functionally, and there is a case in which one circuit is concerned with a plurality of functions or a case in which a plurality of circuits are concerned with one function. Therefore, the segmentation of a block in the block diagrams is not limited by any of the components described in the specification, and can be differently determined as appropriate depending on situations.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film," "layer," and the like can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the order of connection in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application serial no. 2015-094518 filed with Japan Patent Office on May 5, 2015, the entire contents of which are hereby incorporated by reference.

What is claimed is:

1. A display device comprising:
   a transistor;
   a first capacitor and a second capacitor; and
   a light-emitting element,
   wherein the transistor comprises a first gate and a second gate,
   wherein a region of the first gate and a region of the second gate overlap with each other with a channel formation region of the transistor therebetween,
   wherein a first terminal of the transistor is supplied with a first potential,
   wherein a first terminal of the first capacitor is electrically connected to the first gate,
   wherein a second terminal of the first capacitor is electrically connected to a second terminal of the transistor,
   wherein a first terminal of the second capacitor is electrically connected to the first gate,
   wherein a second terminal of the second capacitor is electrically connected to the second gate,
   wherein a first terminal of the light-emitting element is electrically connected to the second terminal of the transistor, and
   wherein a second terminal of the light-emitting element is supplied with a second potential.

2. The display device according to claim 1, wherein the transistor is an n-channel transistor.

3. The display device according to claim 1, wherein the first potential is higher than the second potential.

4. The display device according to claim 1, wherein the channel formation region comprises an oxide semiconductor.

5. An electronic device comprising:
   the display device according to claim 1; and
   at least one of a microphone, a speaker, and an operation key.

6. A display device comprising:
   a transistor;
   a first switch, a second switch, a third switch, and a fourth switch;
   a first capacitor and a second capacitor;
   a light-emitting element; and
   a first wiring, a second wiring, a third wiring, a fourth wiring, and a fifth wiring,
   wherein the transistor comprises a first gate and a second gate,
   wherein a region of the first gate and a region of the second gate overlap with each other with a channel formation region of the transistor therebetween,
   wherein a first terminal of the transistor is electrically connected to the third wiring,
   wherein the first switch is configured to control electrical connection between the first wiring and the first gate,
   wherein the second switch is configured to control electrical connection between the second wiring and the second gate,
   wherein the third switch is configured to control electrical connection between the first gate and a second terminal of the transistor, wherein the fourth switch is configured to control electrical connection between the fifth wiring and the second terminal of the transistor, wherein a first terminal of the first capacitor is electrically connected to the first gate, wherein a second terminal of the first capacitor is electrically connected to the second terminal of the transistor, wherein a first terminal of the second capacitor is electrically connected to the first gate, wherein a second terminal of the second capacitor is electrically connected to the second gate, wherein a first terminal of the light-emitting element is electrically connected to the second terminal of the transistor, and wherein a second terminal of the light-emitting element is electrically connected to the fourth wiring.

7. The display device according to claim 6, wherein the transistor is an n-channel transistor.

8. The display device according to claim 6, wherein the channel formation region comprises an oxide semiconductor.

9. The display device according to claim 6, wherein each of the first switch, the second switch, the third switch, and the fourth switch is a transistor comprising an oxide semiconductor in a channel formation region.

10. An electronic device comprising:
the display device according to claim 6; and
at least one of a microphone, a speaker, and an operation key.

11. A display device comprising:
a transistor;
a first switch and a second switch;
a first capacitor and a second capacitor;
a light-emitting element; and
a first wiring, a second wiring, a third wiring, and a fourth wiring,
wherein the transistor comprises a first gate and a second gate,
wherein a region of the first gate and a region of the second gate overlap with each other with a channel formation region of the transistor therebetween,
wherein a first terminal of the transistor is electrically connected to the third wiring, wherein the first switch is configured to control electrical connection between the first wiring and the first gate, wherein the second switch is configured to control electrical connection between the second wiring and the second gate, wherein a first terminal of the first capacitor is electrically connected to the first gate, wherein a second terminal of the first capacitor is electrically connected to a second terminal of the transistor, wherein a first terminal of the second capacitor is electrically connected to the first gate, wherein a second terminal of the second capacitor is electrically connected to the second gate, wherein a first terminal of the light-emitting element is electrically connected to the second terminal of the transistor, and wherein a second terminal of the light-emitting element is electrically connected to the fourth wiring.

12. The display device according to claim 11, further comprising a third switch,
wherein the third switch is configured to control electrical connection between the first gate and the second terminal of the transistor.

13. The display device according to claim 11, further comprising:
a third switch; and
a fifth wiring,
wherein the third switch is configured to control electrical connection between the fifth wiring and the second terminal of the transistor.

14. The display device according to claim 11, wherein the transistor is an n-channel transistor.

15. The display device according to claim 11, wherein the channel formation region comprises an oxide semiconductor.

16. The display device according to claim 11, wherein each of the first switch and the second switch is a transistor comprising an oxide semiconductor in a channel formation region.

17. An electronic device comprising:
the display device according to claim 11; and
at least one of a microphone, a speaker, and an operation key.

* * * * *

UNITED STATES PATENT AND TRADEMARK OFFICE
CERTIFICATE OF CORRECTION

PATENT NO. : 9,666,655 B2
APPLICATION NO. : 15/140544
DATED : May 30, 2017
INVENTOR(S) : Hiroyuki Miyake It is certified that error appears in the above-identified patent and that said Letters Patent is hereby corrected as shown below:

In the Specification

At Column 7, Line 29, "ELL" should be --EL1.--;

At Column 8, Line 26, "ELL" should be --EL1;--;

At Column 10, Line 45, "$V_{th1}$ n" should be --$V_{th}$ in--;

At Column 10, Line 67, "$V_{DATA}$ - $V_{th0}$/a" should be --$V_{DATA}$ + $V_{th0}$/α--;

At Column 12, Line 56, "$V_{th1}$ n" should be --$V_{th}$ in--;

At Column 12, Line 64, "$V_{DATA}$ $V_1$," should be --$V_{DATA}$ - $V_1$,--;

At Column 13, Line 5, "ELL" should be --EL1,--;

At Column 14, Line 58, "$V_{DATA}$ $V_{th0}$/α - $V_4$" should be --$V_{DATA}$ + $V_{th0}$/α - $V_4$--;

At Column 14, Line 63, "ELL" should be --EL1,--;

At Column 16, Line 31, "$V_{th1}$ n" should be --$V_{th}$ in--;

At Column 16, Lines 39-40, "$V_{DATA}$ - $V_2$ + $V_5$ ($V_{th0}$ - $V_2$ + $V_5$/α - $V_6$" should be --$V_{DATA}$ - $V_2$ + $V_5$ + ($V_{th0}$ - $V_2$ + $V_5$)/α - $V_6$--;

At Column 22, Line 61, "InM:Zn=1:3:4," should be --In:M:Zn=1:3:4,--;

At Column 22, Lines 62-63, "InM:Zn=1:4:6," should be --In:M:Zn=1:4:6,--;

Signed and Sealed this
Nineteenth Day of September, 2017

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,666,655 B2

At Column 23, Line 15, "InM:Zn=1:4:4," should be --In:M:Zn=1:4:4,--;

At Column 23, Line 17, "InM:Zn=1:5:5," should be --In:M:Zn=1:5:5,--;

At Column 23, Line 18, "InM:Zn=1:6:8." should be --In:M:Zn=1:6:8.--;

At Column 26, Line 45, "20" should be --2θ--;

At Column 26, Line 46, "20" should be --2θ--;

At Column 26, Line 46, second occurrence, "20" should be --2θ--;

At Column 26, Line 49, "20" should be --2θ--;

At Column 26, Line 50, "20" should be --2θ--;

At Column 44, Line 47, "02" should be --$O_2$--.